(12) United States Patent
Ohashi et al.

(10) Patent No.: US 8,900,796 B2
(45) Date of Patent: Dec. 2, 2014

(54) ACID GENERATOR, CHEMICALLY AMPLIFIED RESIST COMPOSITION, AND PATTERNING PROCESS

(71) Applicant: Shin-Etsu Chemical Co., Ltd., Tokyo (JP)

(72) Inventors: Masaki Ohashi, Jyoetsu (JP); Tomohiro Kobayashi, Jyoetsu (JP); Masayoshi Sagehashi, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 8 days.

(21) Appl. No.: 13/768,377

(22) Filed: Feb. 15, 2013

(65) Prior Publication Data
US 2013/0224657 A1 Aug. 29, 2013

(30) Foreign Application Priority Data

Feb. 28, 2012 (JP) ................................. 2012-042321

(51) Int. Cl.
| G03F 7/004 | (2006.01) |
| G03F 7/039 | (2006.01) |
| G03F 7/20 | (2006.01) |
| G03F 7/30 | (2006.01) |
| G03F 7/38 | (2006.01) |

(52) U.S. Cl.
USPC ............... 430/270.1; 430/273.1; 430/311; 430/325; 430/326; 430/330; 430/910; 430/919; 430/921; 430/925; 430/942; 560/19; 560/38; 560/39; 560/43; 560/44; 560/45; 560/48; 562/30; 562/113

(58) Field of Classification Search
None
See application file for complete search history.

(56) References Cited

U.S. PATENT DOCUMENTS

| 5,705,702 | A | 1/1998 | Osawa et al. |
| 6,048,672 | A | 4/2000 | Cameron et al. |
| 6,312,867 | B1 | 11/2001 | Kinsho et al. |
| 6,440,634 | B1 | 8/2002 | Ohsawa et al. |
| 7,569,326 | B2 * | 8/2009 | Ohsawa et al. ............ 430/270.1 |
| 7,704,668 | B1 | 4/2010 | Cameron et al. |
| 2002/0102491 | A1 | 8/2002 | Kodama et al. |
| 2002/0197558 | A1 | 12/2002 | Ferreira et al. |
| 2003/0013039 | A1 | 1/2003 | Kobayashi et al. |
| 2003/0113659 | A1 | 6/2003 | Hatakeyama et al. |
| 2005/0208424 | A1 | 9/2005 | Hasegawa et al. |
| 2006/0228648 | A1 | 10/2006 | Ohsawa et al. |
| 2007/0099113 | A1 | 5/2007 | Kobayashi et al. |
| 2007/0122750 | A1 | 5/2007 | Yamaguchi et al. |
| 2008/0076063 | A1 | 3/2008 | Yoshida et al. |
| 2008/0090172 | A1 | 4/2008 | Hatakeyama et al. |
| 2008/0102407 | A1 | 5/2008 | Ohsawa et al. |
| 2008/0118860 | A1 | 5/2008 | Harada et al. |
| 2009/0075202 | A1 | 3/2009 | Kodama et al. |
| 2010/0099042 | A1 | 4/2010 | Ohashi et al. |
| 2010/0304303 | A1 | 12/2010 | Maeda et al. |
| 2011/0171576 | A1 | 7/2011 | Yamaguchi et al. |
| 2011/0201823 | A1 | 8/2011 | Yoshida et al. |
| 2011/0287361 | A1 * | 11/2011 | Bae et al. .................. 430/270.1 |
| 2011/0318688 | A1 | 12/2011 | Hiraoka et al. |
| 2012/0148955 | A1 * | 6/2012 | Utsumi et al. ............. 430/285.1 |

FOREIGN PATENT DOCUMENTS

| CA | 2049772 A1 | 2/1992 |
| EP | 2 383 611 A2 | 11/2011 |
| JP | A-4-230645 | 8/1992 |
| JP | A-8-311018 | 11/1996 |
| JP | A-9-15848 | 1/1997 |
| JP | A-11-282168 | 10/1999 |
| JP | A-2000-122296 | 4/2000 |
| JP | A-2000-336121 | 12/2000 |
| JP | A-2001-122850 | 5/2001 |
| JP | A-2002-214774 | 7/2002 |
| JP | A-2003-66612 | 3/2003 |
| JP | A-2003-140332 | 5/2003 |
| JP | A-2004-2252 | 1/2004 |
| JP | A-2004-531749 | 10/2004 |
| JP | A-2005-84365 | 3/2005 |
| JP | A-2005-264103 | 9/2005 |
| JP | A-2005-266766 | 9/2005 |
| JP | A-2007-145797 | 6/2007 |
| JP | A-2007-145804 | 6/2007 |
| JP | A-2007-161707 | 6/2007 |
| JP | A-2008-69146 | 3/2008 |

(Continued)

OTHER PUBLICATIONS

Dammel et al., "193 nm Immersion Lithography—Taking the Plunge," *Journal of Photopolymer Science and Technology*, 2004, vol. 17, No. 4, pp. 587-601.

(Continued)

*Primary Examiner* — Sin J. Lee
(74) *Attorney, Agent, or Firm* — Oliff PLC

(57) ABSTRACT

The present invention provides an acid generator generates a sulfonic acid represented by the following general formula (1) in response to high-energy beam or heat:
To provide a novel acid generator which is suitably used as an acid generator for a resist composition, which solves the problems of LER and a depth of focus and can be effectively and widely used particularly without degradation of a resolution, a chemically amplified resist composition using the same, and a patterning process.

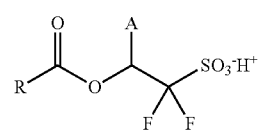

(1)

15 Claims, 14 Drawing Sheets

(56) References Cited

FOREIGN PATENT DOCUMENTS

| | | |
|---|---|---|
| JP | A-2008-111103 | 5/2008 |
| JP | A-2008-122932 | 5/2008 |
| JP | A-2008-133448 | 6/2008 |
| JP | A-2010-116550 | 5/2010 |
| WO | WO 02/42845 A2 | 5/2002 |

OTHER PUBLICATIONS

Houlihan et al., "Effect of Amine Additives on LWR and LER as Studied by Extraction Parameters," *Journal of Photopolymer Science and Technology*, 2006, vol. 19, No. 3, pp. 327-334.

Jul. 10, 2013 Extended Search Report issued in European Patent Application No. 13000856.8.

* cited by examiner

ACID GENERATOR, CHEMICALLY AMPLIFIED RESIST COMPOSITION, AND PATTERNING PROCESS

BACKGROUND OF THE INVENTION

1. Field of the Invention

The present invention relates to a novel acid generator which is suitably used, especially as an acid generator for a resist composition, a chemically amplified resist composition using the same, and a patterning process.

2. Description of the Related Art

In recent years, as LSI progresses toward a high integration and a further acceleration in speed, a miniaturization of a pattern rule is required. Deep-ultraviolet lithography and vacuum ultraviolet lithography are thought to hold particular promise as the next generation microfabrication technology. In particular, photolithography using an ArF excimer laser as the light source is the technique essential to ultra-fine microfabrication capable of achieving a size of 0.13 μm or less.

ArF lithography has started being partially used from production of a 130 nm node device, and used as a main lithography technique from production of a 90 nm node device. At first, a 157 nm lithography with a F2 laser has held promise for the next technique of 45 nm node lithography. However, a delayed development caused by various problems has been pointed. Thus, ArF immersion lithography has been proposed suddenly. In the ArF immersion lithography, a liquid having a higher refractive index than air, such as water, ethylene glycol, or glycerol, is placed between a projection lens and a wafer to set the numerical aperture (NA) of the projection lens to 1.0 or more and achieve a high degree of resolution (see, Non-Patent Document 1).

To prevent a precise and expensive optical material from deteriorating, the ArF lithography requires a resist composition having a high sensitivity capable of getting sufficient resolution even by a small exposure dose. As a strategy for the resist composition, it is most common that a component having a high transparent at a wavelength of 193 nm is selected. For example, a polyacrylic acid and derivatives thereof, a norbornene-maleic anhydride alternating polymer, polynorbornene, a ring-opening metathesis polymer, and a hydrogenated ring-opening metathesis polymer are proposed as a base resin. This achieves some results in terms of increasing transparency of a resin itself.

Various photoacid generators have been investigated. When a photoacid generator generating an alkane or an arene sulfonic acid, which is used for a chemically amplified resist composition using the conventional KrF excimer laser as the light source, is used as a component of the ArF chemically amplified resist composition, the acid strength is not sufficient to cut the acid labile group of a resin, a resolution cannot be achieved, or a sensitivity is low. Thus, the resist composition is not suitable for production of a device.

For this reason, as a photoacid generator in the ArF chemically amplified resist composition, photoacid generators generating a perfluoroalkanesulfonic acid having a high acid strength are typically used. The photoacid generators generating a perfluoroalkanesulfonic acid have been developed for a KrF resist composition. For example, Patent Documents 1 and 2 describe photoacid generators generating perfluorohexanesulfonic acid, perfluorooctanesulfonic acid, perfluoro-4-ethylcyclohexanesulfonic acid, and perfluorobutanesulfonic acid. Further, as a novel acid generator, acid generators generating a perfluoroalkyl ether sulfonic acid are suggested in Patent Documents 3 to 5.

On the other hand, perfluorooctanesulfonic acid or derivatives thereof are known as its acronym PFOS, and has problems of stability (non-degradability) derived from a C—F bond, bioconcentration due to hydrophobicity and lipophilicity, and accumulation. Environmental Protection Agency (EPA) has adopted Significant New Use Rule, listing 13 PFOS-related chemical substances and further 75 chemical substances although their use in the photoresist field is excluded. Further, it has been proposed to apply Significant New Use Rule to 183 chemical substances such as a perfluoroalkanesulfonic acid or a derivative thereof.

To cope with the problems of PFOS, various companies have developed a partially fluorine-substituted alkanesulfonic acid having a lower fluorine substitution ratio. For example, Patent Document 6 discloses development of an α,α-difluoroalkanesulfonic acid salt from an α,α-difluoroalkene and a sulfur compound, and a resist composition containing a photoacid generator generating such a sulfonic acid upon exposure, specifically di(4-tert-butylphenyl)iodonium=1,1-difluoro-2-(1-naphthyl)ethanesulfonate. Patent Document 7 discloses development of an α,α,β,β-tetrafluoroalkanesulfonic acid salt from an α,α,β,β-tetrafluoro-α-iodoalkane and a sulfur compound, a photoacid generator generating such a sulfonic acid, and a resist composition. Patent Document 3 discloses a photoacid generator having a difluorosulfoacetic acid alkyl ester (e.g., 1-(alkoxycarbony)-1,1-difluoromethane sulfonate), or a difluorosulfoacetic acid amide (e.g., 1-carbamoyl-1,1-difluoromethane sulfonate), but does not describe a synthesis method thereof. Patent Document 8 discloses a photosensitive composition containing a compound generating a partially fluorinated-alkanesulfonic acid having a sulfonylamide structure derived from perfluoroalkylene disulfonyl difluoride.

The substances described in Patent Documents have a lower fluorine substitution ratio. However, since the substances have a hydrocarbon skeleton of which the basic skeleton is hard to be degraded, and do not have a substituent which is easily degraded like an ester group, the substances have low degradability. Further, the molecular design in which the size of alkanesulfonic acid is changed is limited. Moreover, the substances have problems such as expensive fluorinated-starting materials.

In addition to degradability and acid strength of photoacid generators, there are many problems. For example, a pattern layout has become finer in recent years, and fluctuation of pattern line width (line width roughness (LWR)) becomes a problem. In processing a gate electrode portion during production of an LSI circuit, a low LWR causes a problem such as leakage current, and thus the electrical characteristics of a transistor deteriorates. The low LWR is thought to be caused by various factors. A main factor thereof is the low affinity of a base resin and a developer, that is, the low solubility of a base resin to a developer. Since a carboxylic acid protecting group conventionally used is a bulky tertiary alkyl group and has a high hydrophobicity, the solubility is low. When a high resolution is required as in formation of microscopic channels, a large LWR leads to an uneven size. A known approach for reducing LWR is to increase the amount of a photoacid generator to be added (Non-Patent Document 2). However, this approach does not achieve sufficient effect since characteristics such as exposure dose dependency, mask fidelity, and pattern rectangularity sometimes deteriorate extremely. Not only increasing the amount of a photoacid generator, but also uniformly dispersing the photoacid generator is required for improvement of LWR.

As the circuit line width is reduced, the influence of contrast degradation by acid diffusion becomes more serious for the resist composition. This is because the pattern size approaches the diffusion length of acid, and this causes a decrease of mask fidelity and a degradation of pattern rectangularity. Accordingly, to obtain more benefits from a reduction of the wavelength of light source and an increase of NA, the resist composition is required to increase dissolution contrast or suppress acid diffusion as compared with the conventional material.

Patent Document 9 discloses alkanecarbonyloxy-1,1,3,3,3-pentafluoropropane sulfonate having 1 to 20 carbon atoms or arenecarbonyloxy-1,1,3,3,3-pentafluoropropane sulfonate having 1 to 20 carbon atoms, such as triphenylsulfonium 2-(adamantane-1-carbonyloxy)-1,1,3,3,3-pentafluoropropane sulfonate, but is not sufficient to control diffusivity and achieve a low LWR.

Patent Documents 10 and 11 disclose photoacid generators generating a partially fluorinated-alkanesulfonic acid having a polycyclic hydrocarbon group, but cannot achieve sufficient resist performance. Since each photoacid generator is a labile ester of difluoroacetic acid, the storage stability of a resist composition containing the photoacid generator may be decreased.

The depth of focus tends to decrease due to a reduction of the wavelength of a light source for light lithography in a device process. Even when a light source with a short wavelength is used, a depth of focus capable of resolving a wide range is required. While a miniaturization of a pattern rule is required, excellent sensitivity, substrate adhesion, and etching resistance are required. In addition, an improvement of LER and an increase of depth of focus (DOF) are necessary without degradation of a resolution.

In immersion lithography, there are problems. Minute water droplets are left on a resist wafer after the immersion exposure, causing damages to the resist pattern profile, collapse or deform into a T-top profile to the developed resist pattern. Therefore, a patterning process which can form a good resist pattern after development in immersion lithography is required.

PRIOR ART DOCUMENTS

Patent Documents

Patent Document 1: Japanese Patent Laid-Open Publication No. 2000-122296
Patent Document 2: Japanese Patent Laid-Open Publication No. 11-282168
Patent Document 3: Japanese Patent Laid-Open Publication No. 2002-214774
Patent Document 4: Japanese Patent Laid-Open Publication No. 2003-140332
Patent Document 5: U.S. Patent No. 2002-197558
Patent Document 6: Japanese Patent Application Publication No. 2004-531749
Patent Document 7: Japanese Patent Laid-Open Publication No. 2004-2252
Patent Document 8: Japanese Patent Laid-Open Publication No. 2005-266766
Patent Document 9: Japanese Patent Laid-Open Publication No. 2007-145797
Patent Document 10: Japanese Patent Laid-Open Publication No. 2007-161707
Patent Document 11: Japanese Patent Laid-Open Publication No. 2008-69146

Non-Patent Documents

Non-Patent Document 1: Journal of photopolymer Science and Technology Vol. 17, No. 4, p. 587 (2004)

Non-patent Document 2: Journal of Photopolymer Science and Technology, Vol. 19, No. 3, 2006, 327-334

SUMMARY OF THE INVENTION

It is desired that an acid generated from an acid generator has acid strength sufficient to cut an acid labile group in a resist composition, a good storage stability in the resist composition, a suitable diffusion in the resist composition, a low volatility, and a low elution volume into water, the amounts of foreign substances is small after development and peeling, and the degradability is good without burdening the environment after completion of lithography. However, the acid generated from the conventional photoacid generator does not satisfy these requirements.

A resist composition using the conventional photoacid generator cannot solve the problems of LER and a wider depth of focus without degradation of a resolution. Further, in conventional acid generator, the degree of its molecular—designs freedom is small. As a result, the exposure condition, and the kind and composition of a polymer are necessarily limited, and the conventional acid generator cannot meet a variety of needs.

In view of the above situation, an object of the present invention is to provide a novel acid generator suitable for an acid generator of a resist composition, which solves the problems of LER and a depth of focus and can be effectively and widely used particularly without degradation of a resolution, a chemically amplified resist composition using the same, and a patterning process.

In order to solve the above-described problems, the present invention provides an acid generator generating a sulfonic acid represented by the following general formula (1) in response to high-energy beam or heat, $$R-\overset{O}{\underset{\phantom{X}}{C}}-O-\overset{A}{\underset{\phantom{X}}{C}}H-\overset{F}{\underset{F}{C}}-SO_3^-H^+ \quad (1)$$

wherein R represents a nitrogen-containing heterocyclic group or a group represented by the following general formula (1-1), and A is a hydrogen atom or a trifluoromethyl group, $$(R^1)(R^2)N-L- \quad (1-1)$$

wherein each of $R^1$ and $R^2$ independently represents a hydrogen atom or a monovalent hydrocarbon group having 1 to 20 carbon atoms optionally substituted by a heteroatom, or $R^1$ and $R^2$ may be bonded to form a ring together with the nitrogen atom in the general formula (1-1), and L represents a divalent hydrocarbon group having 1 to 20 carbon atoms optionally substituted by a heteroatom.

Synthesis of such an acid generator is simply and various molecular designs thereof are possible. Therefore, the molecular design can be performed according to a condition for a desired resist. When the acid generator is used for a chemically amplified resist composition, the acid generator can solve the problems of LER and a depth of focus without degradation of a resolution.

In this case, the acid generator generating a sulfonic acid represented by the general formula (1) may be a sulfonium salt represented by the following general formula (2),

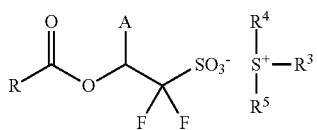
(2)

wherein R and A represent the same meanings as before; each of $R^3$, $R^4$, and $R^5$ independently represents any of a linear or a branched alkyl group, alkenyl group, and oxoalkyl group, substituted or unsubstituted, having 1 to 10 carbon atoms, or any of an aryl group, an aralkyl group, and an aryloxoalkyl group, substituted or unsubstituted, having 6 to 18 carbon atoms, or any two or more of $R^3$, $R^4$, and $R^5$ may be bonded to form a ring together with the sulfur atom in the formula.

The sulfonium salt may be one represented by the following general formula (3),

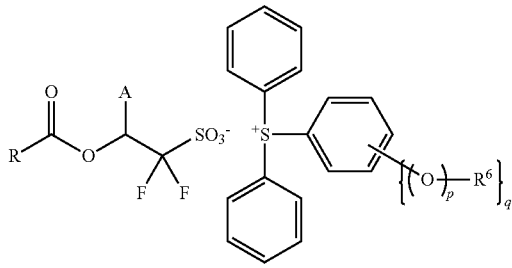
(3)

wherein R and A represent the same meanings as before; $R^6$ represents a linear, a branched, or a cyclic alkyl group or alkenyl group, substituted or unsubstituted, having 1 to 20 carbon atoms, or a substituted or an unsubstituted aryl group having 6 to 14 carbon atoms; p represents 0 or 1; and q represents an integer of 1 to 5.

As described above, the acid generator generating the acid represented by the general formula (1) includes those represented by the general formulae (2) and (3).

The present invention provides a chemically amplified resist composition containing a photoacid generator generating a sulfonic acid represented by any one of the following general formulae (4) to (6), a base resin, and an organic solvent,

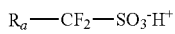
(4)

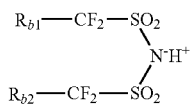
(5)

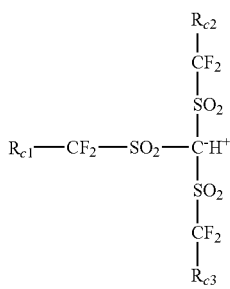
(6)

wherein each of $R_a$, $R_{b1}$, $R_{b2}$, $R_{c1}$, $R_{c2}$, and $R_{c3}$ independently represents a fluorine atom or a monovalent hydrocarbon group having 1 to 20 carbon atoms optionally containing a heteroatom, or $R_{b1}$ and $R_{b2}$, and $R_{c1}$ and $R_{c2}$ may be bonded with each other to form a ring.

The chemically amplified resist composition of the present invention has an excellent LER, a wider depth of focus, and a high resolution suitable for microfabrication.

The base resin is preferably a polymer containing a repeating unit having an acid labile group represented by the following, general formula (7) and a repeating unit represented by the following general formula (8),

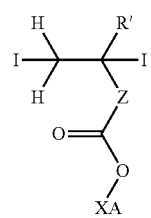
(7)

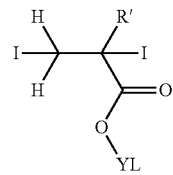
(8)

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms optionally containing any of a hydroxyl group, an ether bond, an ester bond, and a lactone ring, a phenylene group, or a naphthylene group; XA represents an acid labile group; YL represents a hydrogen atom or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

A resin composition using such a base resin can have a high resolution. A chemically amplified resin composition using the acid generator of the present invention has a high sensitivity and a high dry etching resistance, and in particular can be suitably used in deep-ultraviolet lithography.

The present invention provides a patterning process including a step of applying the chemically amplified resist composition to a substrate; a step of conducting heat-treatment; a step of exposing the substrate to any of a KrF excimer laser, an ArF excimer laser, EUV lithography, and an electron beam through a photomask; a step of conducting heat-treatment; and a step of developing it with a developer.

According to the patterning process of the present invention, a pattern having a very excellent pattern profile, roughness, and DOF can be formed.

In the exposure, a liquid having a refractive index of 1.0 or more can be placed between a resist film and a projection lens to conduct immersion lithography.

As described above, in the exposure step of the present invention, the immersion method in which immersion is conducted by placing a liquid having a refractive index of 1.0 or more between a resist film and a projection lens can be used.

Further, a top coat may be formed on the resist film, and the liquid may be placed between the top coat and the projection lens to conduct immersion lithography.

Thus, the surface of the resist film can be protected in immersion lithography, and therefore a pattern can be formed more exactly.

As described above, the synthesis of the acid generator of the present invention is simply and various molecular designs thereof are possible. Therefore, molecular design can be performed according to a condition for a desired resist. When the acid generator is used for a chemically amplified resist composition, the acid generator can solve the problems of LER and a depth of focus without degradation of a resolution.

When a chemically amplified resist composition containing the acid generator of the present invention is used for patterning, the formed pattern is excellent in a pattern profile, roughness, and DOF.

DETAILED DESCRIPTION OF THE PREFERRED EMBODIMENTS

Figure 1:
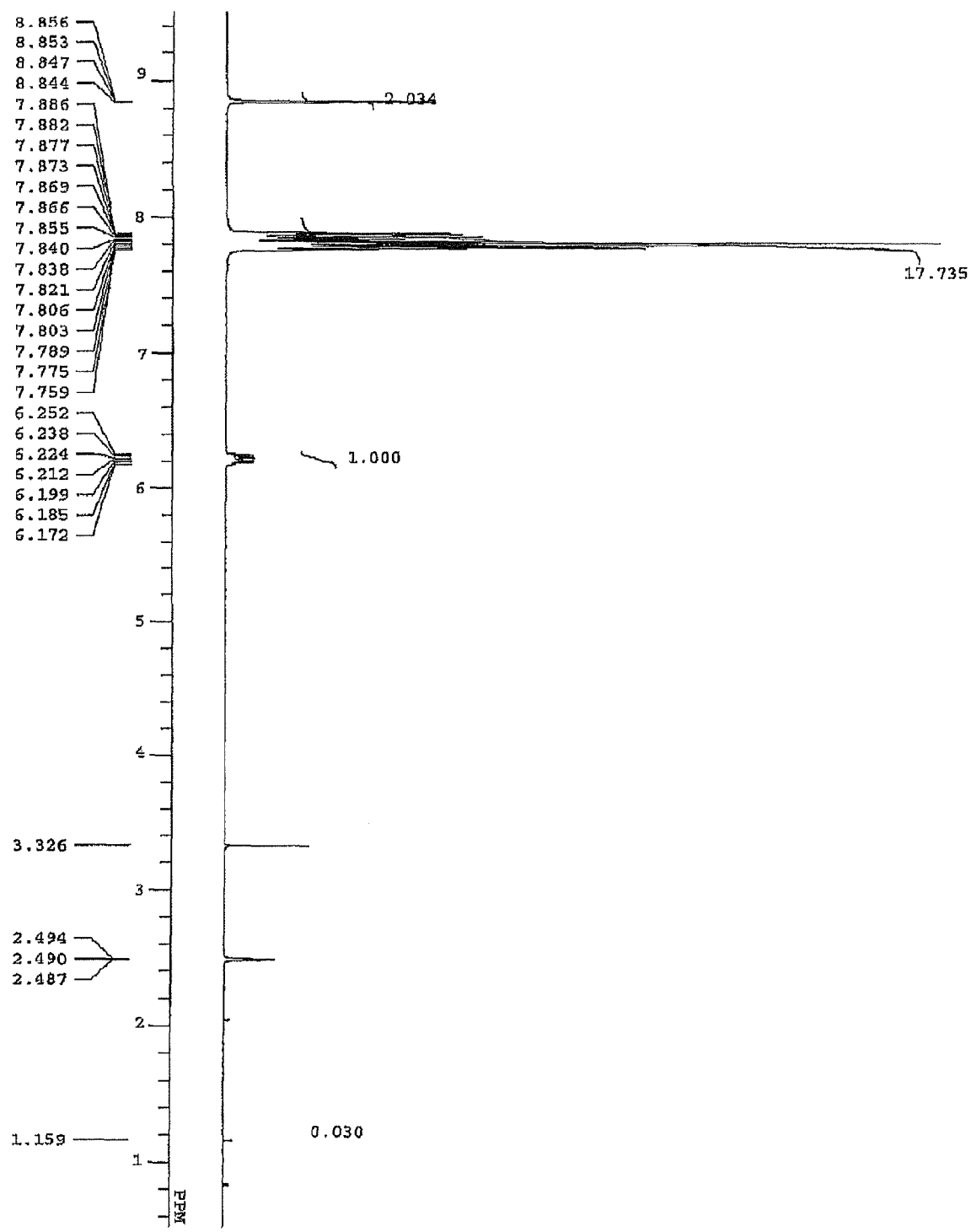
FIG. 1 is a graph showing $^1$H-NMR of [PAG-1] in Synthesis Example 1-1.

Hereinafter, the present invention will be described in detail.

As described above, when the conventional acid generator used for a resist composition is used, the generated acid cannot satisfy various characteristics, and in particular, the problems of LER and a wider depth of focus cannot be solved without degradation of a resolution. Further, in conventional acid generator, the degree of its molecular—designs freedom is small. As a result, the exposure condition, and the kind and composition of a polymer are necessarily limited, and the conventional acid generator cannot meet a variety of needs.

The present inventors has investigated various acid generators used for a resist composition, and as a result, found that an acid generator generating an acid having a specific structure containing a nitrogen atom in the molecule can solve the problems. The present invention has been completed.

The acid generator of the present invention generates a sulfonic acid represented by the following general formula (1) in response to high-energy beam or heat,

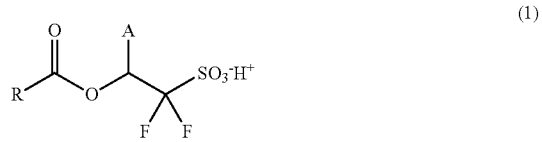

wherein R represents a nitrogen-containing heterocyclic group or a group represented by the following general formula (1-1); and A represents a hydrogen atom or a trifluoromethyl group, $(R^1)(R^2)N\text{-}L\text{-}$ (1-1)

wherein each of $R^1$ and $R^2$ independently represents a hydrogen atom or a monovalent hydrocarbon group having 1 to 20 carbon atoms optionally substituted by a heteroatom, or $R^1$ and $R^2$ may be bonded to form a ring together with the nitrogen atom in the general formula (1-1); and L represents a divalent hydrocarbon group having 1 to 20 carbon atoms optionally substituted by a heteroatom.

One of characteristics of the acid generator of the present invention is easiness of changing a structure represented by R into various structures according to a method described below. Thus, the degree of freedom of changing a structure is high, and the resist characteristics can be easily adjusted by modification of acyl group. Accordingly, an acid generator having an appropriate structure of R can be selected according to the exposure condition, and the kind and composition of a polymer.

The acid generated from the acid generator of the present invention can be quenched by the nitrogen atom of the acid generator in an exposed area. For example, in selection of counter cation in a sulfonium salt described below, the resist characteristics can be adjusted.

The acid generator of the present invention has a nitrogen atom, and basically acts as a quencher. However, the quenching function is lost in an exposed area by generation of an acid from the acid generator of the present invention, and an acid generated from a photoacid generator used in combination is efficiently diffused. On the other hand, the compound of the present invention simply acts as a quencher in a non-exposed area, that is, traps the acid diffused from the exposed area.

Thus, contrast is improved, and as a result, a pattern profile, roughness, and DOF are improved.

Examples of a nitrogen-containing heterocyclic group R in the general formula (1) include aziridine, pyrrolidine, piperidine, morpholine, pyrrole, pyridine, azetine, oxazole, isoxazole, thiazole, isothiazole, imidazole, pyrazole, pyridazine, pyrimidine, pyrazine, pyrroline, 2-imidazoline, imidazolidine, 3-pyrazoline, pyrazolidine, piperazine, triazine, oxadiazine, dithiazine, indole, isoindole, quinoline, isoquinoline, cinnoline, phthalazine, quinazoline, quinoxaline, 1,8-naphthyridine, purine, pteridine, indolizine, carbazole, acridine, phenazine, phenanthridine, 1,10-phenanthroline, phenoxazine, indoline, isoindoline, quinuclidine, benzo[e]indole, and benzo[cd]indole.

In the general formula (1-1), L represents a divalent hydrocarbon group having 1 to 20 carbon atoms optionally substituted by a heteroatom, and examples thereof include a linear alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; a branched alkanediyl group in which the linear alkanediyl group has a side chain such as a methyl group, an ethyl group, a propyl group, an isopropyl group, a butyl group, a sec-butyl group, and a tert-butyl group; a saturated cyclic hydrocarbon group such as a cyclopentanediyl group, a cyclohexanediyl group, a norbornanediyl group, and an adamantanediyl group; and an unsaturated cyclic hydrocarbon group such as a phenylene group and a naphthylene group. In L, two or more kinds of the groups may be used in combination. Some hydrogen atoms of the groups may be replaced by a heteroatom such as an oxygen atom, a sulfur atom, a nitrogen atom, or a halogen atom. As a result, a hydroxyl group, a cyano group, a carbonyl group, an ether bond, an ester bond, a sulfonate ester bond, a carbonate bond, a lactone ring, a sultone ring, a carboxylic anhydride, or a haloalkyl group may be formed.

In the general formula (1-1), each of $R^1$ and $R^2$ independently represents a hydrogen atom or a monovalent hydrocarbon group having 1 to 20 carbon atoms optionally substituted by a heteroatom, or $R^1$ and $R^2$ may be bonded to form a ring together with the nitrogen atom in the general formula (1-1).

Specific examples thereof include a alkyl group such as a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantyl group; an alkenyl group such as a vinyl group, an allyl group, a propenyl group, a butenyl group, a hexenyl group, and a cyclohexenyl group; an aryl group such as a phenyl group, a naphthyl group, and a thienyl group; and an aralkyl group such as a benzyl group, a 1-phenylethyl group, and a 2-phenylethyl group. Some hydrogen atoms of the hydrocarbon group may be replaced by the hydrocarbon groups described above, or a heteroatom such as an oxygen atom, a sulfur atom, a nitrogen atom, or a halogen atom. As a result, a hydroxyl group, a cyano group, a carbonyl group, an ether bond, an ester bond, a sulfonate ester bond, a carbonate bond, a lactone ring, a sultone ring, a carboxylic anhydride, or a haloalkyl group may be formed.

When $R^1$ and $R^2$ may be bonded to from a ring together with the nitrogen atom in the general formula (1-1), specific examples of the ring include aziridine, pyrrolidine, piperidine, morpholine, pyrrole, pyridine, azetine, oxazole, isoxazole, thiazole, isothiazole, imidazole, pyrazole, pyridazine, pyrimidine, pyrazine, pyrroline, 2-imidazoline, imidazolidine, 3-pyrazoline, pyrazolidine, piperazine, triazine, oxadiazine, dithiazine, indole, isoindole, quinoline, isoquinoline, cinnoline, phthalazine, quinazoline, quinoxaline, 1,8-naphthyridine, purine, pteridine, indolizine, carbazole, acridine, phenazine, phenanthridine, 1,10-phenanthroline, phenoxazine, indoline, isoindoline, quinuclidine, benzo[e]indole, and benzo[cd]indole. Some hydrogen atoms of the rings may be replaced by the hydrocarbon groups described above, or a heteroatom such as an oxygen atom, a sulfur atom, a nitrogen atom, or a halogen atom. As a result, a hydroxyl group, a cyano group, a carbonyl group, an ether bond, an ester bond, a sulfonate ester bond, a carbonate bond, a lactone ring, a sultone ring, a carboxylic anhydride, or a haloalkyl group may be formed.

Specific examples of the sulfonic acid represented by the general formula (1) include as follows, but the present invention is not limited to these.

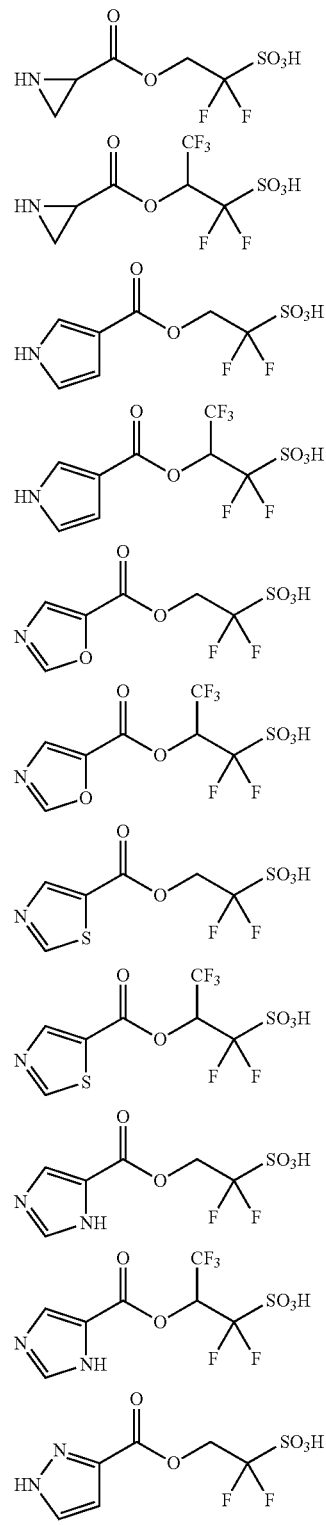

11
-continued
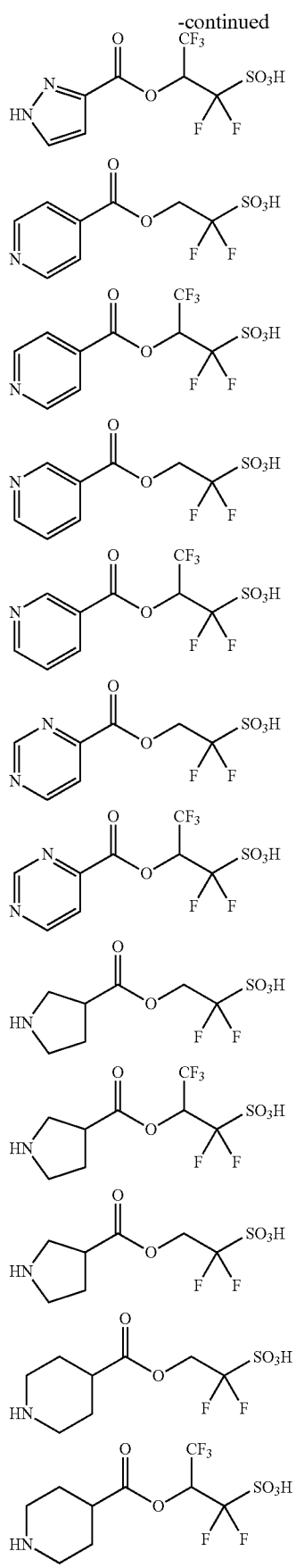
12
-continued
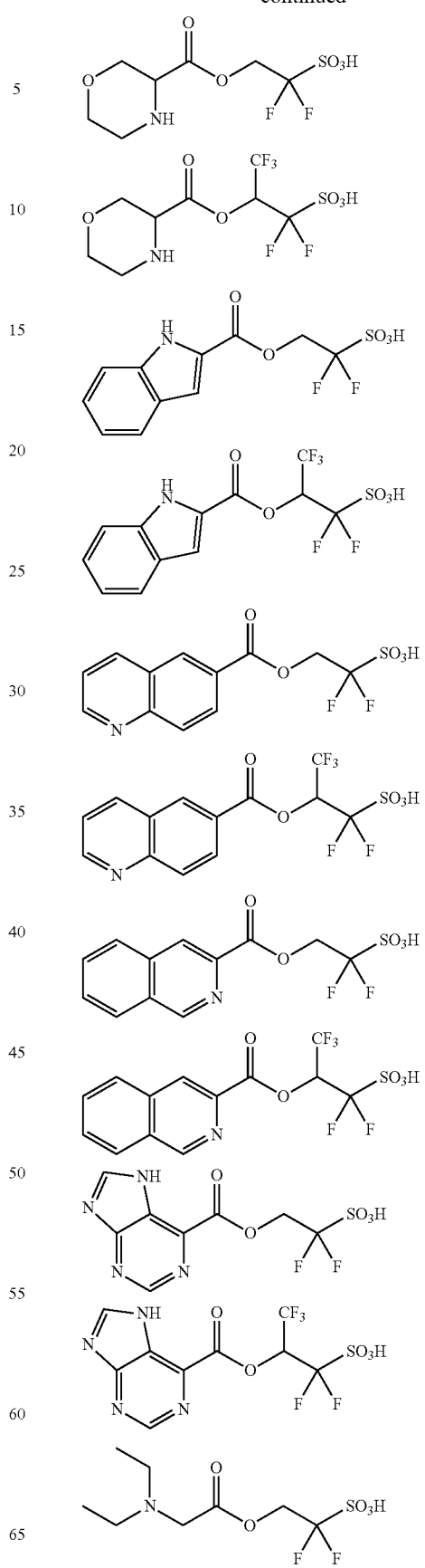

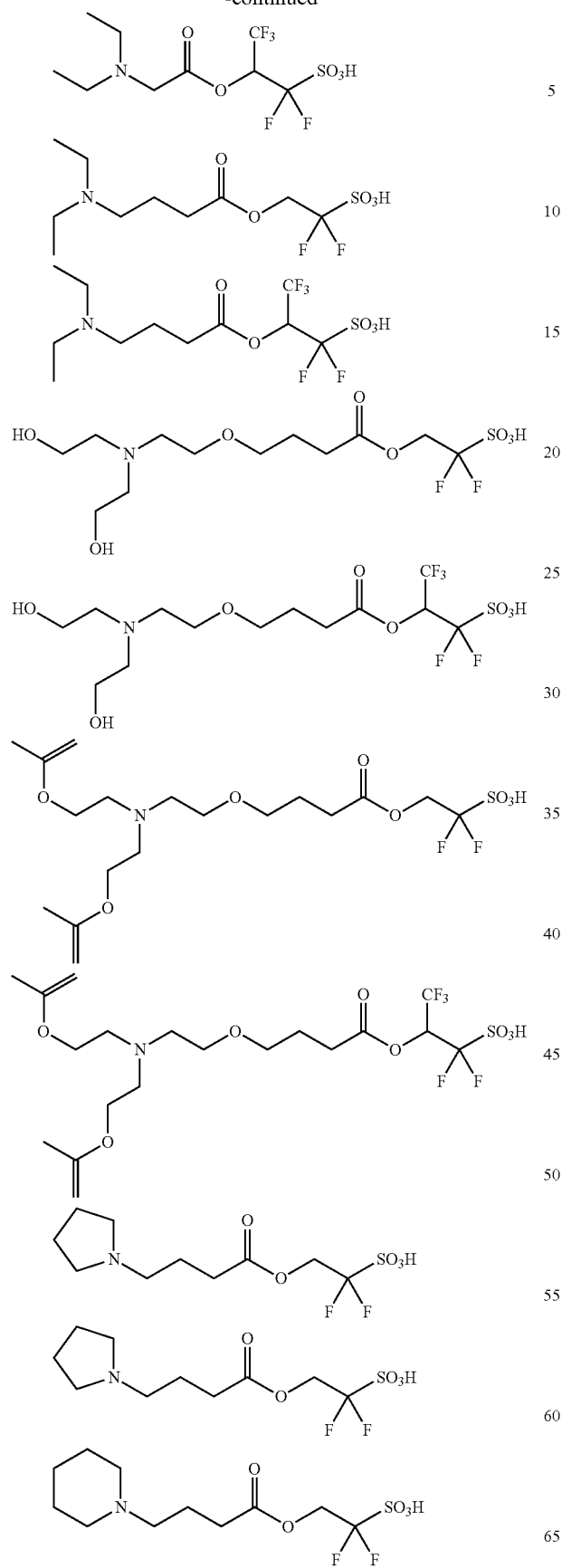
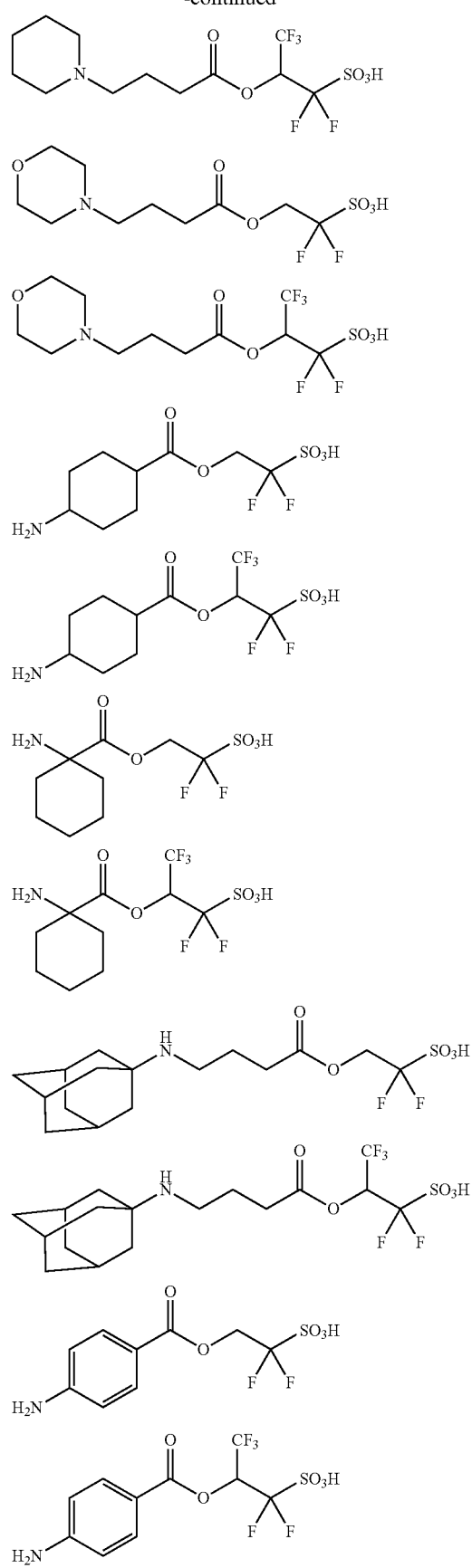

-continued
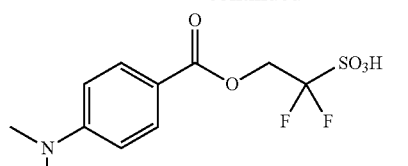
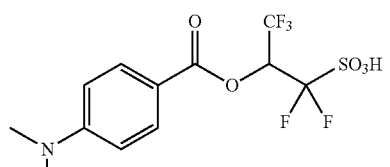
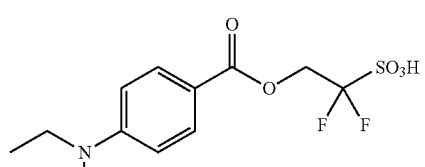
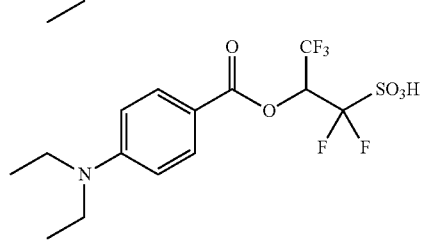
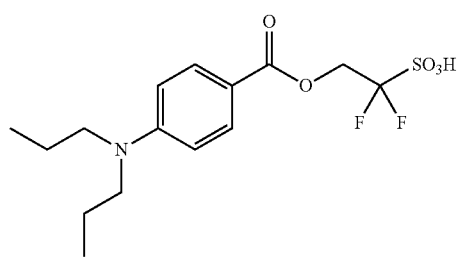
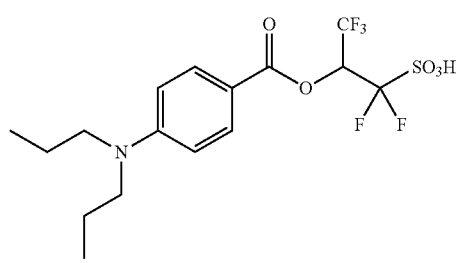
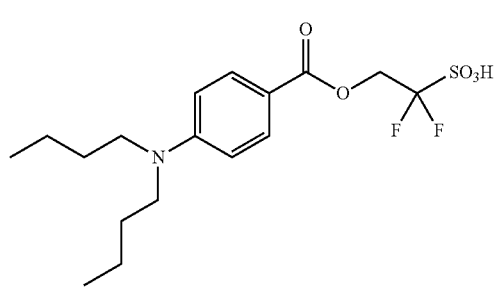
-continued
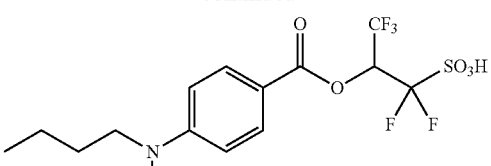
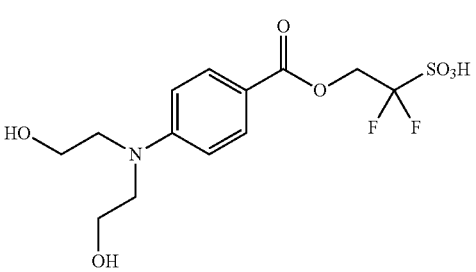
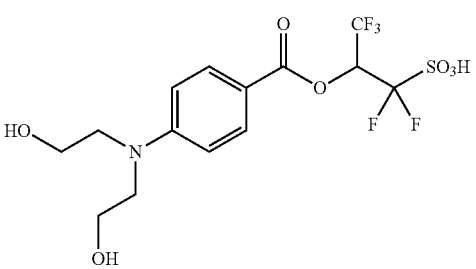
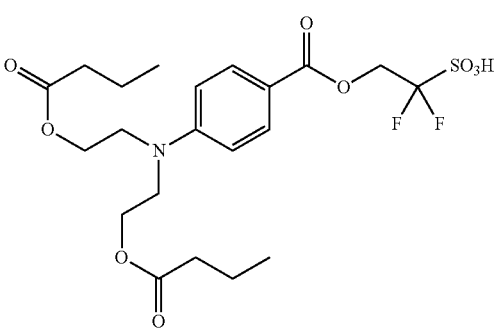
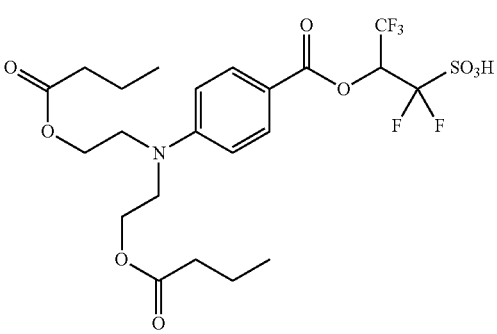

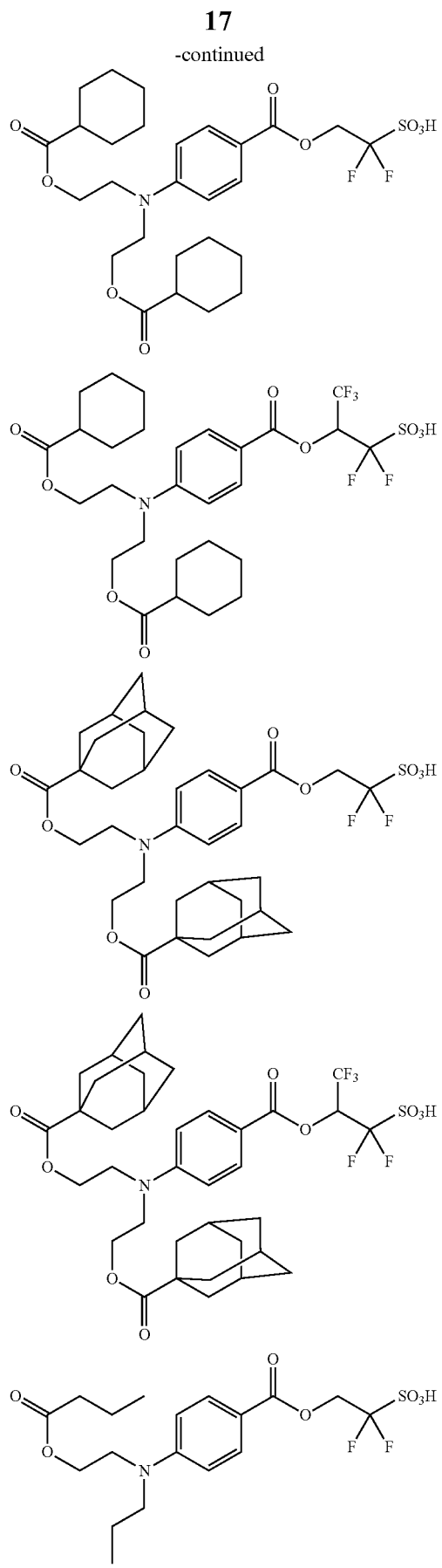

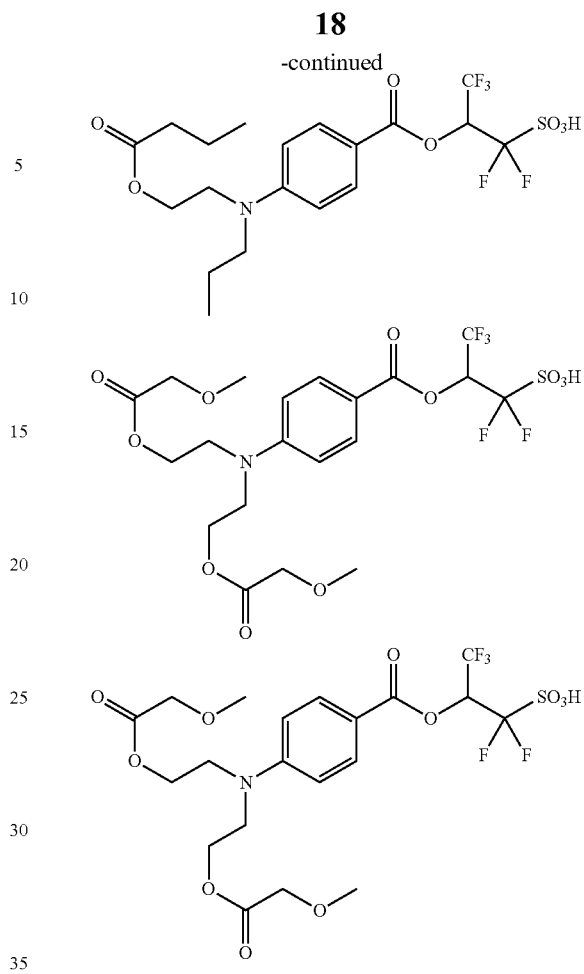

In R of the general formula (1), a particularly preferred substituent is a pyridine ring or an aniline derivative from the viewpoints of easiness of acquisition and easiness of synthesis. Since the substituents are weakly basic, they can be applied to a resist composition containing a material having an alkylsulfonium cation which is generally labile to a nucleophilic reagent or a basic compound. Therefore, the range of design of material is increased. Accordingly, they are preferable.

Examples of the acid generator generating the sulfonic acid represented by the general formula (1) include, but not limited to an onium salt (e.g., iodonium salt, sulfonium salt, and ammonium salt). The acid generator is not limited as long as it generates an acid represented by the general formula (1) in response to high-energy beam or heat.

Specific examples of the acid generator include a sulfonium salt represented by the following general formula (2).

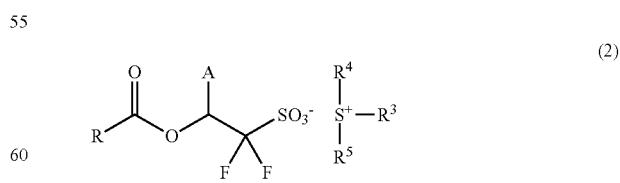

(2)

In the general formula (2), R and A represent the same meanings as before; and each of $R^3$, $R^4$, and $R^5$ independently represents any of a linear or a branched alkyl group, alkenyl group, and oxoalkyl group, substituted or unsubstituted, having 1 to 10 carbon atoms, or any of a aryl group, aralkyl group, and aryloxoalkyl group, substituted or an unsubstituted, having 6 to 18 carbon atoms, or any two or more of $R^3$, $R^4$, and $R^5$ may be bonded to form a ring together with the sulfur atom in the formula.

Specifically, examples of an alkyl group include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantyl group. Examples of an alkenyl group include a vinyl group, an allyl group, a propenyl group, a butenyl group, a hexenyl group, and a cyclohexenyl group. Examples of an oxoalkyl group include a 2-oxocyclopentyl group, a 2-oxocyclohexyl group, a 2-oxopropyle group, a 2-oxoethyl group, a 2-cyclopentyl-2-oxoethyl group, a 2-cyclohexyl-2-oxoethyl group, and a 2-(4-methylcyclohexyl)-2-oxoethyl group.

Examples of an aryl group include a phenyl group, a naphthyl group, a thienyl group, an alkoxyphenyl group such as a 4-hydroxyphenyl group, a 4-methoxyphenyl group, a 3-methoxyphenyl group, a 2-methoxyphenyl group, a 4-ethoxyphenyl group, a 4-tert-buthoxyphenyl group, and a 3-tert-buthoxyphenyl group, an alkylphenyl group such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group, an alkylnaphthyl group such as a methylnaphthyl group and an ethylnaphthyl group, an alkoxynaphthyl group such as a methoxynaphtyl group and an ethoxynaphtyl group, a dialkylnaphthyl group such as a dimethylnaphtyl group and a diethylnaphtyl group, and an dialkoxynaphthyl group such as a dimethoxynaphtyl group and a diethoxynaphtyl group. Examples of an aralkyl group include a benzyl group, a 1-phenylethyl group, and a 2-phenylethyl group. Examples of an aryloxoalkyl group include a 2-aryl-2-oxoethyl group such as a 2-phenyl-2-oxoethyl group, a 2-(1-naphthyl)-2-oxoethyl group, and a 2-(2-naphthyl)-2-oxoethyl group.

When any two or more of $R^3$, $R^4$, and $R^5$ may be bonded to form a ring together with the sulfur atom in the formula, examples of a group forming the ring structure include a divalent organic group such as 1,4-butylene and 3-oxa-1,5-pentylene. Further, examples of a substituent include an aryl group having a polymerizable substituent such as an acryloyloxy group and a methacryloyloxy group. Specific examples thereof include a 4-acryloyloxyphenyl group, a 4-methacryloyloxyphenyl group, a 4-acryloyloxy-3,5-dimethylphenyl group, a 4-methacryloyloxy-3,5-dimethylphenyl group, a 4-vinyloxyphenyl group, and a 4-vinylphenyl group.

Specific examples of a sulfonium cation include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-hydroxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl (4-thiophenoxyphenyl) sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris (4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphtylsulfonium, tribenzylsulfonium, diphenylmethylsulfonium, dimethylphenylsulfonium, 5-phenyldibenzothiophenium, 10-phenylphenoxathiinium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium.

Preferred examples thereof include triphenylsulfonium, 4-tert-butylphenyldiphenylsulfonium, 4-tert-butoxyphenyldiphenylsulfonium, tris(4-tert-butylphenyl)sulfonium, and 4-tert-butoxycarbonylmethyloxyphenyldiphenylsulfonium. Further, examples thereof include 4-methacryloyloxyphenyldiphenylsulfonium, 4-acryloyloxyphenyldiphenylsulfonium, 4-methacryloyloxyphenyldimethylsulfonium, 4-acryloyloxyphenyldimethylsulfonium, (4-methacryloyloxy-3,5-dimethylphenyl)diphenylsulfonium, and (4-acryloyloxy-3,5-dimethylphenyl)diphenylsulfonium. On the polymerizable sulfonium cation, Japanese Patent Laid-Open Publication Nos. 4-230645 and 2005-84365 can be used for reference. The polymerizable sulfonium salt can be used as a monomer which is a component of a polymer described below.

In the sulfonium salt as the acid generator of the present invention, an alkylsulfonium cation which is labile to a nucleophilic reagent and a basic compound can be particularly selected as a counter cation.

For example, the acid generator of the present invention may be a sulfonium salt represented by the following general formula (3),

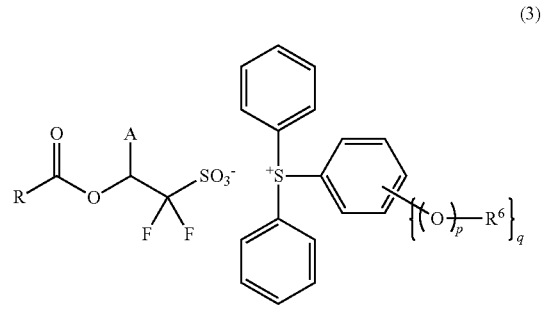

(3)

wherein R and A represent the same meanings as before; $R^6$ represents a linear, a branched, or a cyclic alkyl group or alkenyl group, substituted or unsubstituted, having 1 to 20 carbon atoms, or a substituted or an unsubstituted aryl group having 6 to 14 carbon atoms; p represents 0 or 1; and q represents an integer of 1 to 5.

In the general formula (3), R and A represent the same meanings as before. The site of substitution of a $R^6$—$(O)_p$— group is not limited, and the 4-position or 3-position of a phenyl group is preferable, and the 4-position is more preferable. Examples of $R^6$ include a methyl group, an ethyl group, a n-propyl group, a sec-propyl group, a cyclopropyl group, a n-butyl group, a sec-butyl group, an isobutyl group, a tert-butyl group, a n-pentyl group, a cyclopentyl group, a n-hexyl group, a cyclohexyl group, a n-octyl group, a n-decyl group, a n-dodecyl group, a trifluoromethyl group, a phenyl group, a 4-methoxyphenyl group, and a 4-tert-butylphenyl group. Further, when p is 1, an acryloyl group, a methacryloyl group, a vinyl group, and allyl group are exemplified. p represents 0 or 1. q represents an integer of 1 to 5, and preferably 1.

Specific examples of a sulfonium cation include 4-methylphenyldiphenylsulfonium, 4-ethylphenyldiphenylsulfonium, 4-tert-butylphenyldiphenylsulfonium, 4-cyclohexylphenyldiphenylsulfonium, 4-n-hexylphenyldiphenylsulfonium, 4-n-octylphenyldiphenylsulfonium, 4-methoxyphenyldiphenylsulfonium, 4-ethoxyphenyldiphenylsulfonium, 4-tert-butoxyphenyldiphenylsulfonium, 4-cyclohexyloxyphenyldiphenylsulfonium, 4-n-hexyloxyphenyldiphenylsulfonium, 4-n-octyloxyphenyldiphenylsulfonium, 4-dodecyloxyphenyldiphenylsulfonium, 4-trifluoromethylphenydiphenylsulfonium, 4-trifluoromethyloxyphenydiphenylsulfonium, 4-tert-butoxycarbonylmethyloxyphenyldiphenylsulfonium, 4-methacryloyloxyphenyldiphenylsulfonium, 4-acryloyloxyphenyldiphenylsulfonium, (4-n-hexyloxy-3,5-dimethylphenyl)diphenylsulfonium, (4-methacryloyloxy-3,5-dimethylphenyl)diphenylsulfonium, and (4-acryloyloxy-3,5-dimethylphenyl)diphenylsulfonium.

Herein, a method for synthesizing a sulfonium salt represented by the general formula (2) which is one of the acid generators of the present invention which generate the acid represented by the general formula (1) will be described.

A synthesizing method in which A represents a hydrogen atom will be first described.

A sulfonium salt having 1,1-difluoro-2-hydroxyethanesulfonate is prepared. A method for producing the same is as follows.

2-Bromo-2,2-difluoroethanol and carboxylic acid chloride react to obtain 2-bromo-2,2-difluoroethylalkanecarboxylate or 2-bromo-2,2-difluoroethylarenecarboxylate. The bromo group of the compound is converted into sodium sulfinate by a sulfur compound such as sodium dithionite, and the sulfinic acid is converted into a sulfonic acid by an oxidant such as hydrogen peroxide,

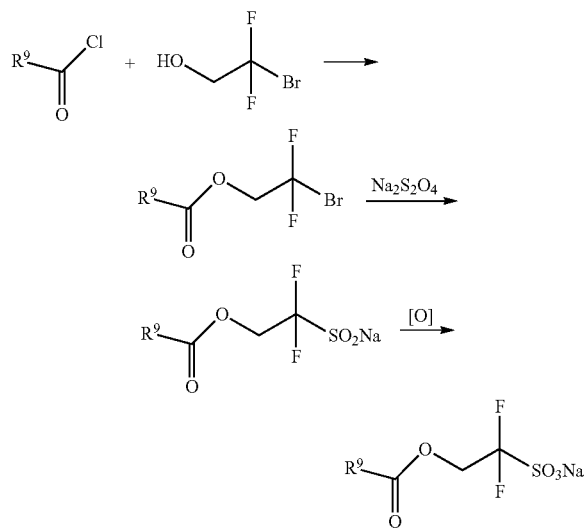

wherein $R^9$ represents a linear, a branched, or a cyclic alkyl group having 1 to 20 carbon atoms optionally containing a heteroatom.

The estification, conversion of halogenated alkane into sodium sulfinate, and conversion into a sulfonic acid are known. The two latter procedures are detailed in Japanese Patent Laid-Open Publication No. 2004-2252.

The obtained sodium sulfonate and a sulfonium salt compound are subjected to ion exchange reaction to obtain a targeted sulfonium salt. The ion exchange reaction is detailed in Japanese Patent Laid-Open Publication No. 2007-145797,

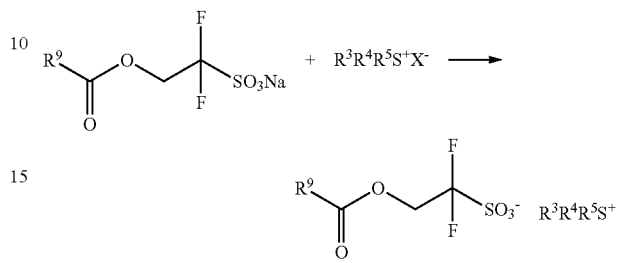

wherein $R^3$ to $R^5$, and $R^9$ are as defined above; $X^-$ represents a counter anion, and examples thereof include, not limited to, halides such as $I^-$, $Br^-$, and $Cl^-$, a sulfonic acid anion or an alkylsulfonic acid anion such as a sulfuric acid anion and a methylsulfonic acid anion, a carboxylic acid anion such as acetate and benzoate, alkanesulfonate such as methanesulfonate and propanesulfonate, arenesulfonate such as benzenesulfonate and p-toluenesulfonate, and hydroxide.

The acyl group which is introduced above and is represented by $R^9CO-$ is subjected to ester hydrolysis or solvolysis to synthesis a sulfonium salt having 1,1-difluoro-2-hydroxyethanesulfonate. The outline of the process will be shown below,

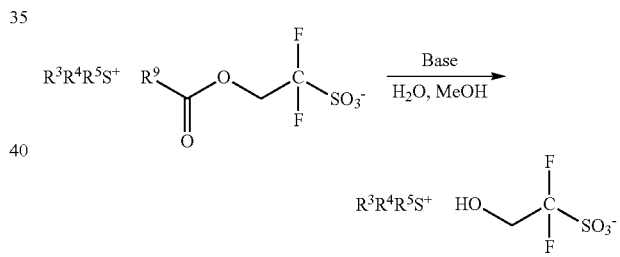

wherein $R^3$ to $R^5$ and $R^9$ represent the same meanings as before; and Me represents a methyl group.

Even when $R^9$ is a substituent labile to the condition during the synthesis of the anion (the bromo group is converted into sodium sulfinate by a sulfur compound such as sodium dithionite, and the sulfinic acid is converted into a sulfonic acid by an oxidant such as hydrogen peroxide), 1,1-difluoro-2-hydroxyethanesulfonate can be introduced according to this procedure.

The sulfonium salt represented by the general formula (3) can be synthesized according to the same procedure.

A sulfonium salt and an iodonium salt as starting materials can be synthesized with reference to Japanese Patent Laid-Open Publication Nos. 8-311018, 9-15848, and 2001-122850. As a polymerizable substituent, an onium cation having an acryloyloxy group or a methacryloyloxy group can be synthesized by a reaction of available hydroxyphenyldiphenylsulfonium halide with acryloyl chloride or methacryloyl chloride under basic conditions according to the methods described in Japanese Patent Laid-Open Publication Nos. 4-230645 and 2005-84365.

The synthesized sulfonium salt having 1,1-difluoro-2-hydroxyethanesulfonate reacts with a carboxylic acid halide represented by the following general formula (9) under basic conditions to synthesize the sulfonium salt (acid generator) of the present invention represented by the general formula (2), $$R\text{—}COCX_1 \tag{9}$$

wherein R represents the same meaning as before; and $X^1$ represents a halogen atom.

A method for synthesizing the sulfonium salt of the present invention represented by the general formula (2) wherein A represents a trifluoromethyl group will be described below.

A sulfonium salt having 1,1,3,3,3-pentafluoro-2-hydroxypropanesulfonate is synthesized instead of a sulfonium salt having 1,1-difluoro-2-hydroxyethanesulfonate. After then, a sulfonium salt (acid generator) of the present invention represented by the general formula (2) wherein A represents a trifluoromethyl group can be synthesized in the same manner as in the case where A represents a hydrogen atom.

The sulfonium salt having 1,1,3,3,3-pentafluoro-2-hydroxypropanesulfonate can be synthesized with reference to Japanese Patent Laid-Open Publication No. 2007-145804.

A method for synthesizing the acid generator of the present invention which generates the sulfonic acid represented by the general formula (1) is as defined above, but is one of the methods. The present invention is not limited to the method.

Chemically Amplified Resist Composition

The present invention provides a chemically amplified resist composition containing an acid generator generating the sulfonic acid represented by the general formula (1) under high energy irradiation or heat. For example, such a chemically amplified resist composition is a chemically amplified resist composition containing the acid generator of the present invention, a base resin, and an organic solvent.

In the chemically amplified resist composition of the present invention, the acid generator of the present invention is as described above. The mixed amount of the acid generator is preferably 0.1 to 80 parts by mass, and particularly preferably 1 to 40 parts by mass, relative to 100 parts by mass of base resin. When the mixed amount falls within the above-described range, the resolution is improved, and a problem of foreign material upon development and resist film peeling is not caused.

The chemically amplified resist composition of the present invention may contain an acid generator other than the acid generator according to the present invention. The acid generator other than the acid generator according to the present invention (other acid generator) may be a compound generating an acid under high energy irradiation. Suitable examples of a photoacid generator include a sulfonium salt, an iodonium salt, sulfonyldiazomethane, N-sulfonyloxyimide, and oxime-O-sulfonate acid generators, and preferable examples thereof include a photoacid generator generating a sulfonic acid represented by any of the following general formulae (4) to (6), $$R_a\text{—}CF_2\text{—}SO_3^-H^+ \tag{4}$$

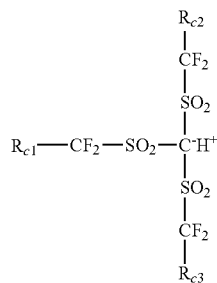

wherein each of $R_a$, $R_{b1}$, $R_{b2}$, $R_{c1}$, $R_{c2}$, and $R_{c3}$ independently represents a fluorine atom or a monovalent hydrocarbon group having 1 to 20 carbon atoms optionally containing a heteroatom, or $R_{b1}$ and $R_{b2}$, and $R_{c1}$ and $R_{c2}$ may be bonded with each other to form a ring.

Specific examples of monovalent hydrocarbon groups having 1 to 20 carbon atoms optionally containing a heteroatom of $R_a$, $R_{b1}$, $R_{b2}$, $R_{c1}$, $R_{c2}$, and $R_{c3}$ include a linear or a branched alkyl group, an alicyclic hydrocarbon group, an aromatic hydrocarbon group, and an alkenyl group. Examples of the linear or branched alkyl group include a methyl group, an ethyl group, a propyl group, an isopropyl group, a n-butyl group, a sec-butyl group, a tert-butyl group, a pentyl group, an isopentyl group, a neopentyl group, a tert-pentyl group, a 1-methylpentyl group, a 2-methylpentyl group, a hexyl group, an isohexyl group, a 5-methylhexyl group, a heptyl group, an octyl group, a nonyl group, a decyl group, and a dodecyl group.

Examples of the alicyclic hydrocarbon group include a cyclopentyl group, a cyclohexyl group, a cycloheptyl group, a cyclopropylmethyl group, a 4-methylcyclohexyl group, a cyclohexylmethyl group, a norbornyl group, and an adamantyl group.

Examples of the aromatic hydrocarbon group include a phenyl group, an o-tolyl group, a m-tolyl group, a p-tolyl group, a xylyl group, a mesityl group, a o-cumenyl group, a m-cumenyl group, a p-cumenyl group, a biphenyl group, a naphthyl group, and an anthryl group.

Examples of the alkenyl group include a vinyl group, an allyl group, a 1-propenyl group, a 2-propenyl group, an isopropenyl group, a butenyl group, a hexenyl group, and cyclohexenyl group.

Examples of a hydrocarbon group containing a heteroatom include the above-mentioned hydrocarbon groups which have an alkoxy group such as a methoxy group, an ethoxy group, a propoxy group, or a butoxy group, as a substituent; the above-mentioned hydrocarbon groups which have a carbonyl group as a substituent; the above-mentioned hydrocarbon groups which have a hydroxyl group as a substituent; the above-mentioned hydrocarbon groups which have an ester bond such as an acetyl group or a benzoyloxy group, as a substituent; the above-mentioned hydrocarbon groups which have a carboxyl group as a substituent; the above-mentioned hydrocarbon groups which have a sulfonic acid as a substituent; the hydrocarbon groups which have a halogen atom (e.g., fluorine atom, chlorine atom, bromine atom, and iodine atom) as a substituent; and the above-mentioned hydrocarbon groups which have a combination of two or more of the substituents.

When $R_{b1}$ and $R_{b2}$, and $R_{c1}$ and $R_{c2}$ form a ring, they represent a divalent hydrocarbon group having a single bond or 1 to 20 carbon atoms in all optionally containing a heteroatom. The divalent hydrocarbon group is, for example, an alkylene group having 1 to 20 carbon atoms, preferably a methylene group, an ethylene group, a propylene group, a butylene group, a pentylene group, or a hexylene group, more preferably a divalent hydrocarbon group in which the hydrogen atom is substituted by a fluorine atom.

The added amount of the other acid generator in the chemically amplified resist composition of the present invention is preferably 0.1 to 80 parts by mass, particularly preferably 0.1 to 40 parts by mass, relative to 100 parts by mass of base resin in the resist composition. When the amount of the other photoacid generator to be added falls within the above-described range, the resolution is improved, and a problem of foreign material upon development and resist film peeling is not caused.

The other photoacid generators may be used alone or as a mixture of two or more kinds of them. Further, the transmittance of the resist film can be controlled by using a photoacid generator having a low transmittance at the exposure wavelength and adjusting the added amount of the photoacid generator.

The base resin is preferably a polymer containing a repeating unit having an acid labile group represented by the following general formula (7) and a repeating unit represented by the following general formula (8),

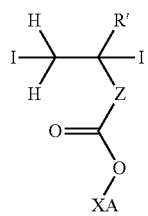

(7)

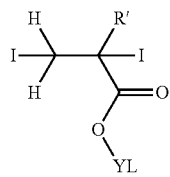

(8)

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms optionally containing any of a hydroxyl group, an ether bond, an ester bond, and a lactone ring, a phenylene group, or a naphthylene group; XA represents an acid labile group; and YL represents a hydrogen atom or a polar group having one or more structures selected from a hydroxyl group, a cyano group, a carbonyl group, a carboxyl group, ether bond, an ester bond, a sulfonate ester bond, a carbonate bond, a lactone ring, a sultone ring, and a carboxylic anhydride.

Structures in which Z in the general formula (7) is changed may be specifically exemplified as follows.

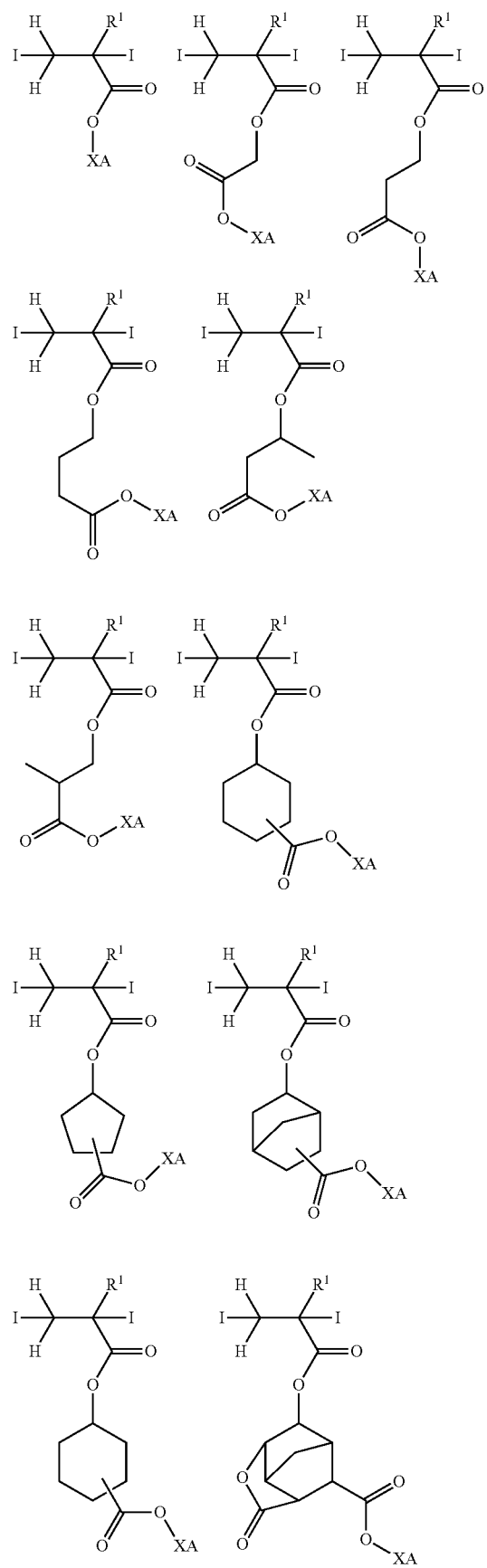

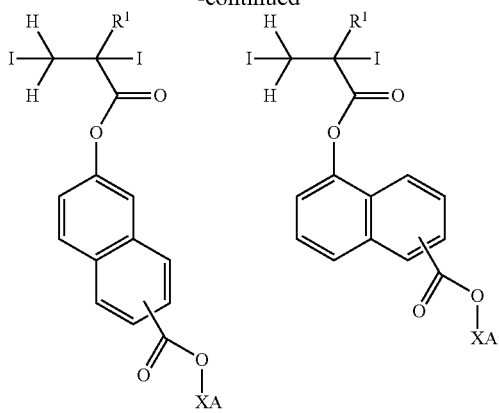
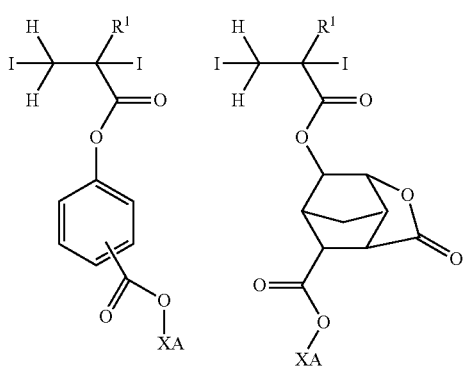
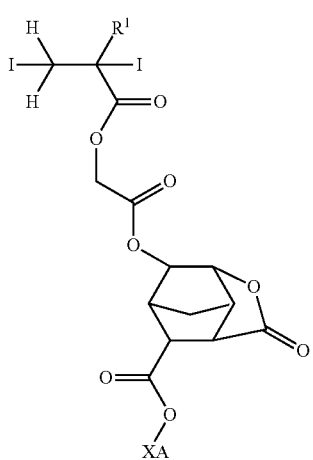
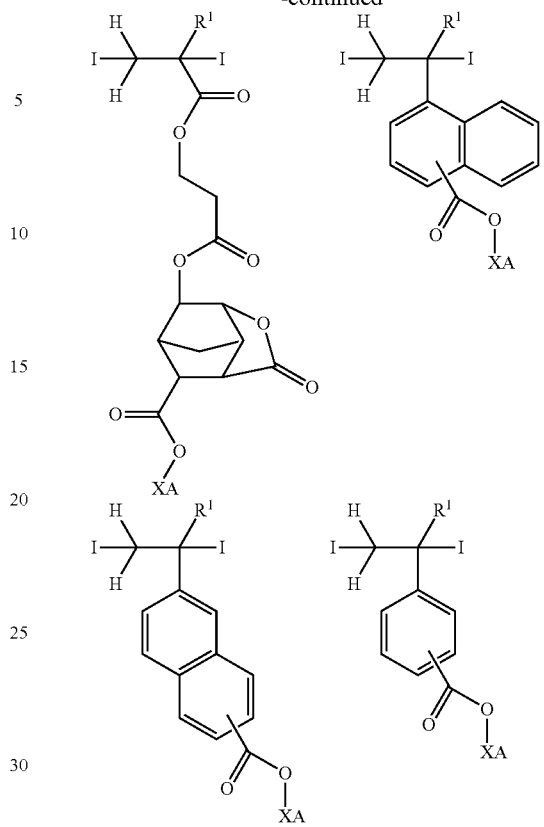

Under the action of acid, a polymer containing repeating units of the general formula (7) is decomposed to produce carboxylic acid, turning to be an alkali soluble polymer. As the acid labile group represented by XA, various groups may be used. Specific examples of the acid labile group include groups represented by the following general formulae (L1) to (L4), a tertiary alkyl group having 4 to 20 carbon atoms, preferably 4 to 15 carbon atoms, a trialkylsilyl group in which each alkyl moiety has 1 to 6 carbon atoms, and an oxoalkyl group having 4 to 20 carbon atoms.

(L1)

(L2)

(L3)

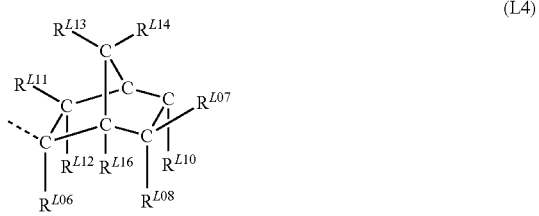
(L4)

In the formula, the broken line represents an atomic bonding (hereinafter as the same).

In the formula (L1), $R^{L01}$ and $R^{L02}$ represent a hydrogen atom or a linear, a branched, a cyclic alkyl group having 1 to 18 carbon atoms, preferably 1 to 10 carbon atoms, and examples thereof include a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. $R^{L03}$ represents a monovalent hydrocarbon group having 1 to 18 carbon atoms, preferably 1 to 10 carbon atoms optionally containing a heteroatom such as an oxygen atom. Examples thereof include a linear, a branched, or a cyclic alkyl group, and substituted forms of the alkyl group in which some hydrogen atoms are substituted by a hydroxyl group, an alkoxy group, an oxo group, an amino group, or an alkylamino group. Specific examples of the linear, branched, or cyclic alkyl group include a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. Specific examples of substituted alkyl group include as follows.

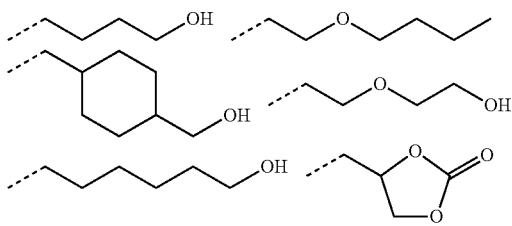

A pair of $R^{L01}$ and $R^{L02}$, $R_{L01}$ and $R^{L03}$, or $R^{L02}$ and $R^{L03}$ may be bonded with each other to form a ring together with the carbon atom and the oxygen atom to which they are attached. When they form a ring, each group forming the ring and $R^{L01}$, $R^{L02}$, and $R^{L03}$ is a linear or a branched alkylene group having 1 to 18 carbon atoms, preferably 1 to 10 carbon atoms.

In the formula (L2), $R^{L04}$ represents a tertiary alkyl group having 4 to 20 carbon atoms, preferably 4 to 15 carbon atoms, a trialkylsilyl group in which each alkyl group has 1 to 6 carbon atoms, an oxoalkyl group having 4 to 20 carbon atoms, or a group represented by the general formula (L1). Specific examples of the tertiary alkyl group include a tert-butyl group, a tert-amyl group, a 1,1-diethylpropyl group, a 2-cyclopentylpropan-2-yl group, a 2-cyclohexylpropan-2-yl group, a 2-(bicyclo[2.2.1]heptan-2-yl)propan-2-yl group, a 2-(adamantan-1-yl)propan-2-yl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, and a 2-ethyl-2-adamantyl group. Specific examples of the trialkylsilyl group include a trimethylsilyl group, a triethylsilyl group, and a dimethyl-tert-butyl silyl group. Specific examples of the oxoalkyl group include a 3-oxocyclohexyl group, a 4-methyl-2-oxooxan-4-yl group, and a 5-methyl-2-oxooxolane-5-yl group. y represents an integer of 0 to 6.

In the formula (L3), $R^{L05}$ represents a linear, a branched, or a cyclic alkyl group having 1 to 8 carbon atoms optionally substituted or an aryl group having 6 to 20 carbon atoms optionally substituted. Specific examples of an alkyl group optionally substituted include a linear, a branched, or a cyclic alkyl group such as a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group, and a group in which some hydrogen atoms of the alkyl group are substituted by a hydroxyl group, an alkoxy group, a carboxy group, an alkoxycarbonyl group, an oxo group, an amino group, an alkylamino group, a cyano group, a mercapto group, an alkylthio group, or a sulfo group. Specific examples of an aryl group optionally substituted include a phenyl group, a methylphenyl group, a naphthyl group, an anthryl group, a phenanthryl group, and a pyrenyl group. m' is 0 or 1, and n' is one of 0, 1, 2, and 3, wherein 2m'+n' is 2 or 3.

In the formula (L4), $R^{L06}$ represents a linear, a branched, or a cyclic alkyl group having 1 to 8 carbon atoms optionally substituted or an aryl group having 6 to 20 carbon atoms optionally substituted, and may be specifically the same as those exemplified for $R^{L05}$. Each of $R^{L07}$ to $R^{L16}$ independently represents a hydrogen atom or a monovalent hydrocarbon group having 1 to 15 carbon atoms, and specific examples thereof include a linear, a branched, or a cyclic alkyl group such as a methyl group, an ethyl group, a propyl group, a isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, and a cyclohexylbutyl group, and a group in which some hydrogen atoms of the alkyl group are substituted by a hydroxyl group, an alkoxy group, a carboxy group, an alkoxycarbonyl group, an oxo group, an amino group, an alkylamino group, a cyano group, a mercapto group, a alkylthio group, or a sulfo group. Two of $R^{L07}$ to $R^{L16}$ may be bonded with each other to form a ring together with the carbon atom to which they are attached (e.g., $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, and $R^{L13}$ and $R^{L14}$). In this case, those involved in the bond represents divalent hydrocarbon groups having 1 to 15 carbon atoms, specifically groups obtained by eliminating one hydrogen atom from those exemplified for the monovalent hydrocarbon groups. Further, $R^{L07}$ to $R^{L16}$ may form a double bond by a direct bond between groups connected to adjacent carbons (e.g., $R^{L07}$ and $R^{L09}$, $R^{L09}$ and $R^{L15}$, $R^{L13}$ and $R^{L15}$, and $R^{L14}$ and $R^{L15}$).

Of the acid labile group represented by the formula (L1), a linear or a branched group is specifically as follows.

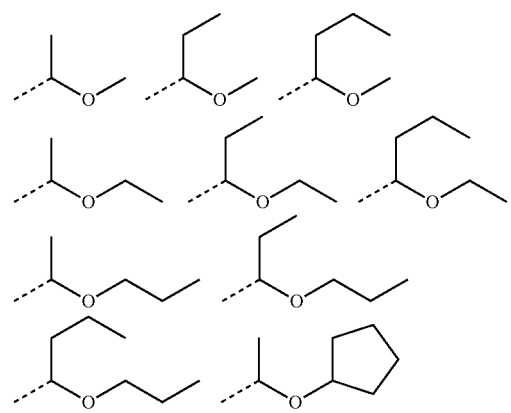

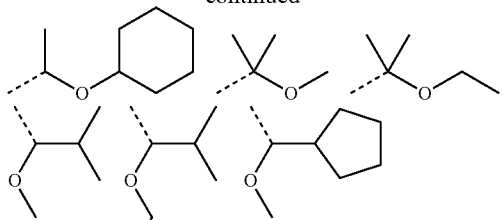
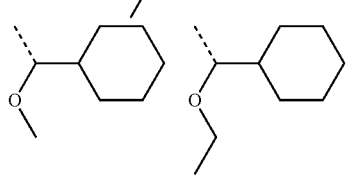
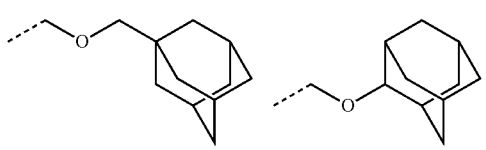
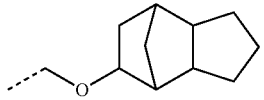
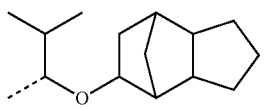

Of the acid labile group represented by the formula (L1), a cyclic group may include a tetrahydrofuran-2-yl group, a 2-methyltetrahydrofuran-2-yl group, a tetrahydropyran-2-yl group, and a 2-methyltetrahydropyran-2-yl group.

Specific examples of the acid labile group of the formula (L2) include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Specific examples of the acid labile group of the formula (L3) include a 1-methylcyclopentyl group, a 1-ethylcyclopentyl group, a 1-n-propylcyclopentyl group, a 1-isopropylcyclopentyl group, a 1-n-butylcyclopentyl group, a 1-sec-butylcyclopentyl group, a 1-cyclohexylcyclopentyl group, a 1-(4-methoxy-n-butyl)cyclopentyl group, a 1-methylcyclohexyl group, a 1-ethylcyclohexyl group, a 3-methyl-1-cyclopenten-3-yl group, a 3-ethyl-1-cyclopenten-3-yl group, a 3-methyl-1-cyclohexen-3-yl group, and a 3-ethyl-1-cyclohexen-3-yl group.

The acid labile group of the formula (L4) is particularly preferably groups represented by the following formulae (L4-1) to (L4-4):

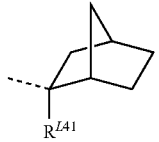
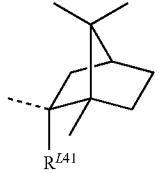
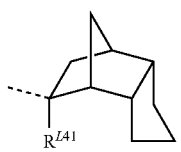
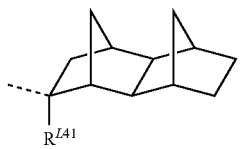

In the formulae (L4-1) to (L4-4), the broken line represents a bonding site and direction, and $R^{L41}$ independently represents a monovalent hydrocarbon group such as a linear, a branched, or a cyclic alkyl group having 1 to 10 carbon atoms. Examples thereof include a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group.

In the formulae (L4-1) to (L4-4), an enantiomer or a diastereomer may exist, but each of formulae (L4-1) to (L4-4) represents all the stereoisomers thereof. The stereoisomers may be used alone or as a mixture.

For example, the formula (L4-3) represents one or two mixtures selected from the groups represented by the following general formulae (L4-3-1) and (L4-3-2):

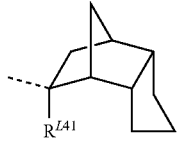
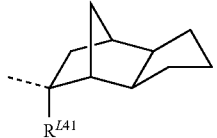

Further, the formula (L4-4) represents one or more mixtures selected from the groups represented by the following general formulae (L4-4-1) to (L4-4-4):

(L4-4-1)
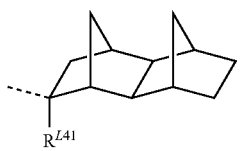

(L4-4-2)
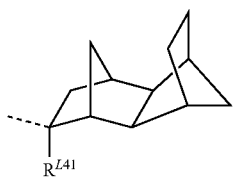

(L4-4-3)
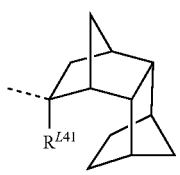

(L4-4-4)
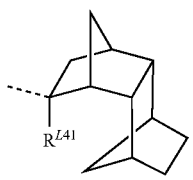

The formulae (L4-1) to (L4-4), (L4-3-1), (L4-3-2), and (L4-4-1) to (L4-4-4) represent enantiomers thereof and enantiomeric mixtures.

It is noted that in the formulae (L4-1) to (L4-4), (L4-3-1), (L4-3-2), and (L4-4-1) to (L4-4-4), the bond direction is on the exo side relative to the bicyclo[2.2.1]heptane ring, which ensures high reactivity for acid catalyzed elimination reaction (see Japanese Patent Laid-Open Publication No. 2000-336121). In preparation of these monomers having a tertiary exo-alkyl group of bicyclo[2.2.1]heptane skeleton as a substituent, monomers substituted with an endo-alkyl group represented by the following formulas (L4-1-endo) to (L4-4-endo) may exist. For good reactivity, an exo proportion is preferably 50% by mole or more, more preferably 80% by mole or more.

(L4-1-endo)
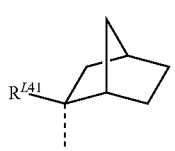

(L4-2-endo)
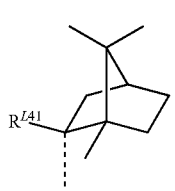

(L4-3-endo)
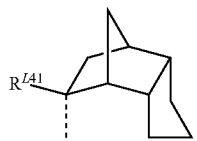

(L4-4-endo)
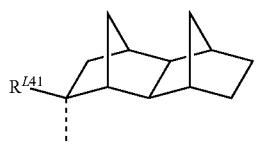

Specific examples of the acid labile group of the formula (L4) include the following groups.

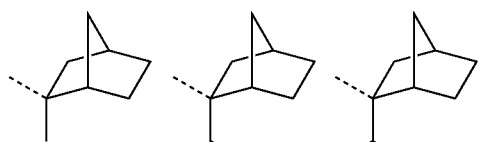

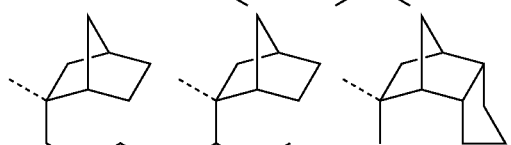

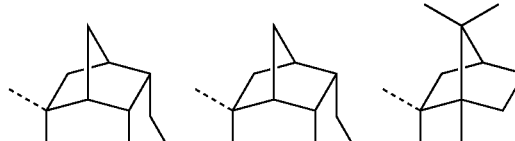

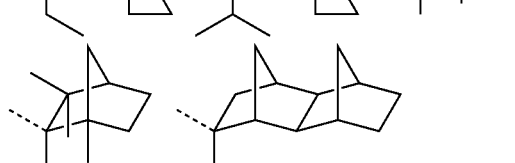

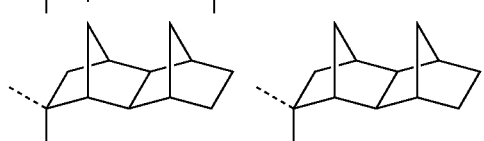

A tertiary alkyl group having 4 to 20 carbon atoms, a trialkylsilyl group in which each alkyl group has 1 to 6 carbon atoms, and an oxoalkyl group having 4 to 20 carbon atoms may be specifically the same groups as those exemplified for $R^{L104}$.

The repeating unit represented by the general formula (7) may be specifically, but not limited to, as follows.

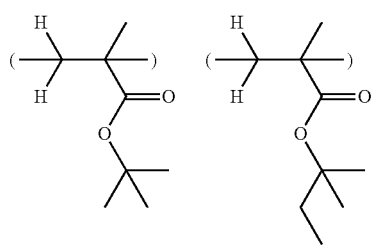

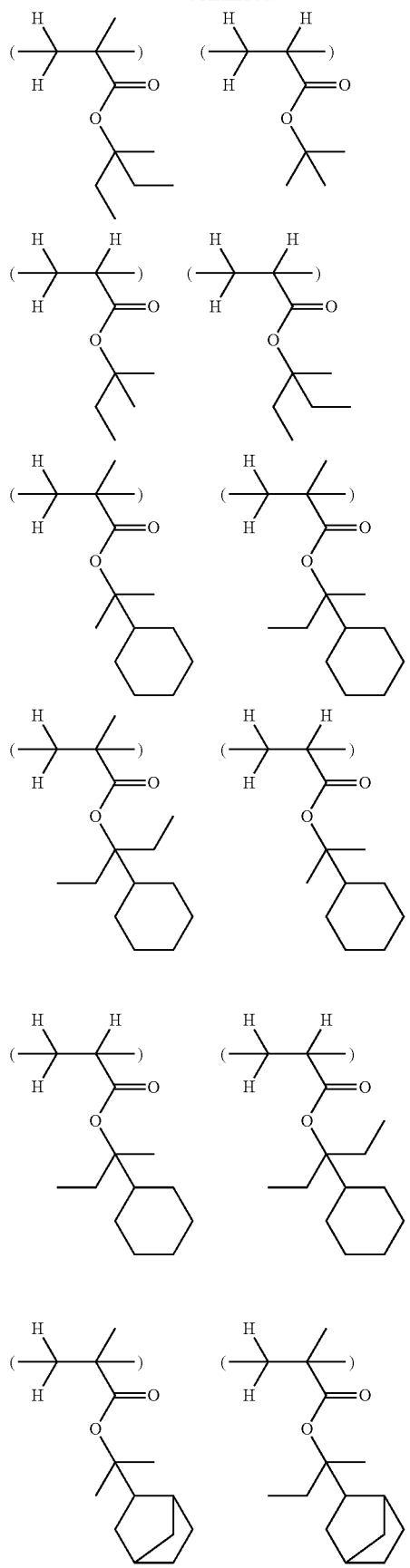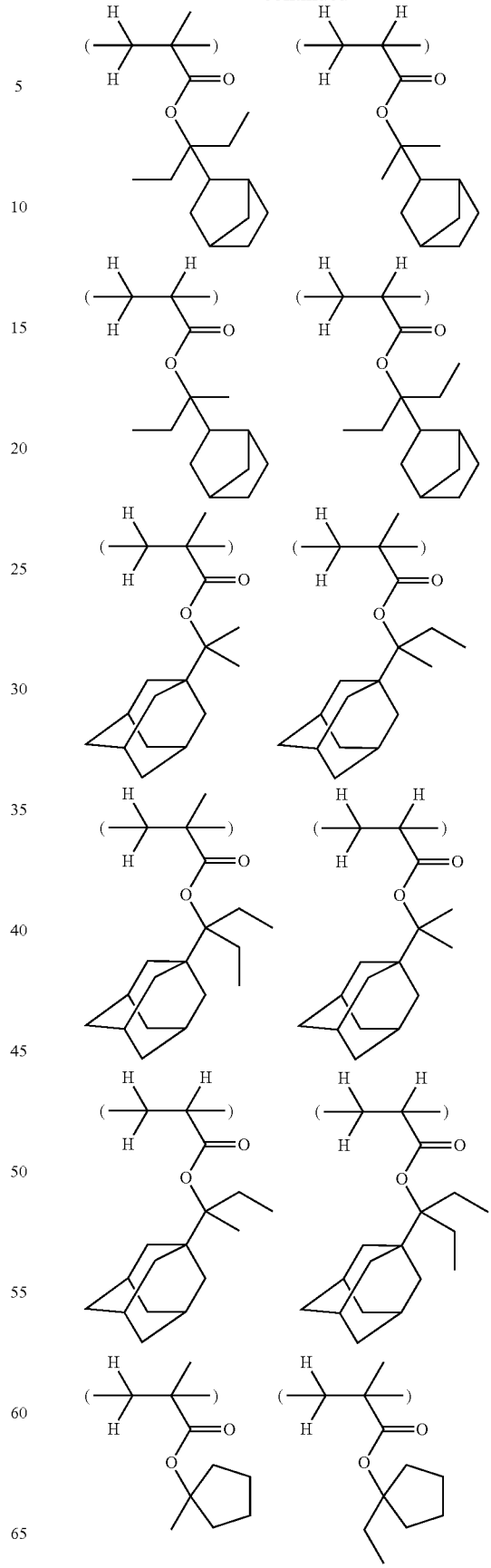

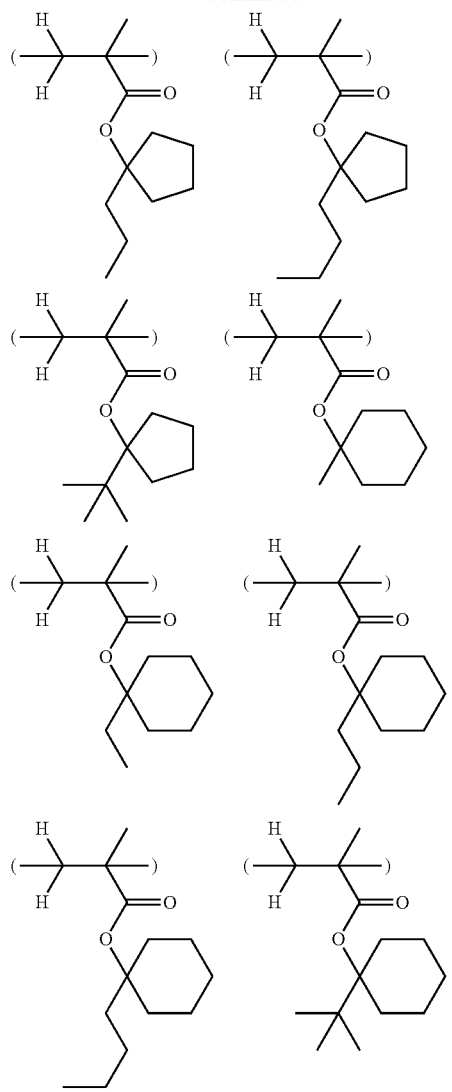
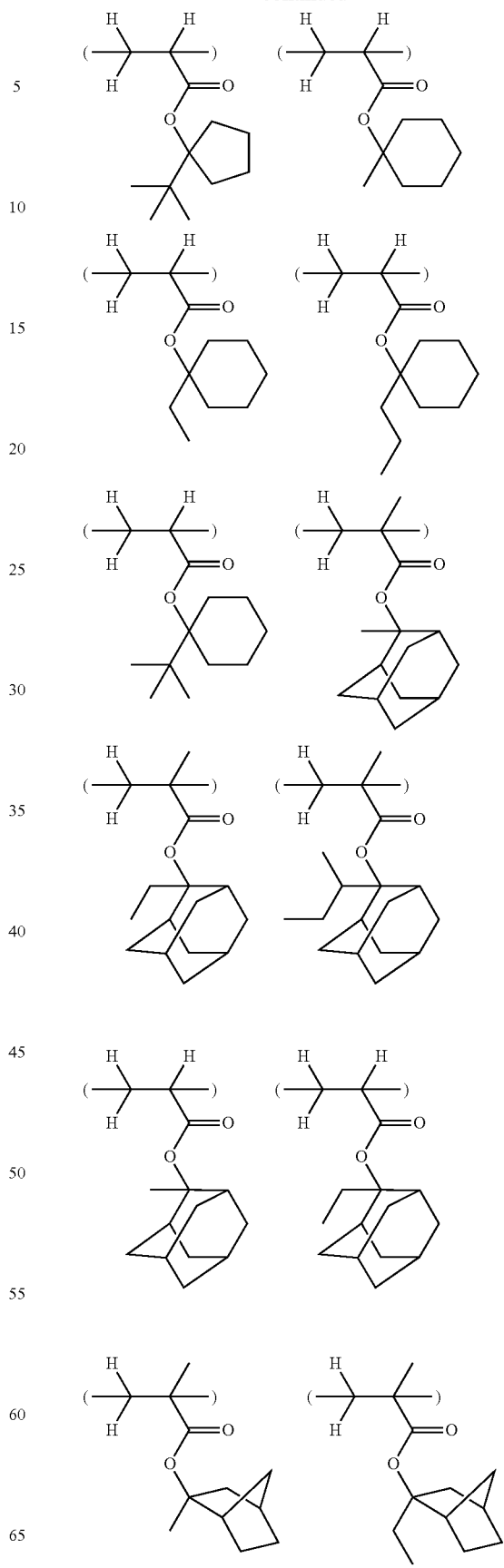

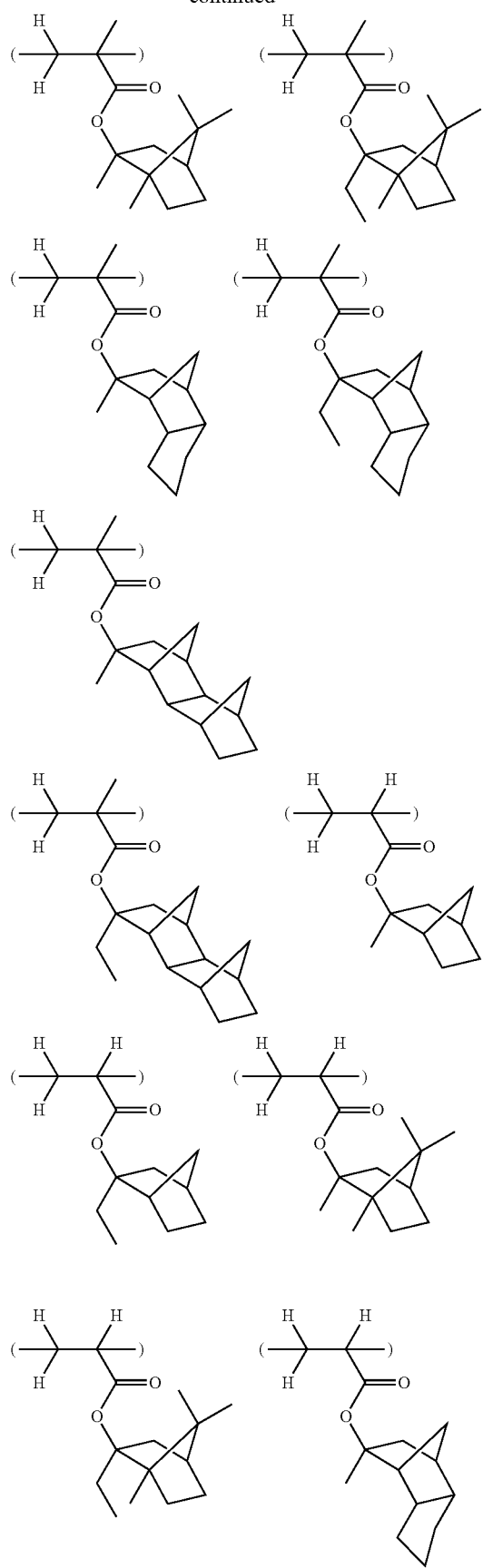
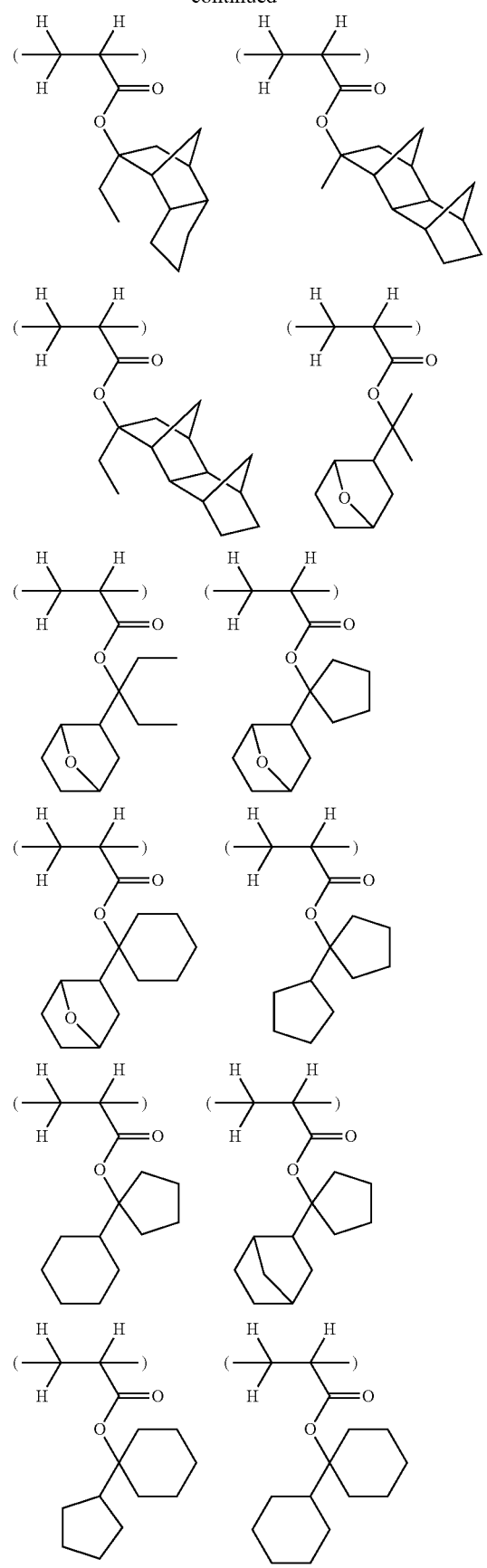

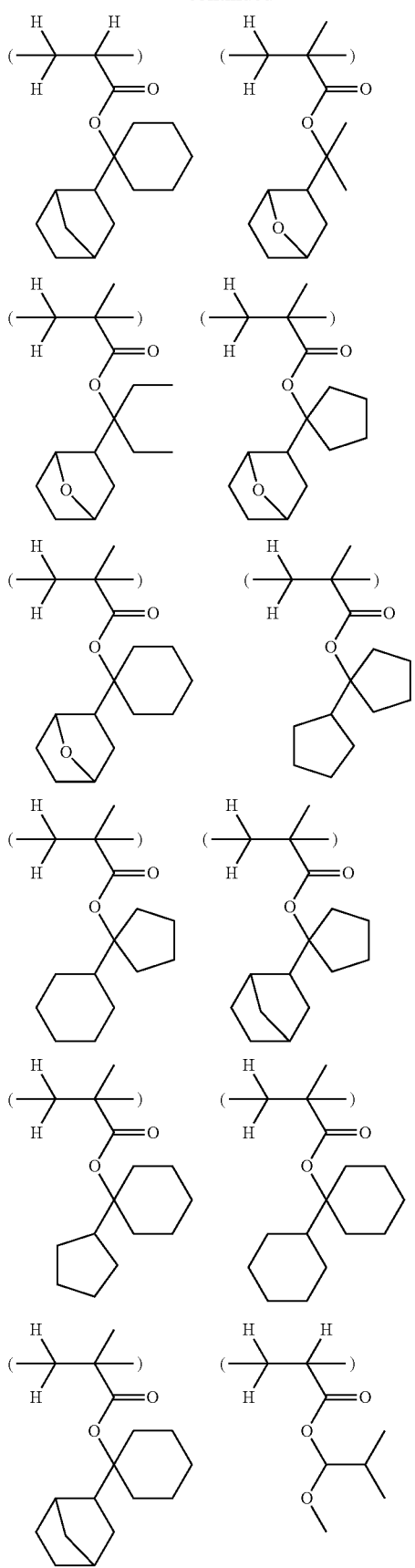
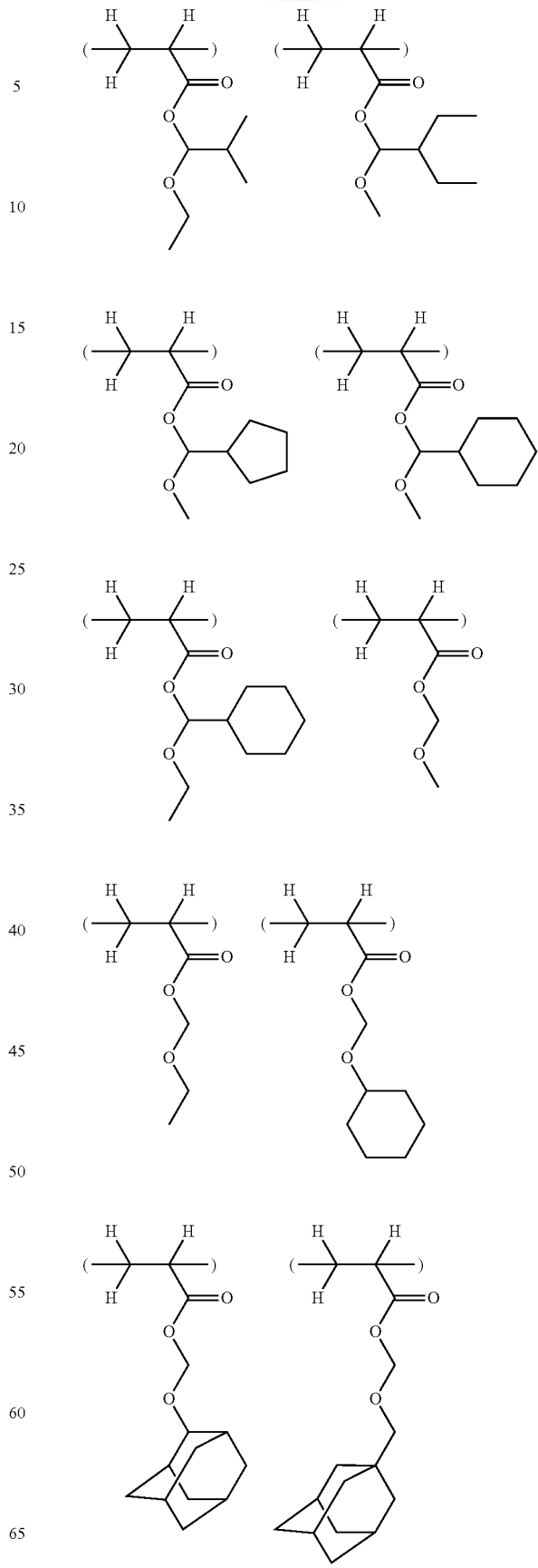

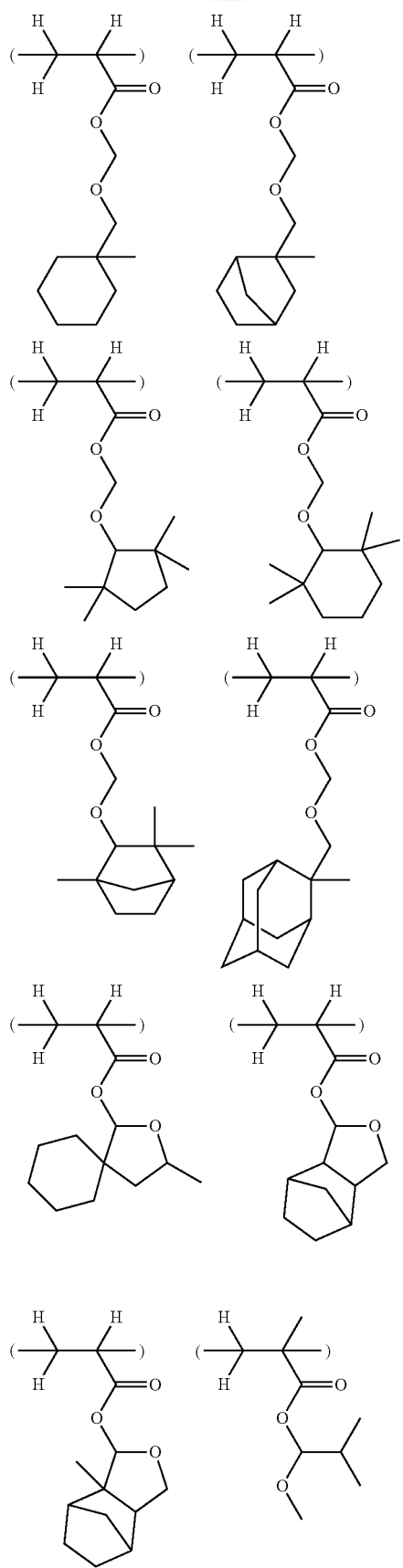
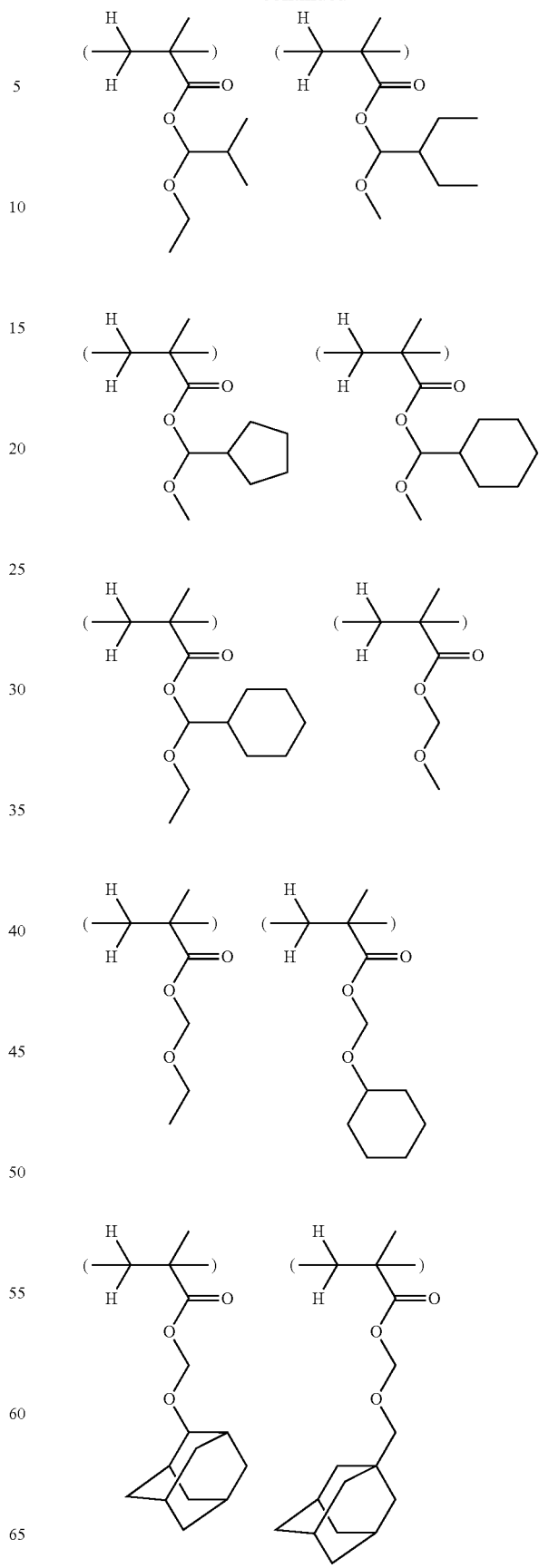

-continued

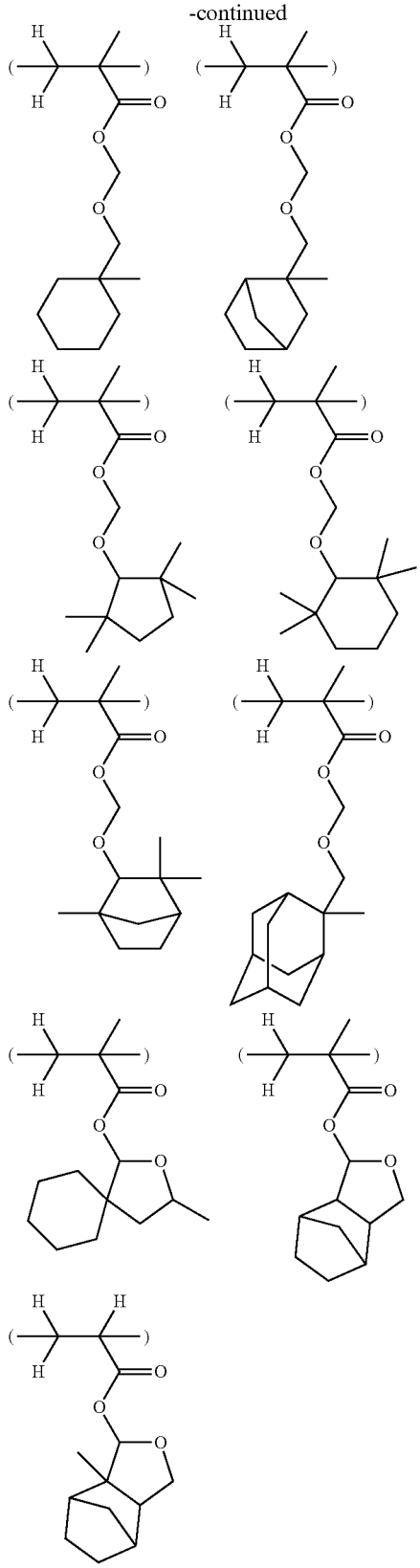

In the specific examples, Z represents a single bond. However, even when Z is not a single bond, the same acid labile group may be combined. Specific examples when Z is not a single bond may be as described above.

In the general formula (8), YL represents a polar group having one or more structures selected from a hydroxyl group, a cyano group, a carbonyl group, an ether bond, an ester bond, a sulfonate ester bond, a carbonate bond, a lactone ring, a sultone ring, and a carboxylic anhydride. Specific examples thereof may be, but not limited to, as follows.

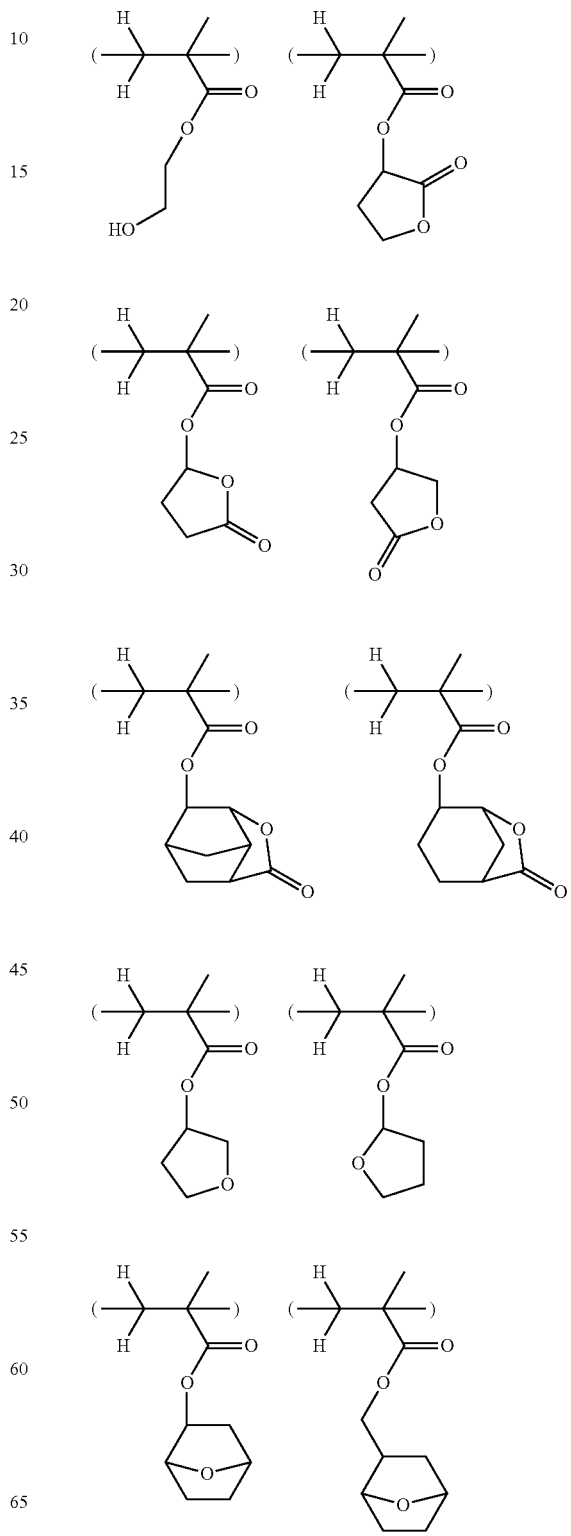

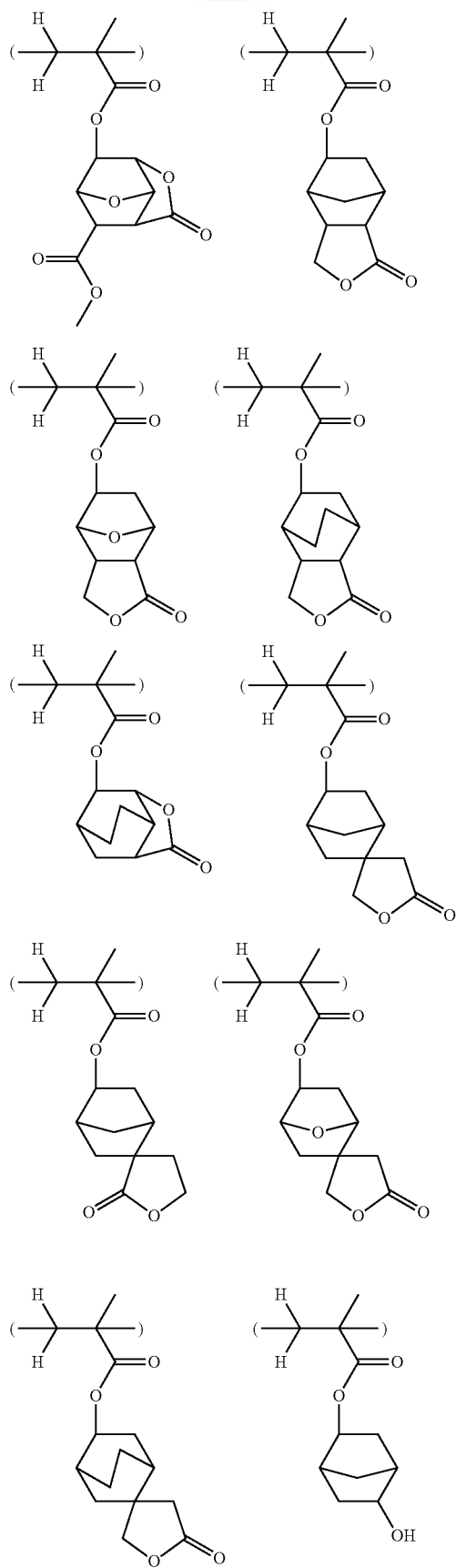
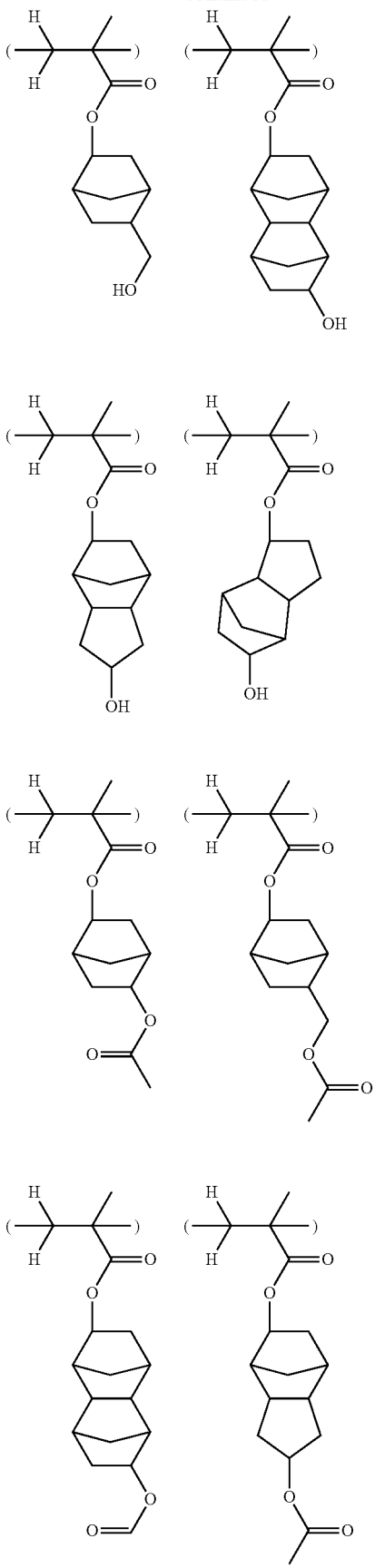

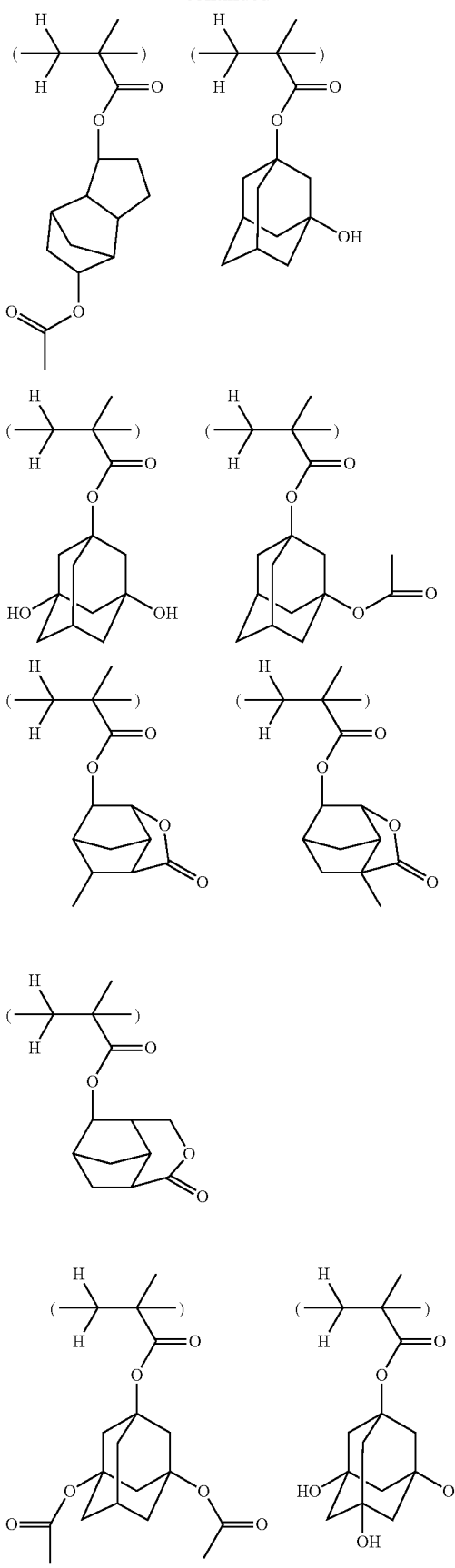
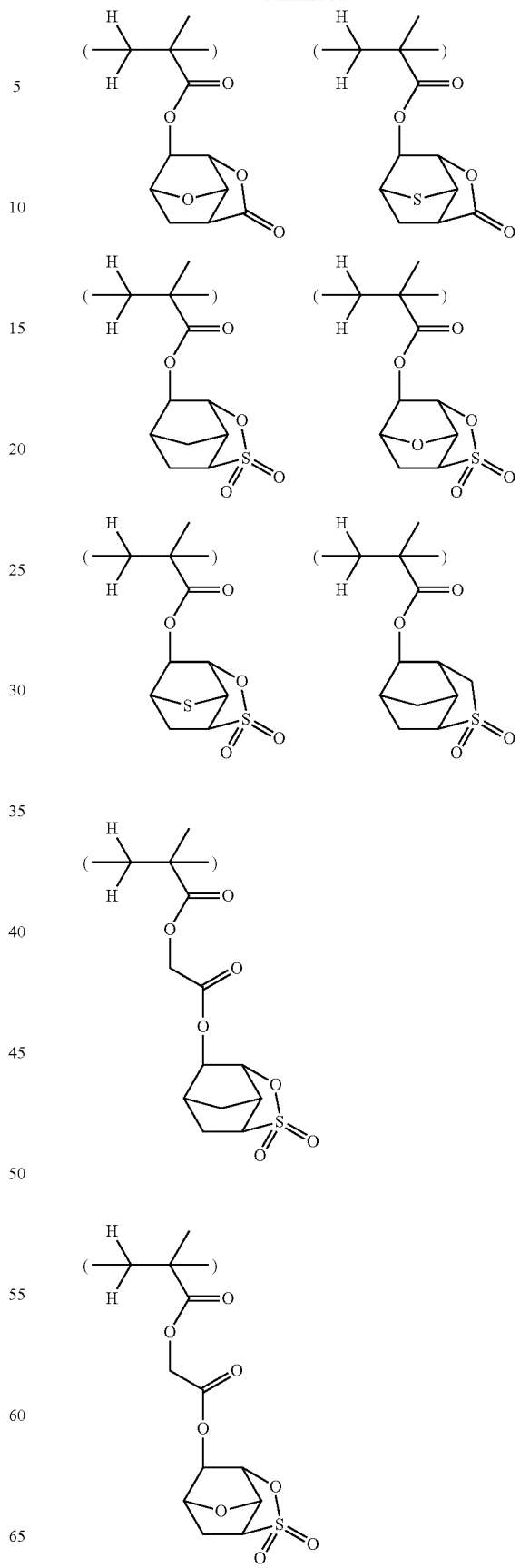

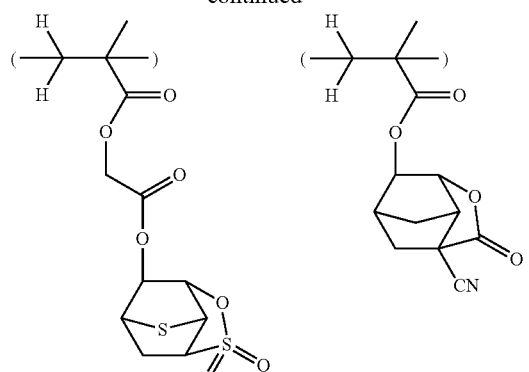
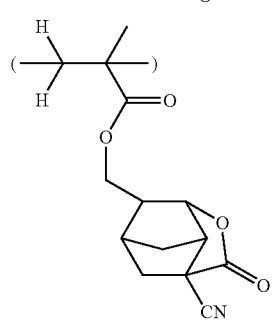
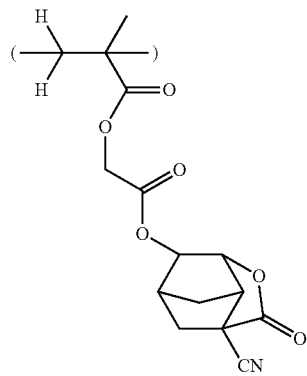
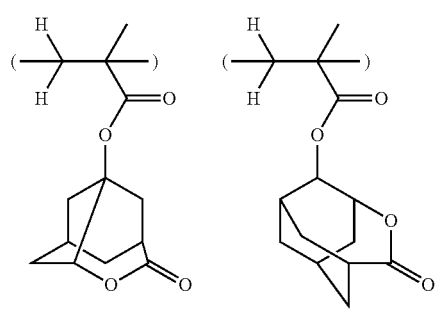
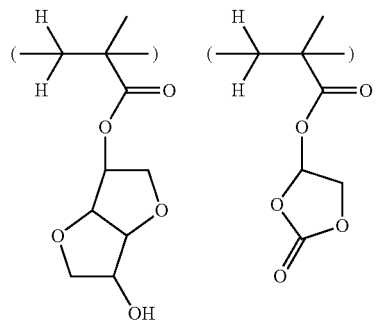
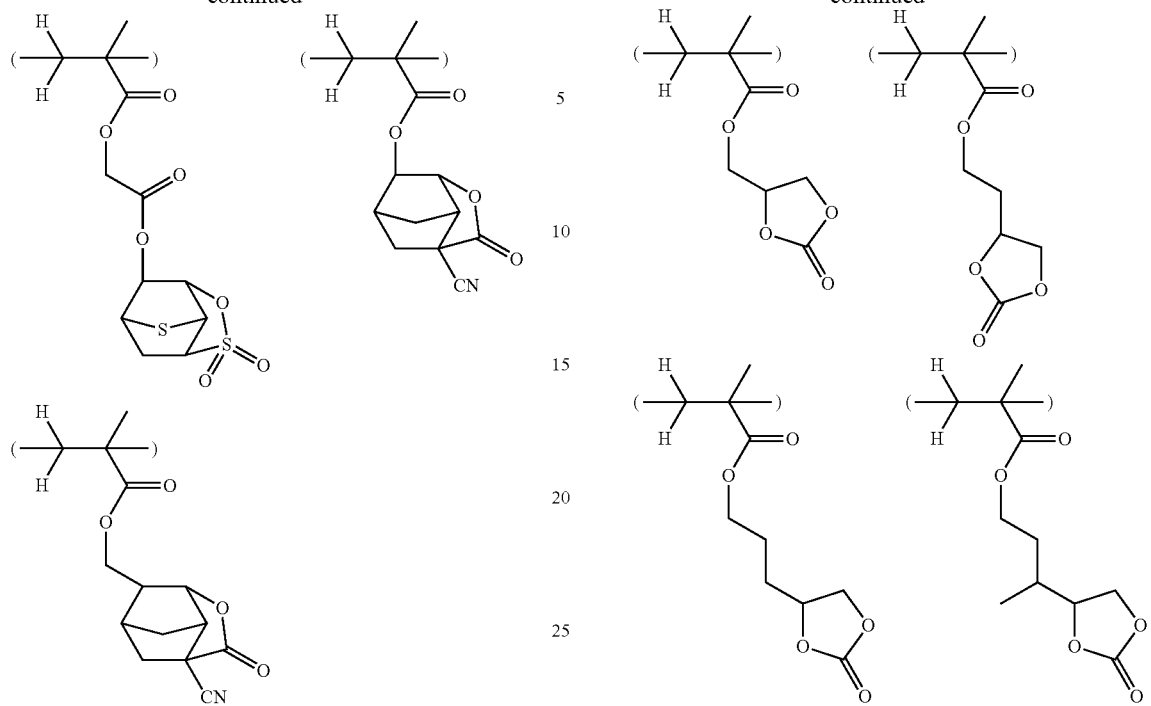
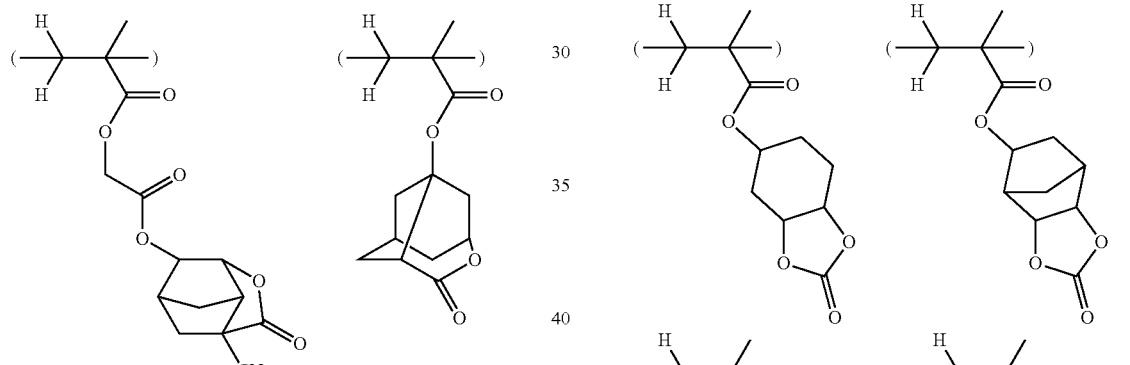
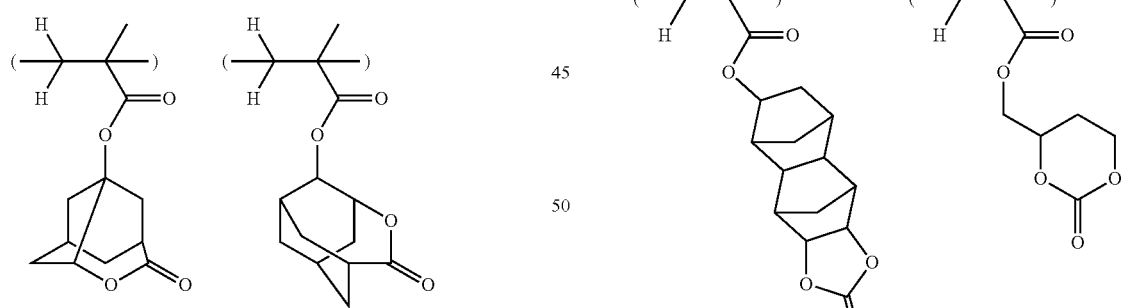
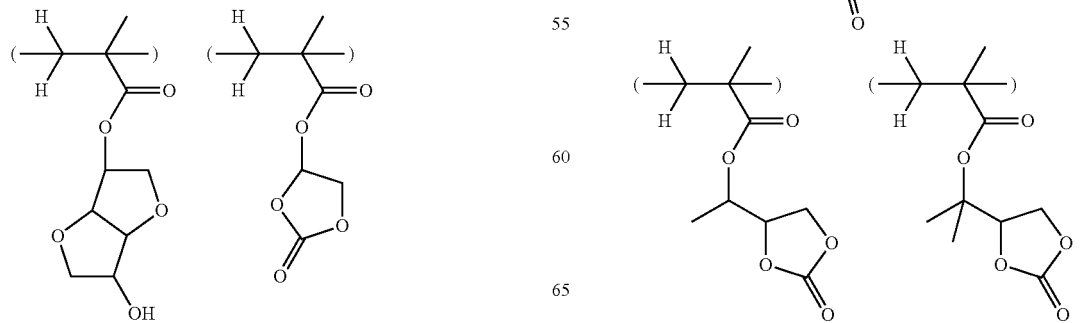

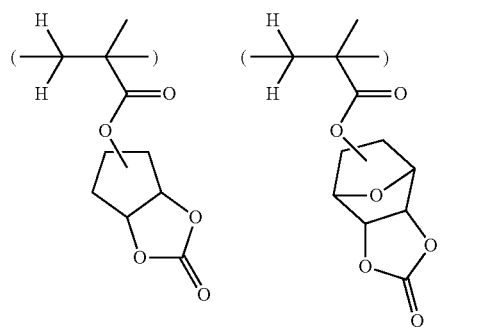
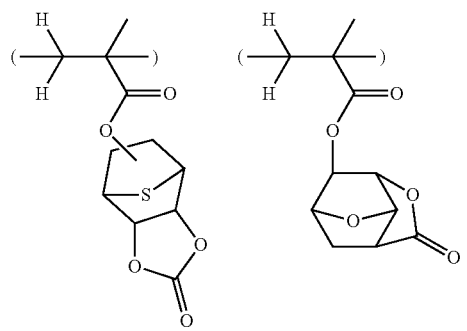
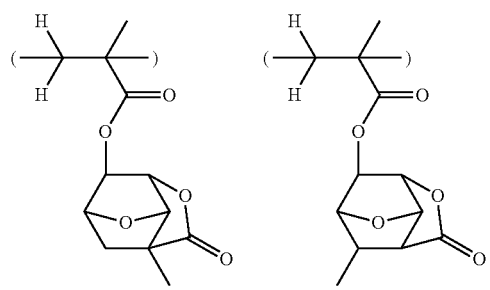
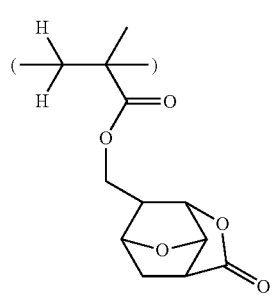
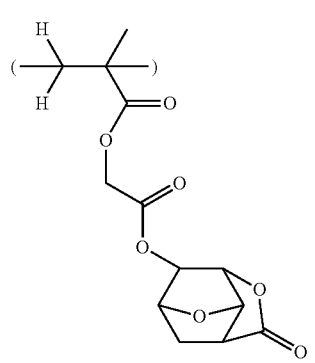
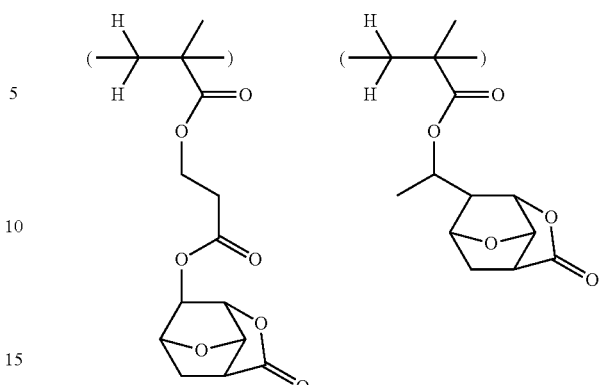
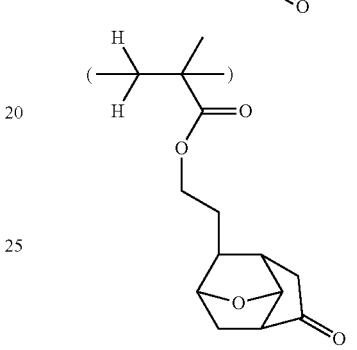
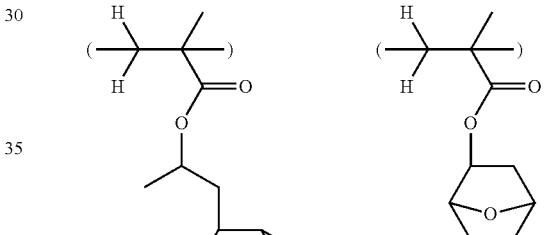
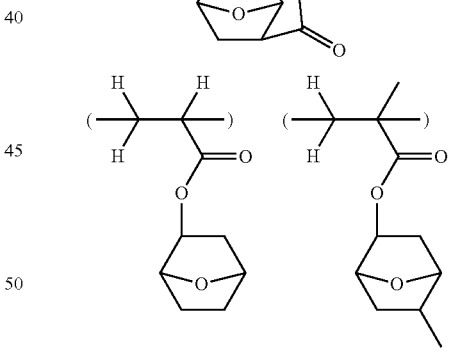
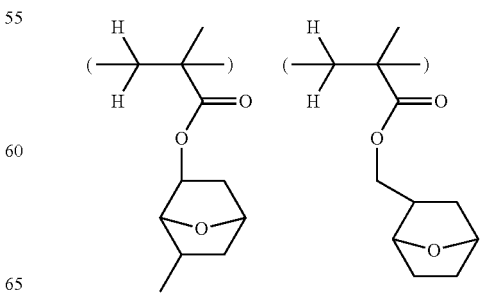

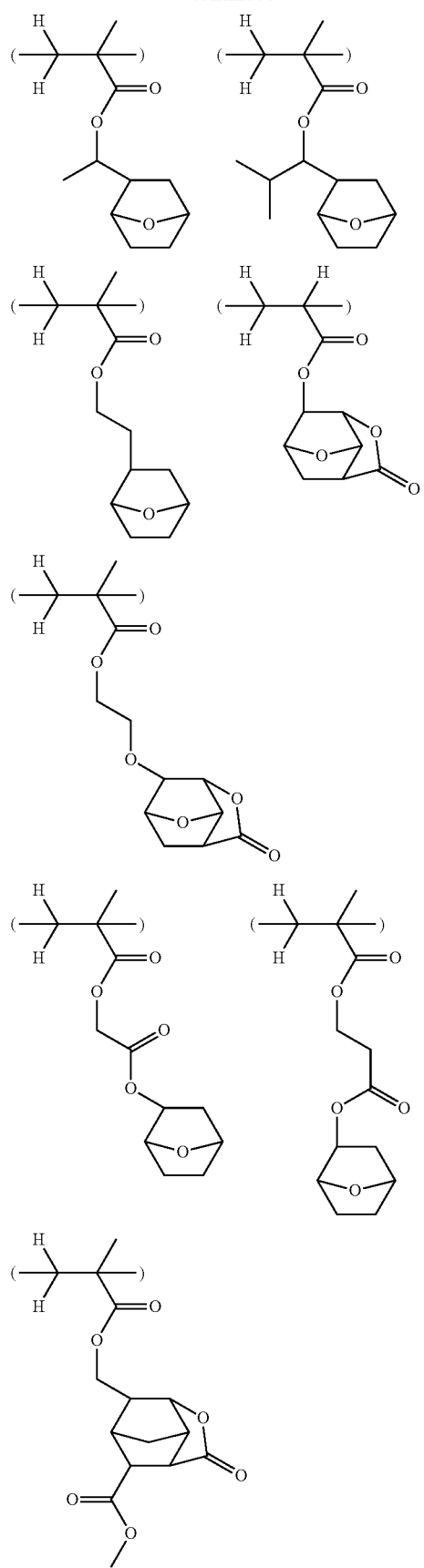
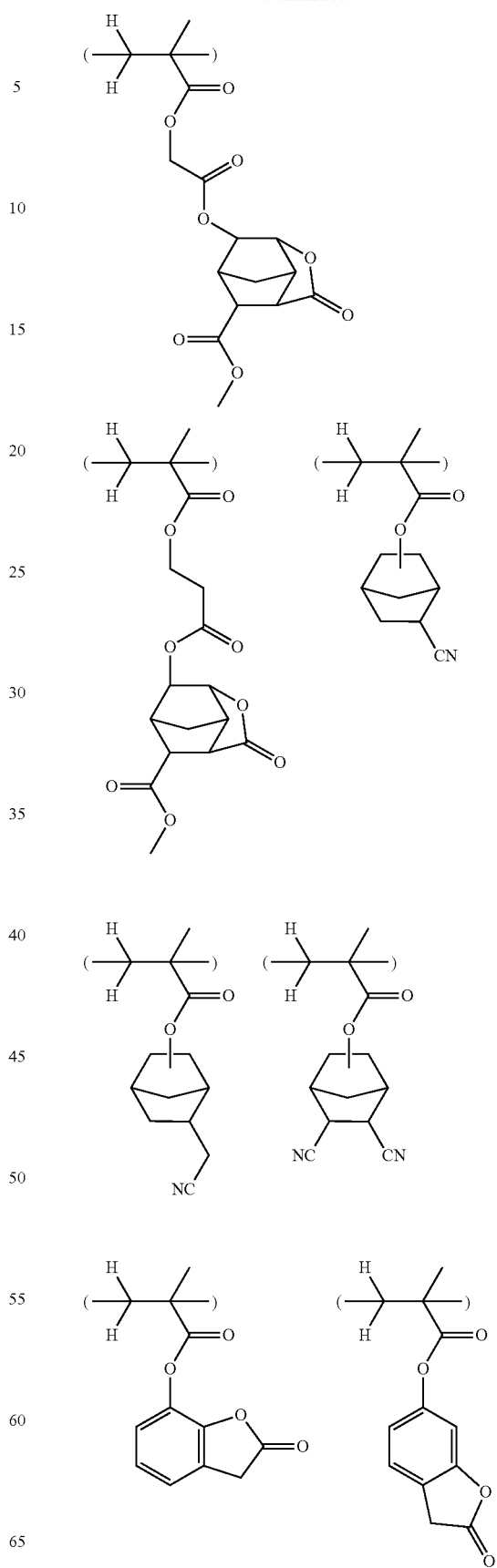

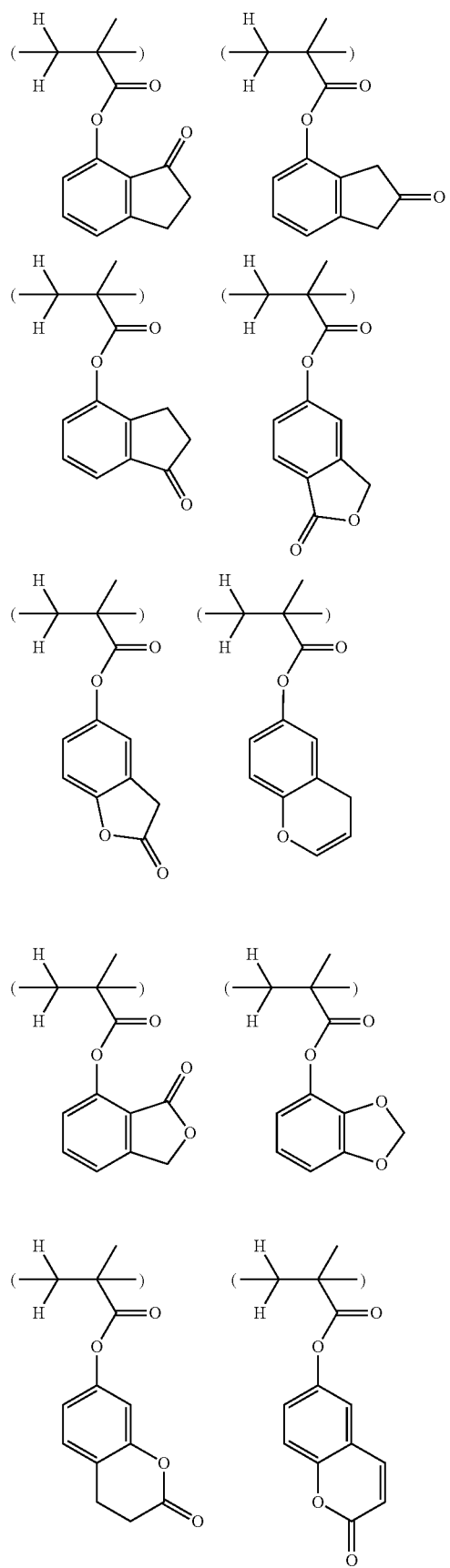
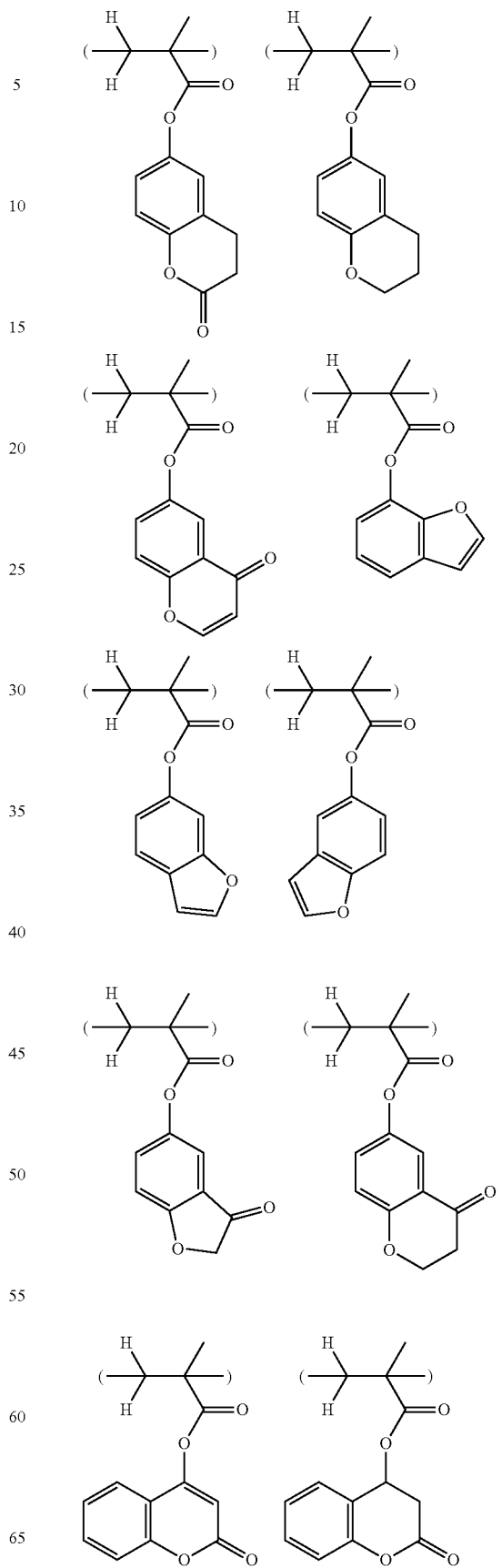

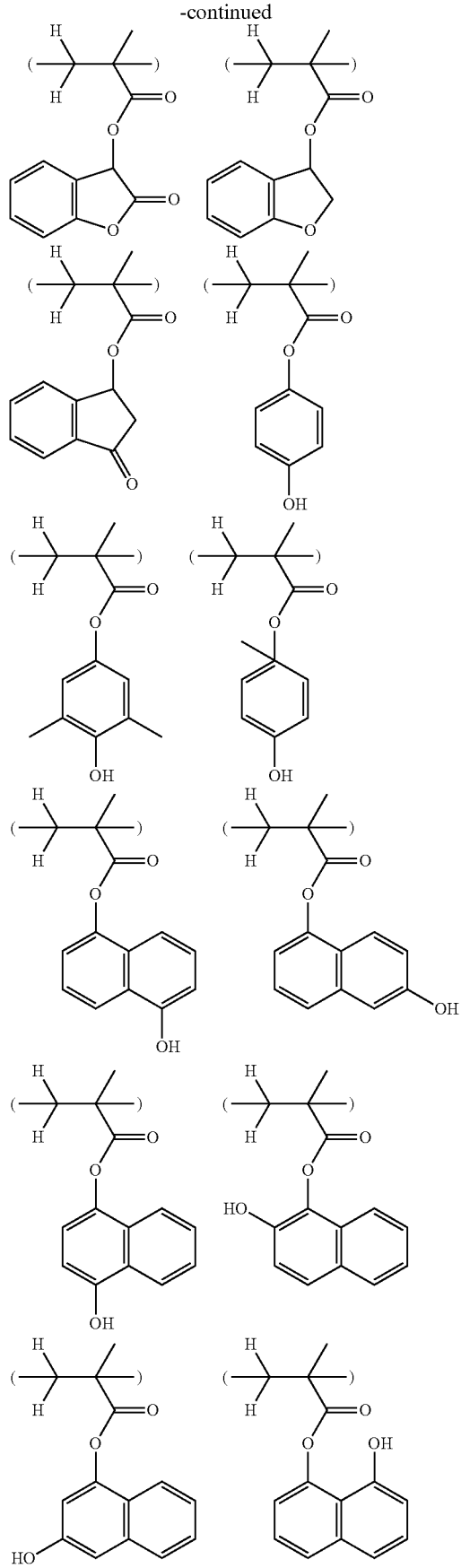
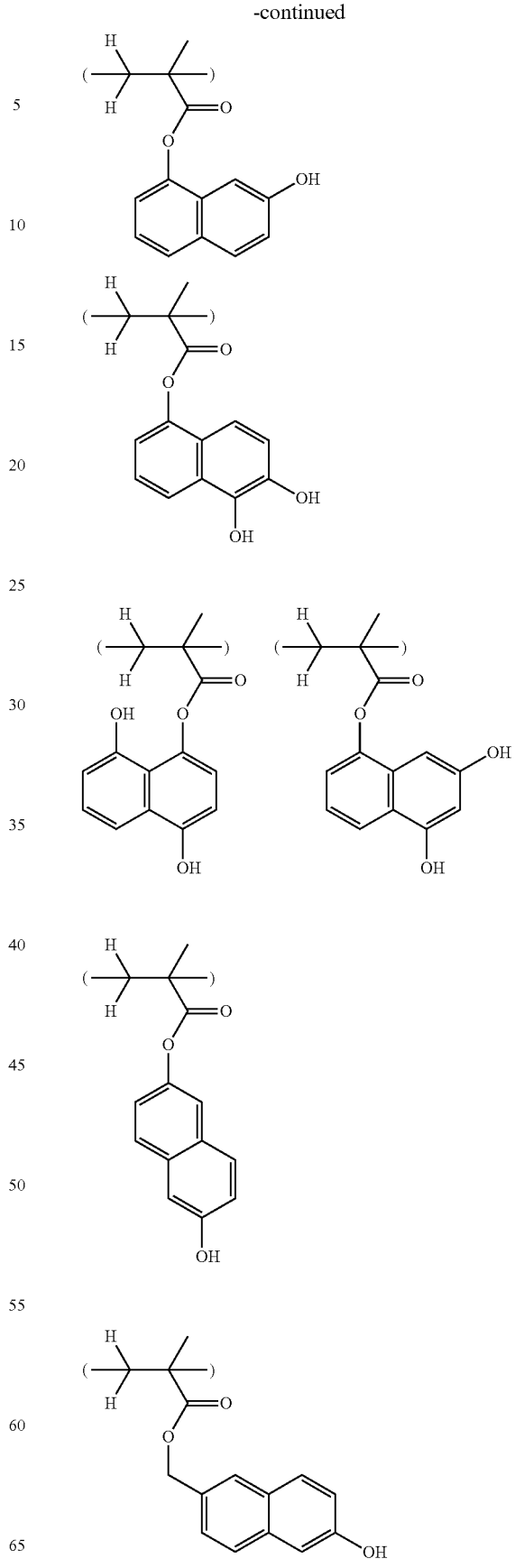

-continued
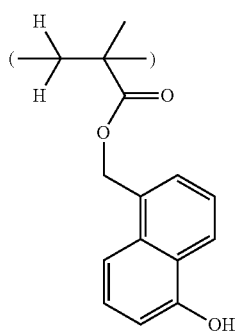
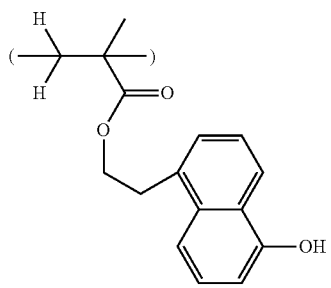
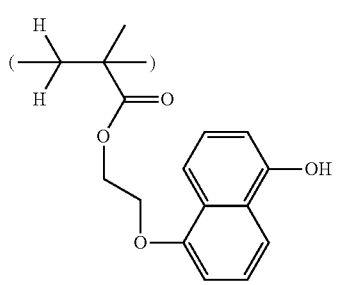
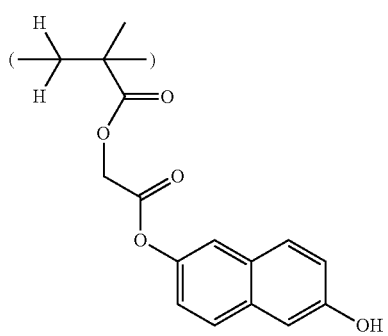
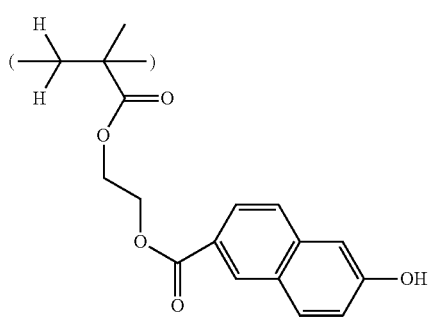
-continued
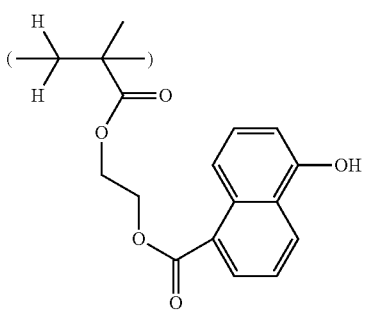
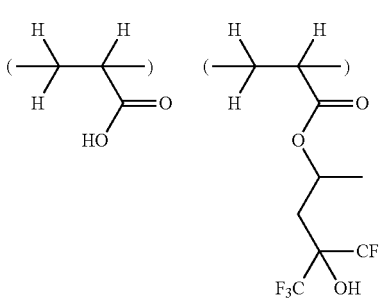
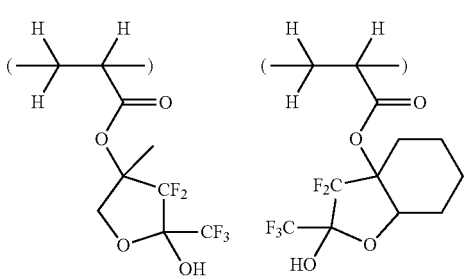
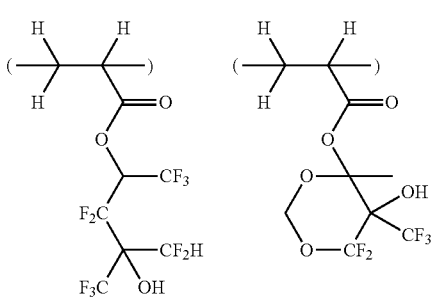
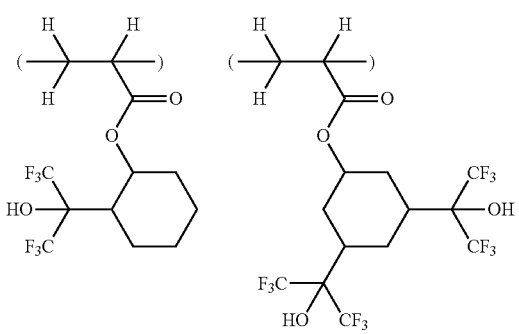

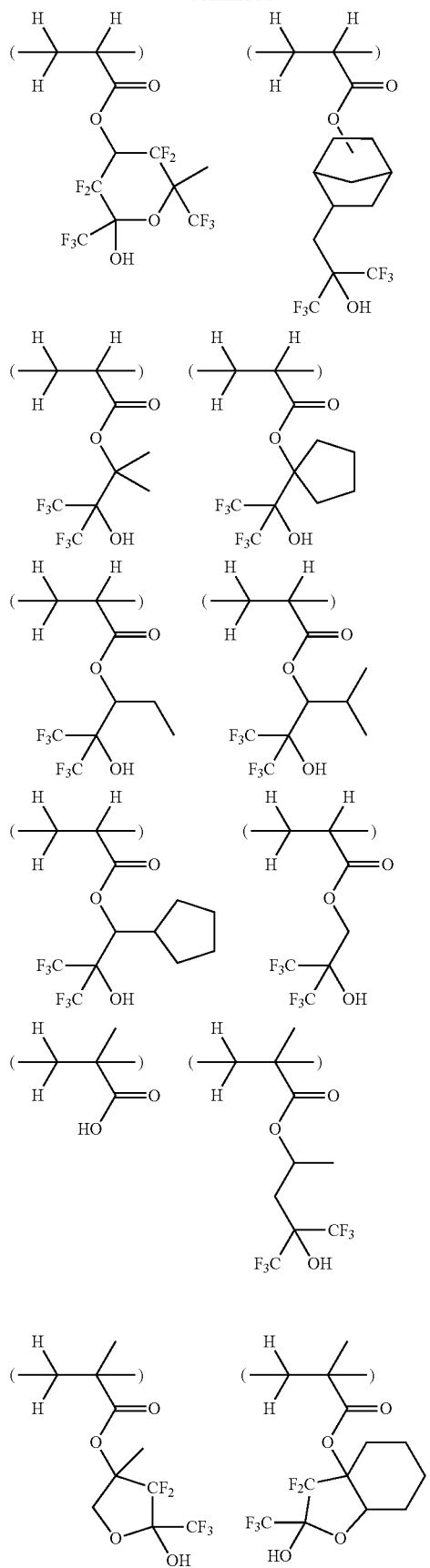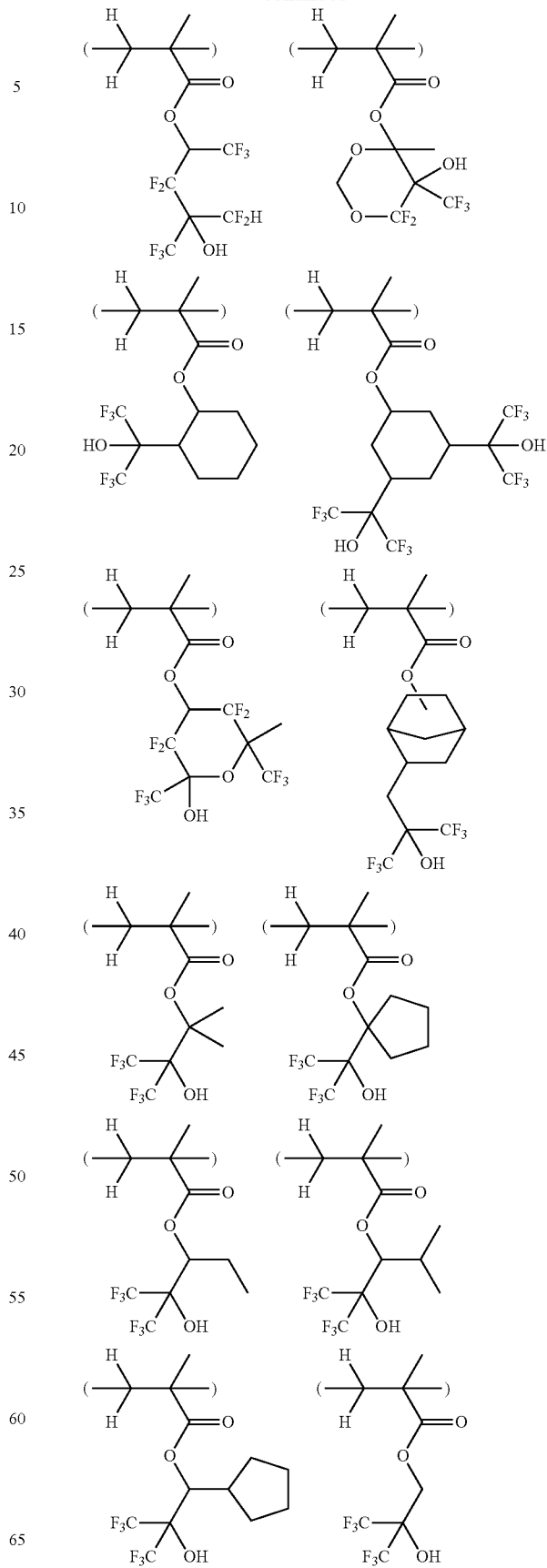

-continued
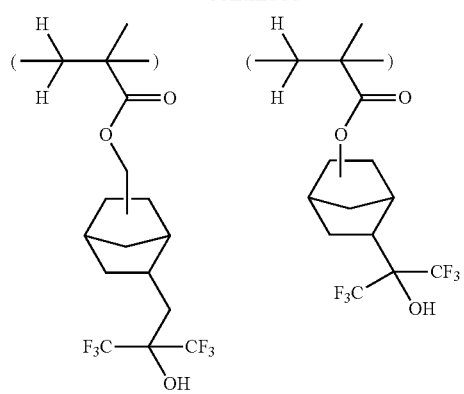
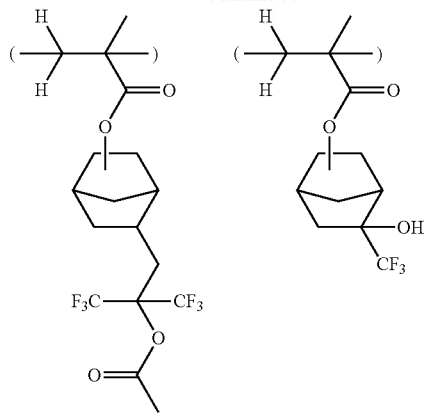
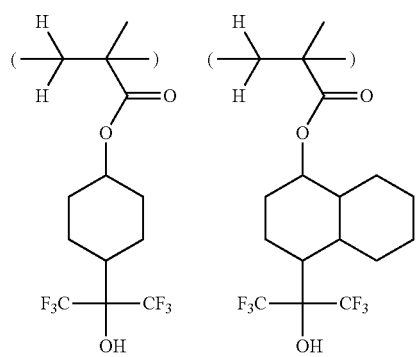
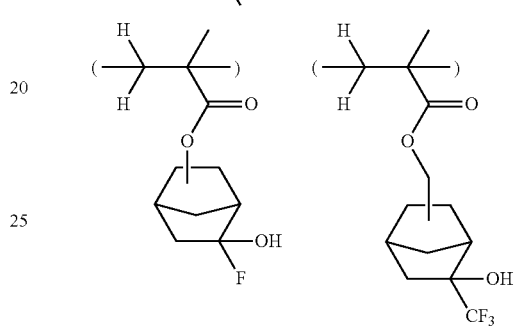
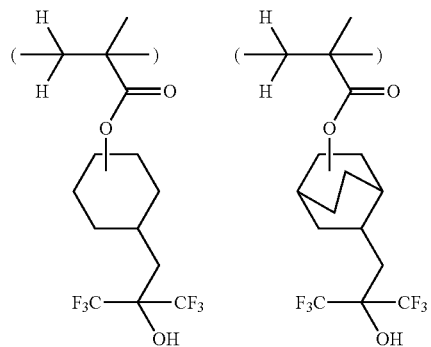
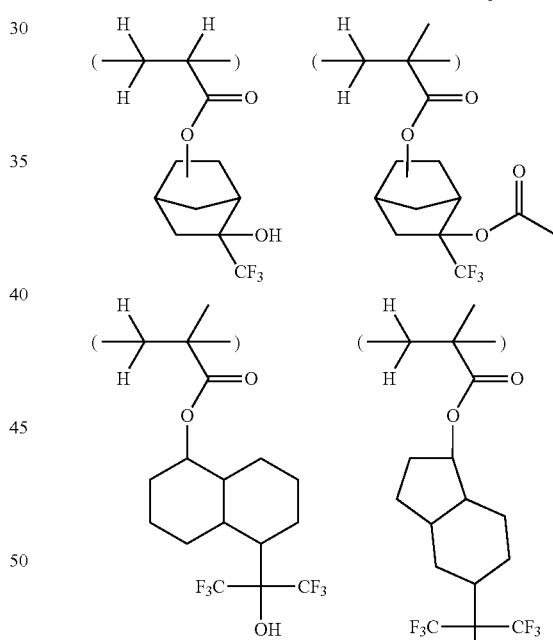
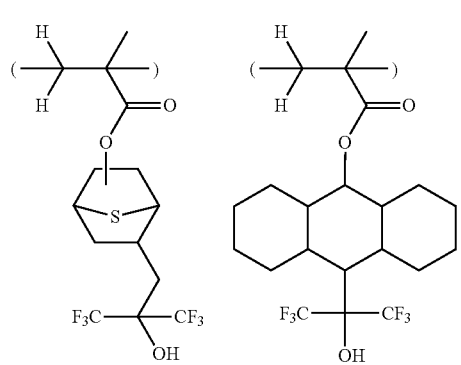
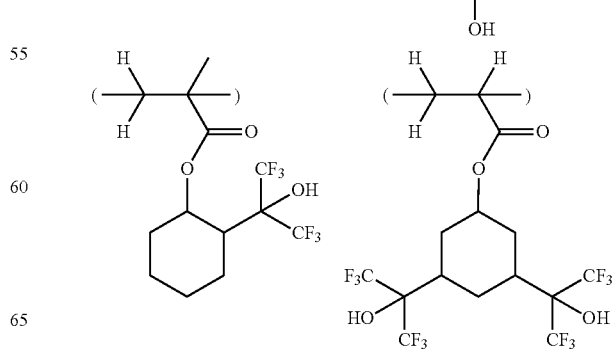

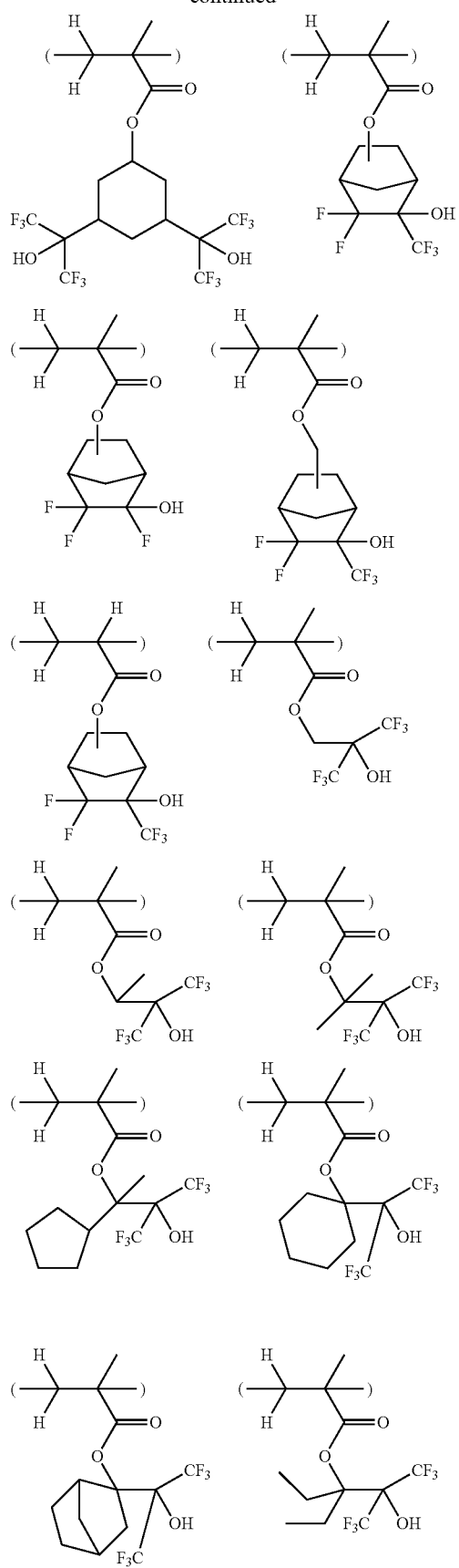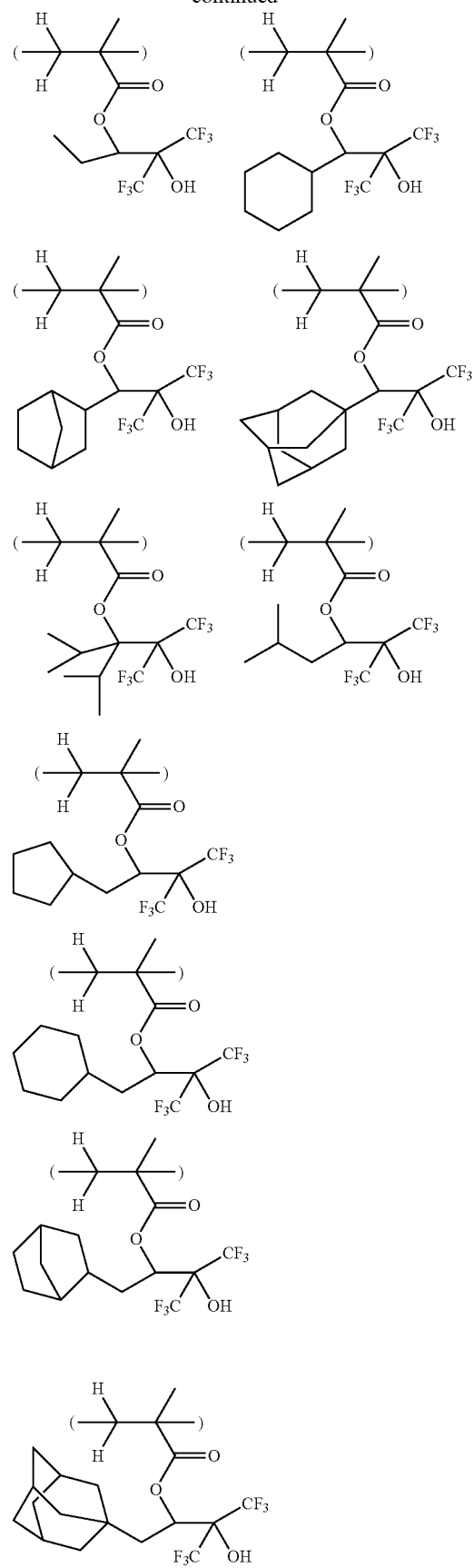

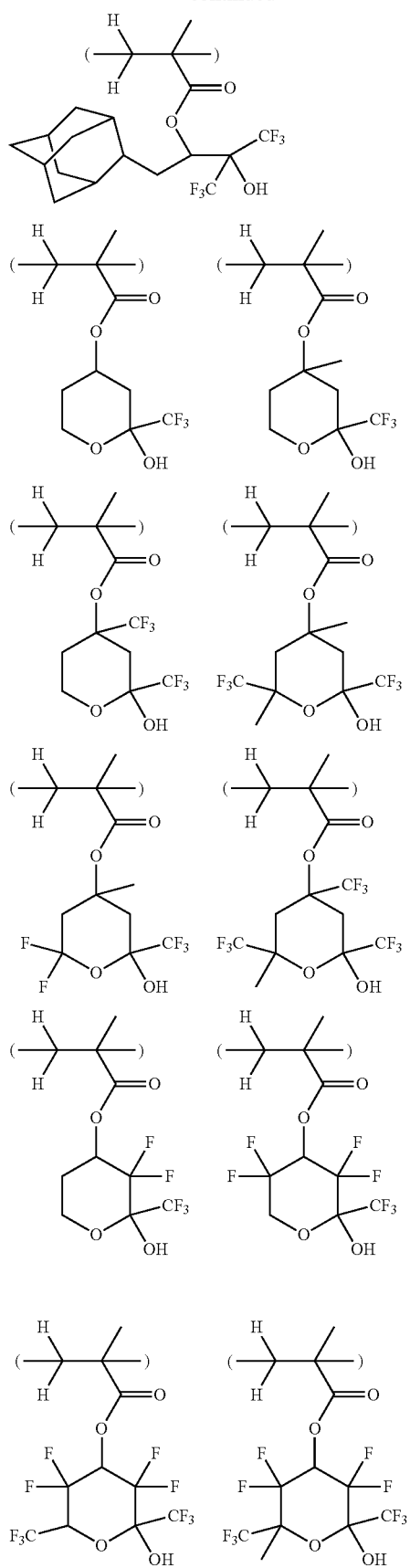
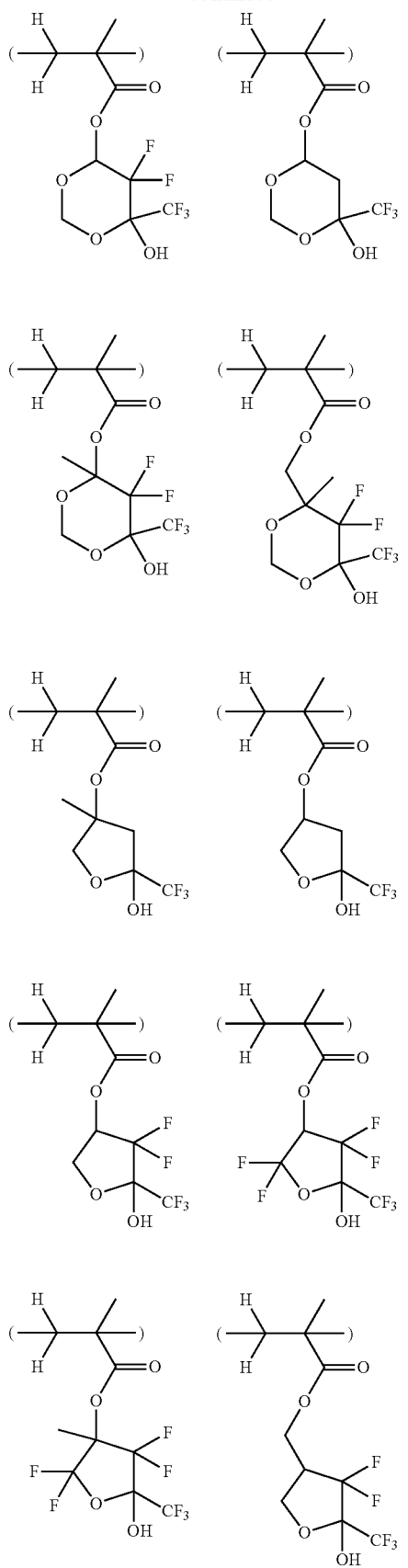

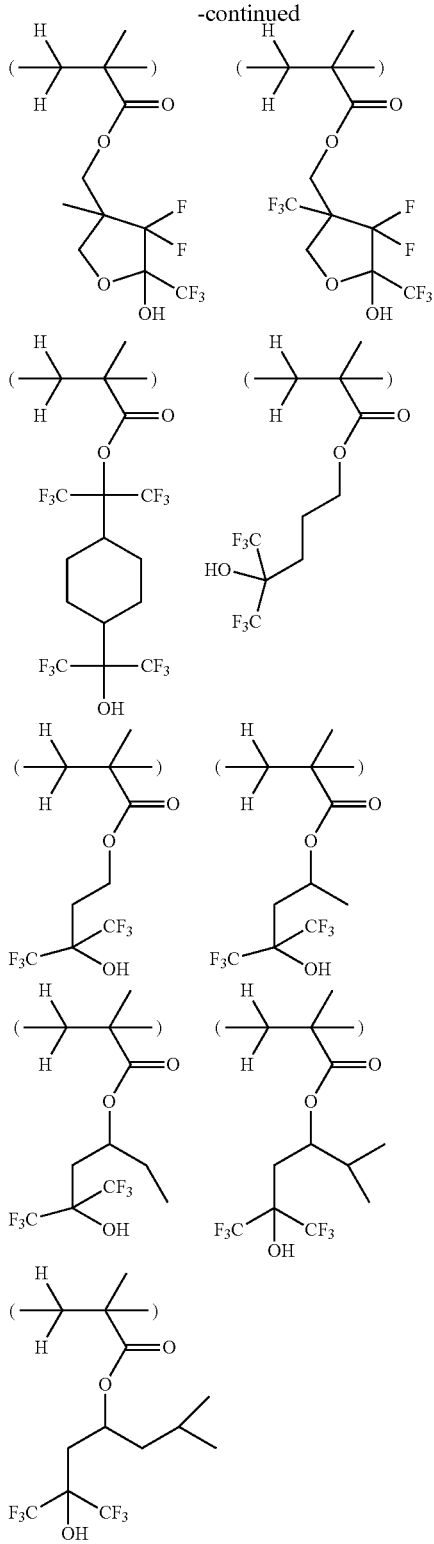

When the repeating unit represented by the general formula (8) is used, it is most preferable that the polar group be a lactone ring.

The repeating unit represented by the general formula (8) is used by copolymerization with the repeating unit represented by the general formula (7), and further may be used by copolymerization with another repeating unit.

The polymer used in the resist composition of the present invention may contain a repeating unit obtained from a monomer having a carbon-carbon double bond other than the above-described repeating units, for example, substituted acrylate esters such as methyl methacrylate, methyl crotonate, dimethyl maleate, and dimethyl itaconate; unsaturated carboxylic acids such as maleic acid, fumaric acid, and itaconic acid; cyclic olefins such as norbornene, norbornene derivatives, and tetracyclo[$6.2.1.1^{3,6}.0^{2,7}$]dodecene derivatives; unsaturated anhydrides such as itaconic anhydride; and a repeating unit obtained from another monomer. Hydrogen additive of ring-opening metathesis polymers described in Japanese Patent Laid-Open Publication No. 2003-66612 can be used.

The polymers used in the resist composition of the present invention have a weight average molecular weight of 1,000 to 500,000, preferably 3,000 to 100,000. Outside the range, the etching resistance may be extremely low and the resolution may be low because a difference in rate of dissolution before and after exposure is lost. For measurement of molecular weight, gel permeation chromatography (GPC) using a polystyrene as standard is used.

One typical method for synthesizing the polymer used for the resist composition may be a method for thermally polymerizing one or more monomers having an unsaturated bond by adding a radical polymerization initiator to an organic solvent, which is described in Japanese Patent Laid-Open Publication No. 2005-264103 and many known documents.

The organic solvent used for the resist composition of the present invention is not particularly limited as long as the acid generator (including the acid generator of the present invention and other acid generators), the base resin, and other additives can be dissolved in it. Specific examples thereof include ketones such as cyclohexanone, and methyl-2-amyl ketone; alcohols such as 3-methoxy butanol, 3-methyl-3-methoxy butanol, 1-methoxy-2-propanol, and 1-ethoxy-2-propanol; ethers such as propylenegylcol monomethyl ether, ethylenegylcol monomethyl ether, propylenegylcol monoethyl ether, ethylenegylcol monoethyl ether, propylenegylcol dimethyl ether, and diethyleneglycol dimethyl ether; and esters such as propylenegylcol monomethyl ether acetate, propylenegylcol monoethyl ether acetate, ethyl lactate, ethyl pyruvate, butyl acetate, methyl 3-methoxypropionate, ethyl 3-ethoxypropionate, tert-butyl acetate, tert-butyl propionate, propylenegylcol monomethyl ether acetate, and propylenegylcol mono-tert-butyl ether acetate. These organic solvents may be used alone or a mixture of two or more kinds of them, but are not limited to these. Of the organic solvents, diethyleneglycol dimethyl ether, 1-ethoxy-2-propanol, ethyl lactate, propyleneglycol monomethyl ether acetate, propyleneglycol monomethyl ether, or a mixed solvent thereof is preferably used in the present invention.

The added amount of the organic solvent is preferably 200 to 10,000 parts by mass, particularly preferably 300 to 5,000 parts by mass relative to 100 parts by mass of the base resin.

The chemically amplified resist composition of the present invention may include, as an optional ingredient, a surfactant which is commonly used for improving the application properties, in addition to the components.

Specific examples thereof are disclosed in Japanese Patent Laid-Open Publication No. 2008-111103, paragraphs [0165] to [0166]. The added amount thereof may be a conventional amount.

To the resist composition of the present invention, one or more quenchers may be added if necessary.

As such quenchers, primary, secondary, or tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, or ammonium salts are suitably used. Specific examples thereof are disclosed in Japanese Patent Laid-Open Publication No. 2008-111103, paragraphs [0146] to [0163].

The mixed amount of the quenchers is 0.01 to 20 parts by mass, preferably 0.1 to 10 parts by mass relative to 100 parts by mass of the base resin. When the amount is 0.01 parts by mass or more, the mixing effect can be surely obtained. When the amount is 20 parts by mass or less, a good sensitivity can be maintained.

In addition to the ingredients, other ingredients such as a cross-linking agent, a dissolution inhibitor, an acidic compound, a stabilizer, and a dye may be added as an optional ingredient if necessary. The added amounts of the ingredients may be conventional amounts.

Patterning Process

The chemically amplified resist composition of the present invention is suitably used as a resist composition for formation of a photoresist layer by a multilayer resist method (in particular, two-layer resist method, and three-layer resist method) or a monolayer resist method.

The present invention provides a patterning process including a step of applying the chemically amplified resist composition to a substrate; a step of conducting heat-treatment; a step of exposing the substrate to any of a KrF excimer laser, an ArF excimer laser, EUV lithography, and an electron beam through a photomask; a step of conducting heat-treatment; and a step of developing it with a developer.

The chemically amplified resist composition of the present invention may be used to form a pattern by a known lithography technique. For example, the chemically amplified resist composition is applied to a substrate for production of an integrated circuit (e.g., Si, $SiO_2$, SiN, SiON, TiN, WSi, BPSG, SOG, and organic antireflective film) or a substrate for production of a mask circuit (e.g., Cr, CrO, CrON, and MoSi) by a procedure such as spin coating to form a resist film having a thickness of 0.05 to 2.0 µm. The film is then pre-baked on a hot plate at 60 to 150° C. for 1 to 20 minutes, preferably at 80 to 140° C. for 1 to 10 minutes.

A patterning mask (photomask) having a desired pattern is then placed over the resist film, and the film is exposed through the mask to radiation of an electron beam or high-energy such as deep-UV rays, an excimer laser, or x-rays. Alternatively, the resist film is exposed to an electron beam without a patterning mask.

The chemically amplified resist composition of the present invention is best suited to fine patterning with a high-energy beam, particularly a KrF excimer laser, an ArF excimer laser, EUV lithography, or an electron beam.

The film is preferably exposed to light so that the exposure dose is 1 to 200 mJ/cm$^2$, preferably about 10 to about 100 mJ/cm$^2$, or to an electron beam so that the exposure does is about 0.1 to 20 µC/cm$^2$, preferably 3 to 10 µC/cm$^2$.

In the exposure, the general exposure method can be used. In some cases, immersion method in which a liquid having a high refractive index of 1.0 or more (e.g., water, ethylene glycol, and glycerin) can be placed between the resist film and a projection lens to conduct immersion lithography can be used. In this case, a top coat insoluble in water may be used.

The resist film is then post-exposure baked (PEB) on a hot plate at 60 to 150° C. for 1 to 20 minutes, preferably at 80 to 140° C. for 1 to 10 minutes. Finally, development may be carried out using as a developer an aqueous alkali solution such as 0.1 to 5% by mass, preferably 2 to 3% by mass tetramethylammonium hydroxide (TMAH) by a conventional method such as dip, puddle, or spray method for 0.1 to 3 minutes, preferably 0.5 to 2 minutes to form the desired pattern on the substrate.

The top coat insoluble in water prevents a substance eluted from the resist film and is used to increase water-sliding property of the film surface. The top coat is largely classified into two kinds. One is an organic solvent peeling type top coat which needs to be peeled before alkaline development by an organic solvent which does not dissolve the resist film. The other is an alkaline solubilized top coat which is soluble in an alkaline developer and is removed by removing a resist film soluble part.

For the latter, a polymer having a 1,1,1,3,3,3-hexafluoro-2-propanol residue, which is insoluble in water and soluble in an alkaline developer, is preferably used as a base and a material which is dissolved in an alcohol solvent having 4 or more carbon atoms, an ether solvent having 8 to 12 carbon atoms, or a mixed solvent thereof is preferable.

The surfactant insoluble in water and soluble in an alkaline developer may be dissolved in an alcohol solvent having 4 or more carbon atoms, an ether solvent having 8 to 12 carbon atoms, or a mixed solvent thereof to prepare a material.

The chemically amplified resist composition of the present invention can be used for formation of a negative pattern using an organic solvent as a developer.

As a developer of the organic solvent, a developer containing as an ingredient one or more selected from 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl, benzyl formate, phenylethyl formate, methyl 3-phenylpropionate, benzyl propionate, ethyl phenylacetate, and 2-phenylethyl acetate, can be used. From the viewpoints of improved pattern collapse, a developer in which the total amount of one or more developer ingredients is 50% by mass or more is preferably used.

Another method for forming a film and substrate may be as described in the patterning process using an alkaline developer.

As a means of the patterning process of the present invention, a photoresist film is formed, acid generators may be then extracted from the surface of the film by rinsing with pure water (post-soak), or particles may be washed off. Alternatively, after exposure, water left on the film may be removed by rinsing (post-soak). Various other steps such as etching, resist-removing, and washing steps may be also performed. These other steps can be performed according to the conventional method.

EXAMPLES

Hereinafter, the present invention will be specifically described with reference to Synthesis Examples, Examples, and Comparative Examples, but is not limited to the following description.

Synthesis Example 1-1

Synthesis of triphenylsulfonium=1,1,3,3,3-pentafluoro-2-(pyridine-4-carbonyloxy)propane-1-sulfonate (PAG-1)

A mixed solution of 73 g (0.72 mole) of triethylamine, 3.7 g (0.03 mole) of N,N'-dimethylaminopyridine, and 150 g of methylene chloride was added dropwise to a mixed solution of 148 g (0.30 mole) of triphenylsulfonium=1,1,3,3,3-pentafluoro-2-hydroxypropane-1-sulfonate prepared in accordance with the method described in Japanese Patent Laid-Open Publication No. 2007-145804, 64 g (0.36 mole) of isonicotinoyl chloride hydrochloride, and 750 g of methylene chloride. The mixture was stirred at room temperature overnight. After stirring, 500 g of water was added to quench the reaction. An organic layer was isolated and washed with water. The organic layer was then concentrated. To the organic layer, methyl isobutyl ketone was added, and the mixture was washed with water. After then, the organic layer was concentrated. To the concentrated residue, diisopropyl ether was added to perform recrystallization. The crystal was filtered off, and dried under reduced pressure at 50° C. to obtain 161 g of triphenylsulfonium=1,1,3,3,3-pentafluoro-2-(pyridine-4-carbonyloxy)propane-1-sulfonate (PAG-1) which was a target compound as a white crystal (yield: 90%).

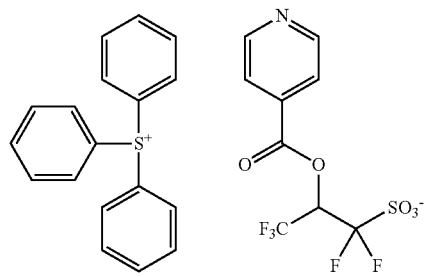

PAG-1

Figure 2:
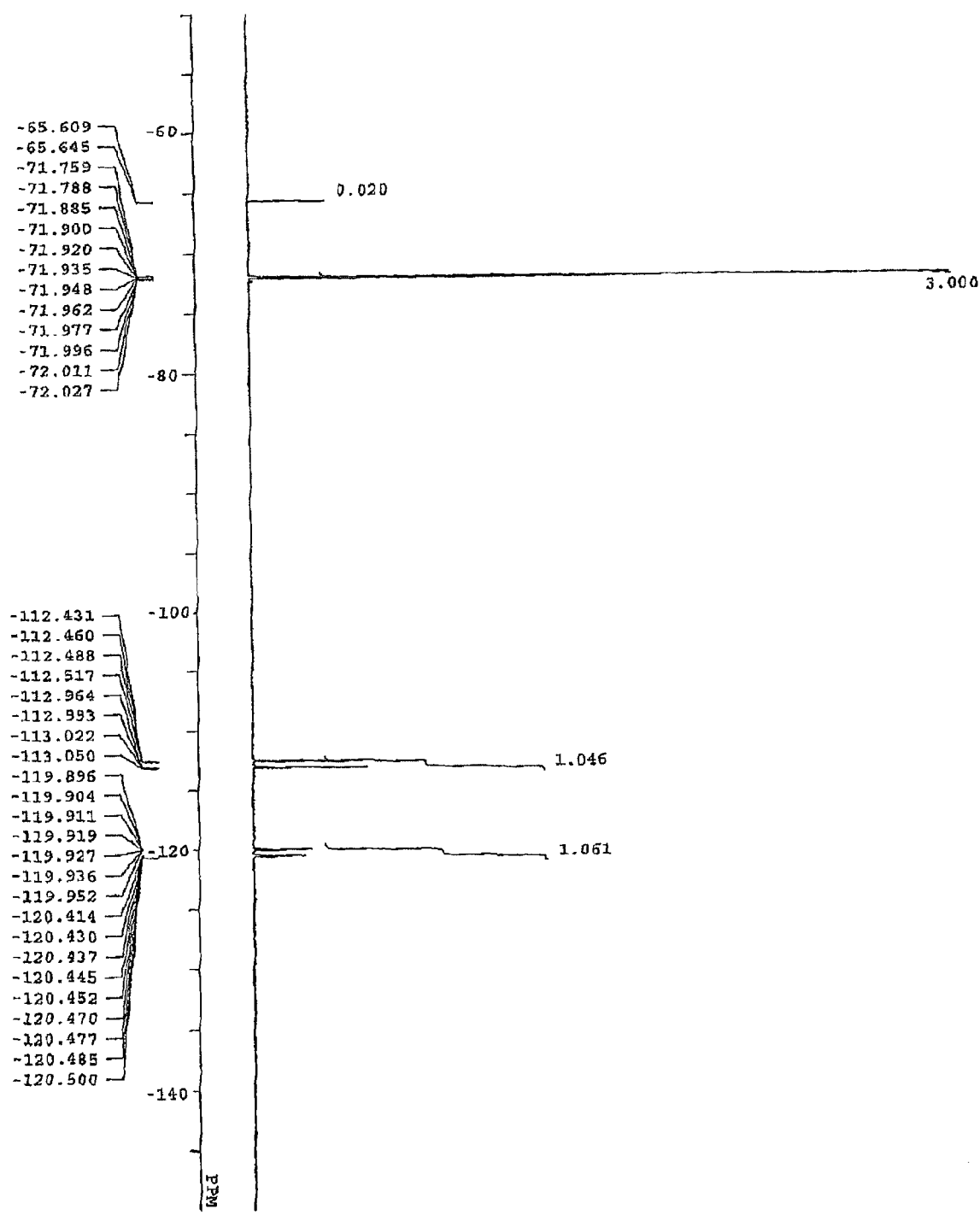
FIG. 2 is a graph showing $^{19}$F-NMR of [PAG-1] in Synthesis Example 1-1.

The spectrum data of the target compound is shown below. FIGS. 1 and 2 show the results of nuclear magnetic resonance spectra ($^1$H-NMR, $^{19}$F-NMR/DMSO-$d_6$). In $^1$H-NMR, a minute amount of residual solvent (e.g., diisopropyl ether and water) is observed.

Infrared absorption spectrum (IR(D-ATR); cm$^{-1}$)
1747, 1474, 1446, 1408, 1375, 1328, 1281, 1255, 1211, 1199, 1158, 1113, 1090, 1073, 1064, 996, 990, 906, 842, 767, 750, 705, 683, 640.

Time-of-Flight mass spectrometry (TOFMS; MALDI)
POSITIVE M$^+$263 (corresponding to $(C_6H_5)_3S^+$)
NEGATIVE M$^-$334 (corresponding to $(NC_5H_4—CO_2)CH(CF_3)CF_2SO_3^-$)

Synthesis Example 1-2

Synthesis of triphenylsulfonium=1,1,3,3,3-pentafluoro-2-(pyridine-3-carbonyloxy)propane-1-sulfonate (PAG-2)

A mixed solution of 2.4 g (24 millimoles) of triethylamine, 0.1 g (1 millimole) of N,N'-dimethylaminopyridine, and 5 g of methylene chloride was added dropwise to a mixed solution of 4.9 g (10 millimoles) of triphenylsulfonium=1,1,3,3,3-pentafluoro-2-hydroxypropane-1-sulfonate prepared in accordance with the method described in Japanese Patent Laid-Open Publication No. 2007-145804, 2.1 g (12 millimoles) of nicotinoyl chloride hydrochloride, and 20 g of methylene chloride. The mixture was stirred at room temperature for 4 hours. After stirring, 20 g of water was added to quench the reaction. An organic layer was isolated and washed with water. The organic layer was then concentrated. To the organic layer, methyl isobutyl ketone was added, and the mixture was washed with water. After then, the organic layer was concentrated. To the concentrated residue, diisopropyl ether was added to perform recrystallization. The crystal was filtered off, and dried under reduced pressure at 50° C. to obtain 5.1 g of triphenylsulfonium=1,1,3,3,3-pentafluoro-2-(pyridine-3-carbonyloxy)propane-1-sulfonate (PAG-2) which was a target compound as a white crystal (yield: 85%).

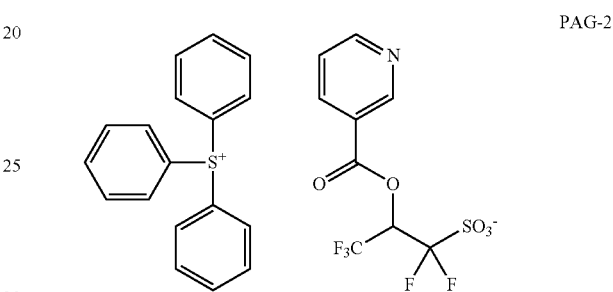

PAG-2

Figure 3:
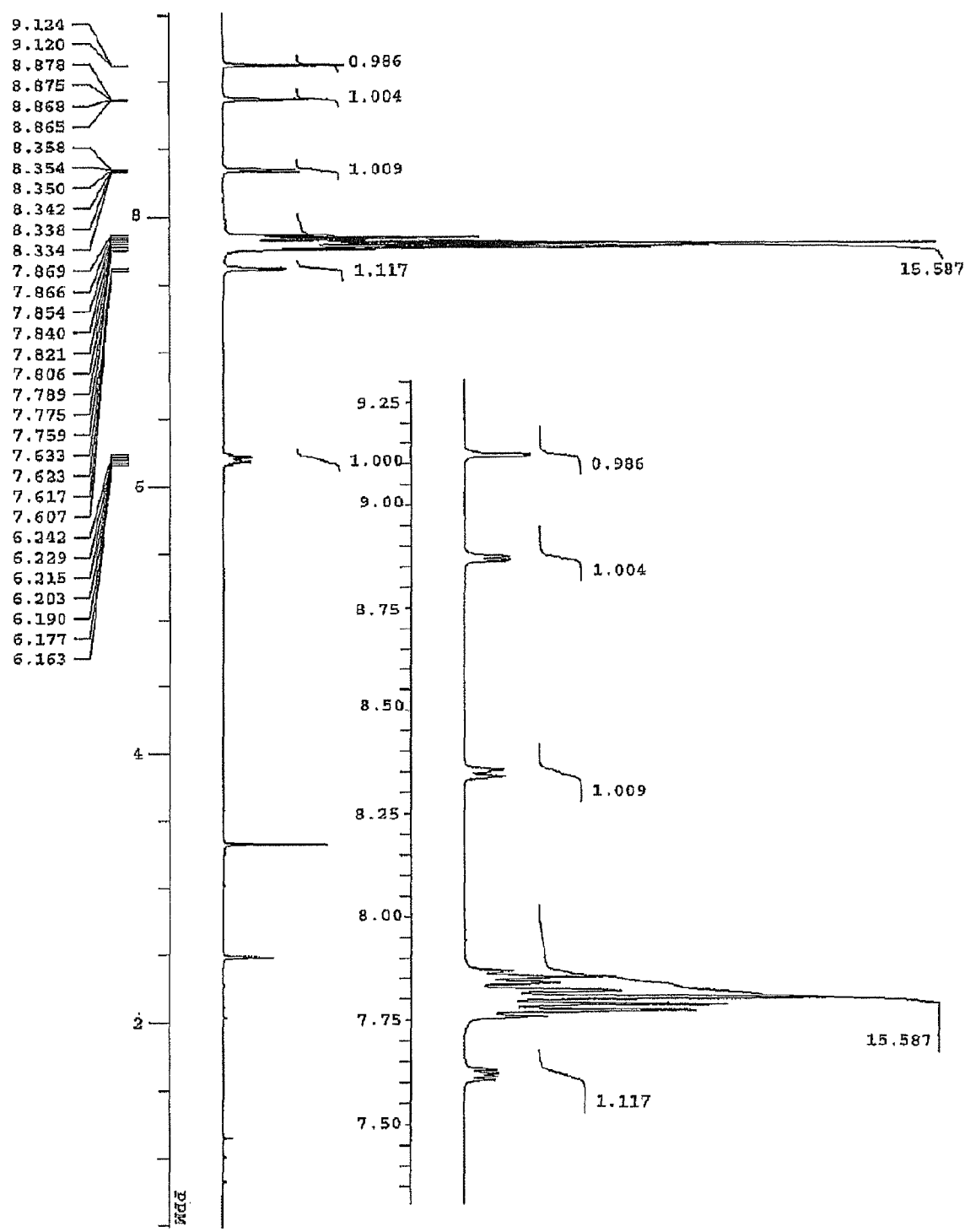
FIG. 3 is a graph showing $^1$H-NMR of [PAG-2] in Synthesis Example 1-2.
Figure 4:
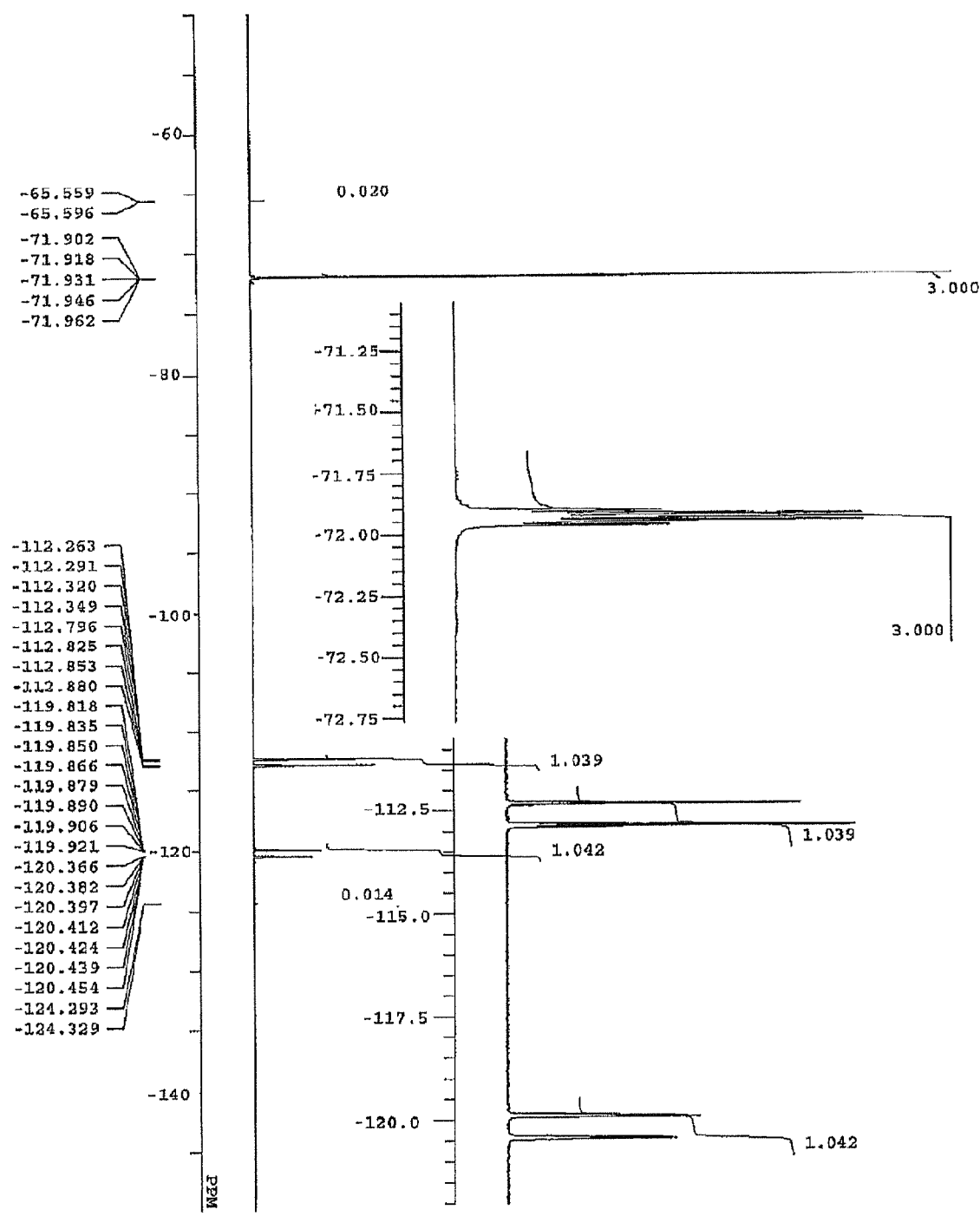
FIG. 4 is a graph showing $^{19}$F-NMR of [PAG-2] in Synthesis Example 1-2.

The spectrum data of the target compound is shown below. FIGS. 3 and 4 show the results of nuclear magnetic resonance spectra ($^1$H-NMR, $^{19}$F-NMR/DMSO-$d_6$). In $^1$H-NMR, a minute amount of water is observed.

Infrared absorption spectrum (IR(D-ATR); cm$^{-1}$)
1741, 1590, 1475, 1446, 1419, 1376, 1330, 1288, 1255, 1214, 1199, 1160, 1110, 1074, 996, 906, 843, 767, 753, 738, 685, 641.

Time-of-Flight mass spectrometry (TOFMS; MALDI)
POSITIVE M$^+$263 (corresponding to $(C_6H_5)_3S^+$)
NEGATIVE M$^-$334 (corresponding to $(NC_5H_4—CO_2)CH(CF_3)CF_2SO_3^-$)

Synthesis Example 1-3

Synthesis of triphenylsulfonium=1,1,3,3,3-pentafluoro-2-(4-dibutylaminobenzoyloxy)propane-1-sulfonate (PAG-3)

A mixed solution of 2.4 g (24 millimoles) of triethylamine, 0.1 g (1 millimole) of N,N'-dimethylaminopyridine, and 10 g of methylene chloride was added dropwise to a mixed solution of dibutylaminobenzoic acid chloride prepared by reacting 1.5 g (12 millimoles) of oxalyl chloride with 2.7 g (11 millimoles) of dibutylaminobenzoic acid, 4.9 g (10 millimoles) of triphenylsulfonium=1,1,3,3,3-pentafluoro-2-hydroxypropane-1-sulfonate prepared in accordance with the method described in Japanese Patent Laid-Open Publication No. 2007-145804, 15 g of methylene chloride. The mixture was stirred at room temperature for 2 hours. After stirring, 30 g of water was added to quench the reaction. An organic layer was isolated and washed with water. The organic layer was then concentrated. To the organic layer, methyl isobutyl ketone was added, and the mixture was washed with water. After then, the organic layer was concentrated, and t-butyl methyl ether was added to carry out decantation. The residue was concentrated under reduced pressure to obtain 4.2 g of triphenylsulfonium=1,1,3,3,3-pentafluoro-2-(4-dibutylaminobenzoyloxy)propane-1-sulfonate (PAG-3) which was a target compound as oil (yield: 58%).

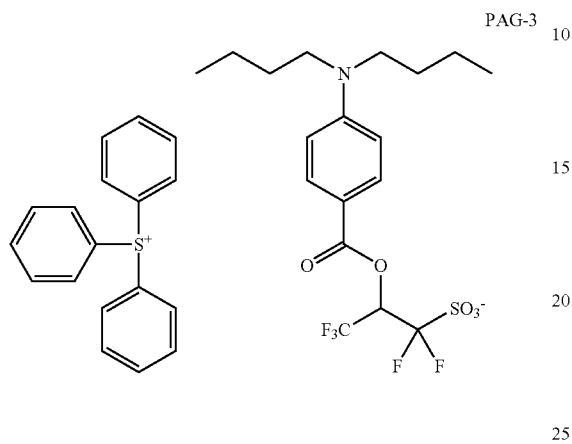

PAG-3

Figure 5:
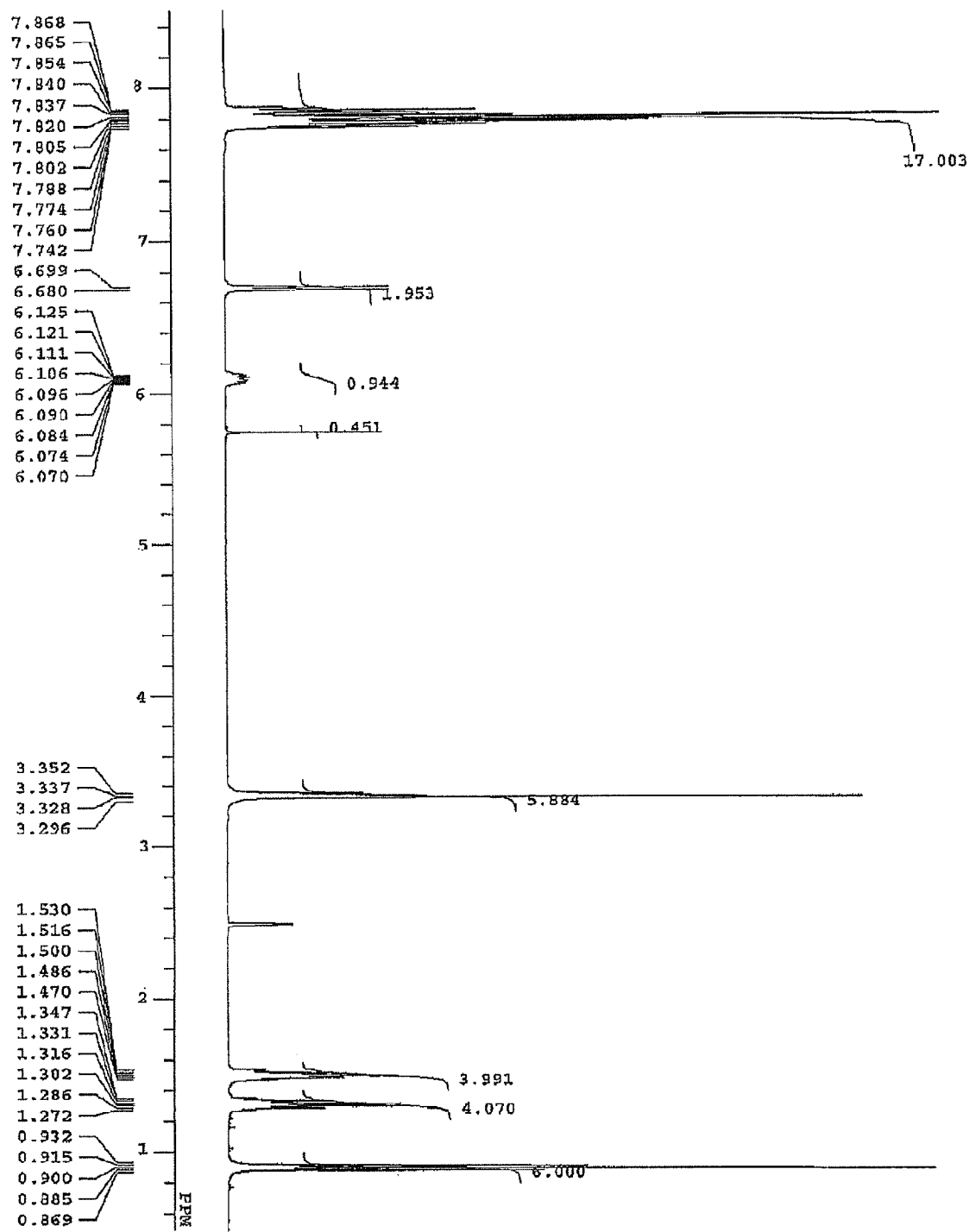
FIG. 5 is a graph showing $^1$H-NMR of [PAG-3] in Synthesis Example 1-3.
Figure 6:
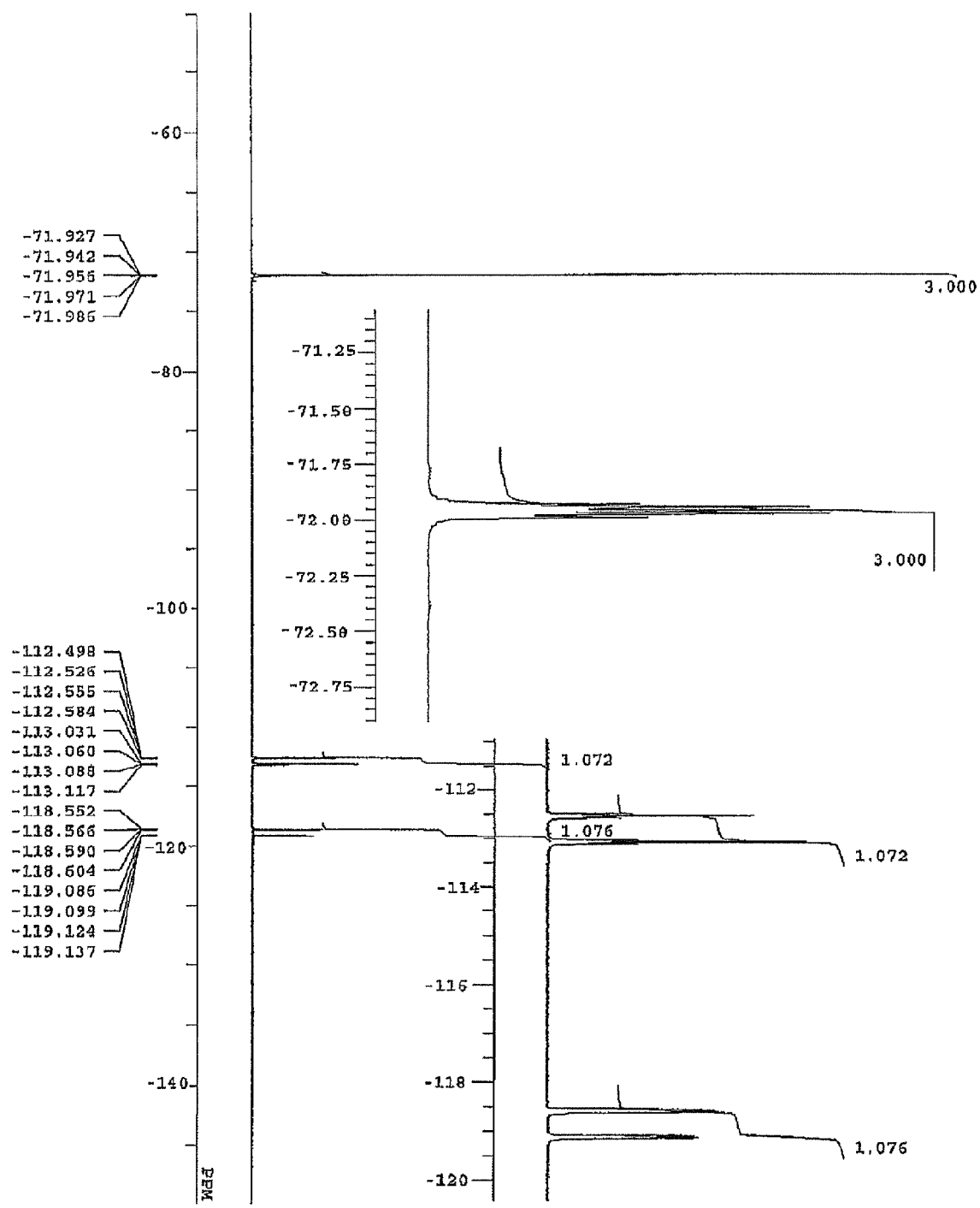
FIG. 6 is a graph showing $^{19}$F-NMR of [PAG-3] in Synthesis Example 1-3.

The spectrum data of the target compound is shown below. FIGS. 5 and 6 show the results of nuclear magnetic resonance spectra ($^1$H-NMR, $^{19}$F-NMR/DMSO-$d_6$). In $^1$H-NMR, a minute amount of residual solvent (e.g., methylene chloride and water) is observed.

Time-of-Flight mass spectrometry (TOFMS; MALDI)

POSITIVE M$^+$263 (corresponding to $(C_6H_5)_3S^+$)

NEGATIVE M$^-$460 (corresponding to $(C_4H_9)_{21}NC_6H_4$—$CO_2)CH(CF_3)CF_2SO_3^-$)

Synthesis Example 1-4

Synthesis of triphenylsulfonium=1,1,3,3,3-pentafluoro-2-(4-dimethylaminobenzoyloxy)propane-1-sulfonate (PAG-4)

A mixed solution of 2.4 g (24 millimoles) of triethylamine, 0.1 g (1 millimole) of N,N'-dimethylaminopyridine, and 10 g of methylene chloride was added dropwise to a mixed solution of dimethylaminobenzoic acid chloride prepared by reacting 1.8 g (14 millimoles) of oxalyl chloride with 1.8 g (11 millimoles) of dimethylaminobenzoic acid, 4.9 g (10 millimoles) of triphenylsulfonium=1,1,3,3,3-pentafluoro-2-hydroxypropane-1-sulfonate prepared in accordance with the method described in Japanese Patent Laid-Open Publication No. 2007-145804, 15 g of methylene chloride. The mixture was stirred at room temperature for 2 hours. After stirring, 30 g of water was added to quench the reaction. An organic layer was isolated and washed with water. The organic layer was then concentrated. To the organic layer, methyl isobutyl ketone was added, and the mixture was washed with water. After then, the organic layer was concentrated, and t-butyl methyl ether was added to carry out decantation. The residue was concentrated under reduced pressure to obtain 5.0 g of triphenylsulfonium=1,1,3,3,3-pentafluoro-2-(4-dimethylaminobenzoyloxy)propane-1-sulfonate (PAG-4) which was a target compound as oil (yield: 79%).

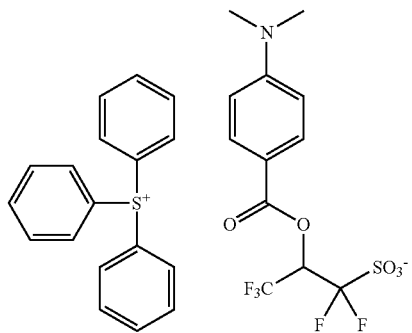

PAG-4

Figure 7:
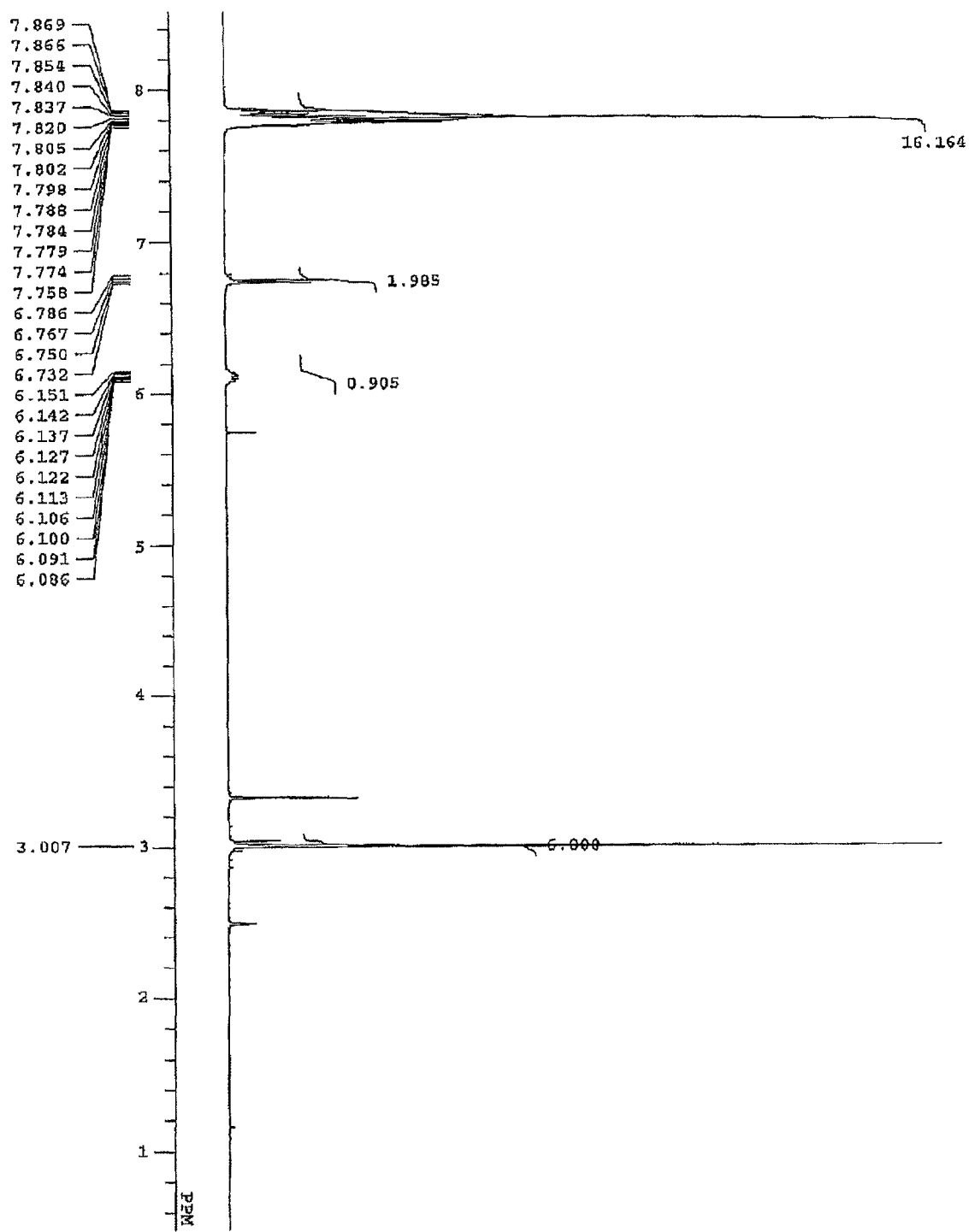
FIG. 7 is a graph showing $^1$H-NMR of [PAG-4] in Synthesis Example 1-4.
Figure 8:
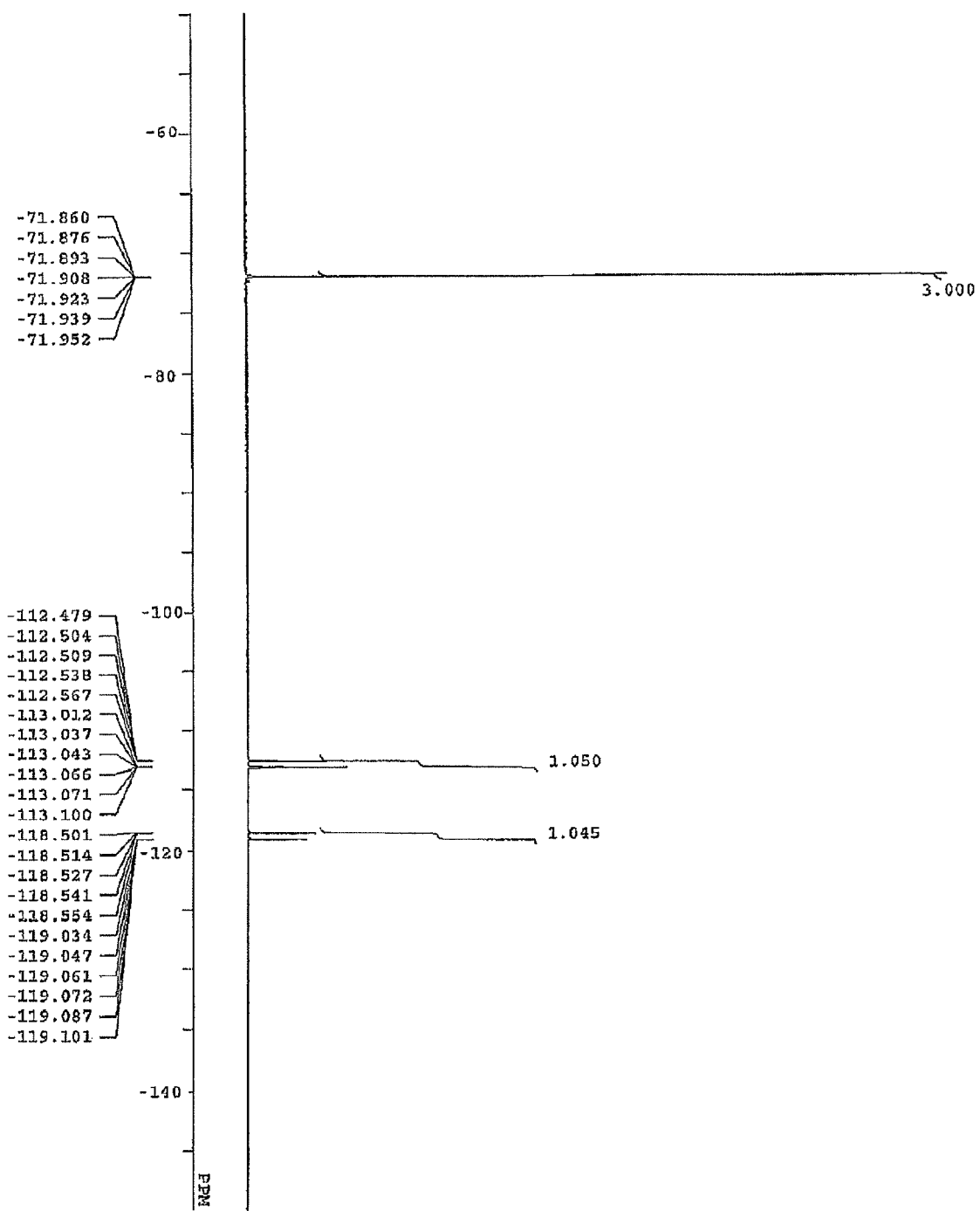
FIG. 8 is a graph showing $^{19}$F-NMR of [PAG-4] in Synthesis Example 1-4.

The spectrum data of the target compound is shown below. FIGS. 7 and 8 show the results of nuclear magnetic resonance spectra ($^1$H-NMR, $^{19}$F-NMR/DMSO-$d_6$). In $^1$H-NMR, a minute amount of residual solvent (e.g., methylene chloride and water) is observed.

Time-of-Flight mass spectrometry (TOFMS; MALDI)

POSITIVE M$^+$263 (corresponding to $(C_6H_5)_3S^+$)

NEGATIVE M$^-$376 (corresponding to $(CH_3)_2NC_6H_4$—$CO_2)CH(CF_3)CF_2SO_3^-$)

Synthesis Example 1-5

Synthesis of triphenylsulfonium=1,1,3,3,3-pentafluoro-2-(3-(N-phenylamino))propionyloxypropane-1-sulfonate (PAG-5)

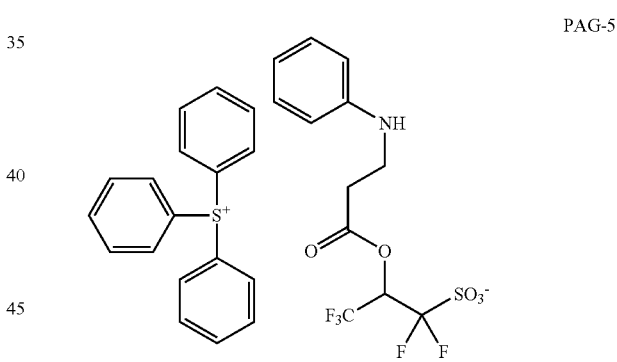

PAG-5

2.7 g (0.005 mole) of triphenylsulfonium=1,1,3,3,3-pentafluoro-2-acryloyloxypropane-1-sulfonate prepared in accordance with the method described in Japanese Patent Laid-Open Publication No. 2008-133448, 1.86 g (0.02 mole) of aniline, and 20 g of methylene chloride were mixed and stirred at room temperature overnight. The reaction solution was ice-cooled, 25 g of water was added to quench the reaction. An organic layer was isolated and washed with water. The organic layer was then concentrated. To the organic layer, methyl isobutyl ketone was added, and the mixture was washed with water. After then, the organic layer was concentrated. To the concentrated residue, diisopropyl ether was added to carry out recrystallization. The crystal was filtered off, and dried under reduced pressure at 50° C. to obtain 2.9 g of triphenylsulfonium=1,1,3,3,3-pentafluoro-2-(3-(N-phenylamino))propionyloxy-1-sulfonate which was a target compound as a white crystal (yield: 90%).

Figure 9:
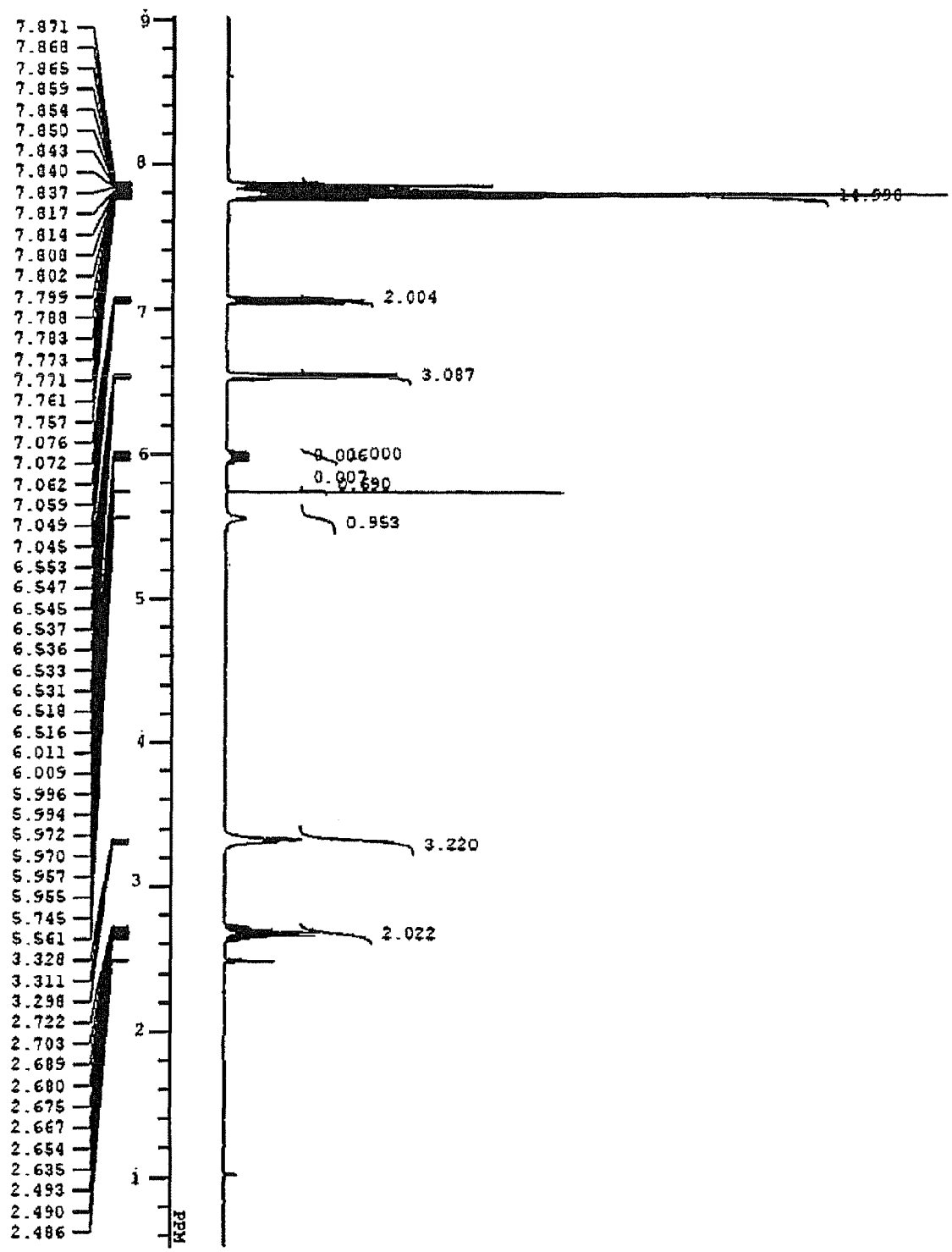
FIG. 9 is a graph showing $^1$H-NMR of [PAG-5] in Synthesis Example 1-5.
Figure 10:
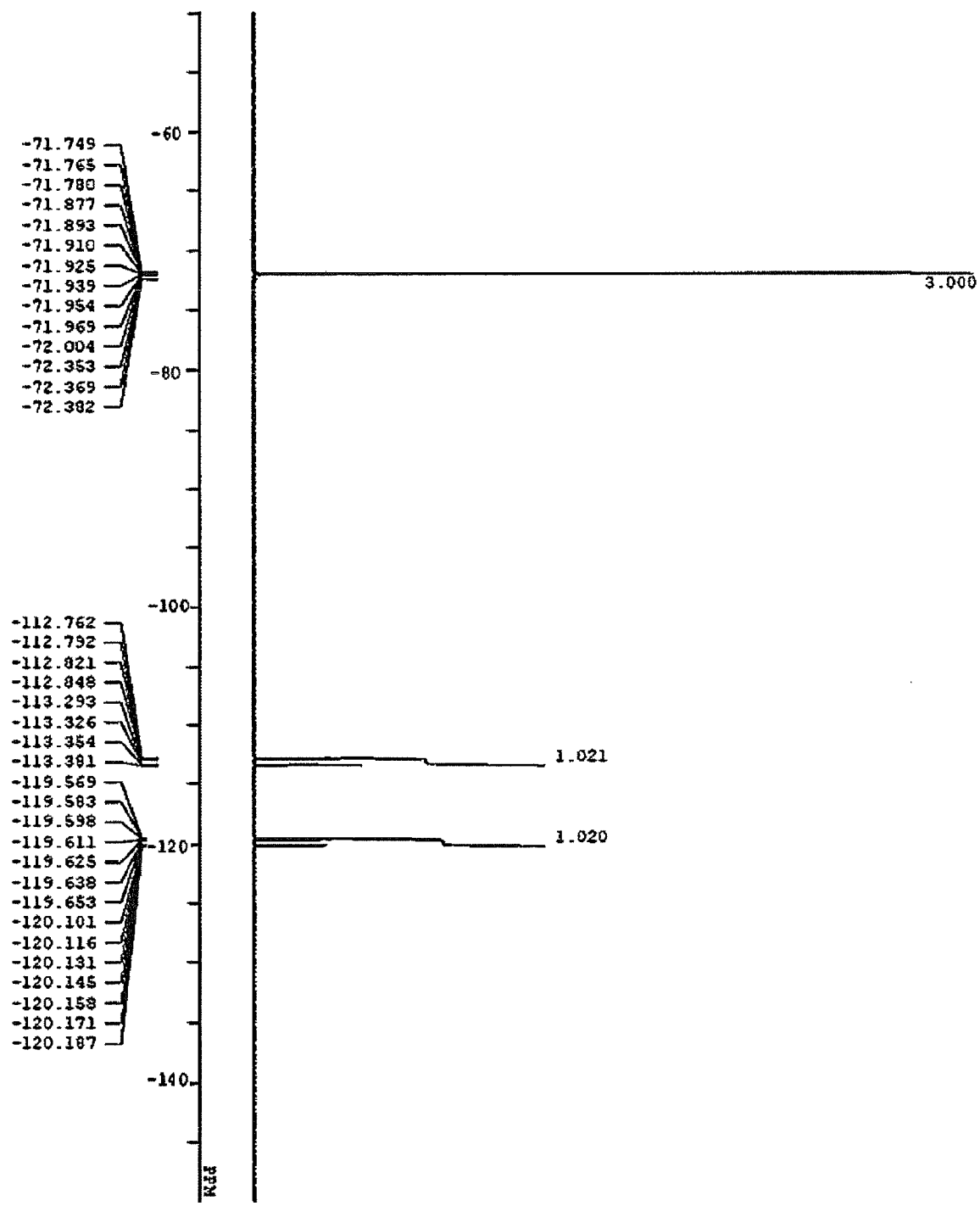
FIG. 10 is a graph showing $^{19}$F-NMR of [PAG-5] in Synthesis Example 1-5.

The spectrum data of the target compound is shown below. FIGS. 9 and 10 show the results of nuclear magnetic resonance spectra ($^1$H-NMR, $^{19}$F-NMR/DMSO-$d_6$). In $^1$H-NMR, a minute amount of residual solvent (e.g., methylene chloride) is observed.

Infrared absorption spectrum (IR(D-ATR); cm$^{-1}$)
3355, 3061, 2970, 1770, 1603, 1500, 1476, 1448, 1371, 1323, 1248, 1170, 1141, 1073, 1022, 995, 916, 841, 749, 684, 642.

Time-of-Flight mass spectrometry (TOFMS; MALDI)
POSITIVE M$^+$263 (corresponding to $(C_6H_5)_3S^+$)
NEGATIVE M$^-$376 (corresponding to $(C_6H_5NHCH_2CH_2-CO_2)CH(CF_3)CF_2SO_3^-$)

Synthesis Example 1-6

Synthesis of triphenylsulfonium=1,1,3,3,3-pentafluoro-2-(3-(3-pyridyl)acryloyloxy)propane-1-sulfonate (PAG-6)

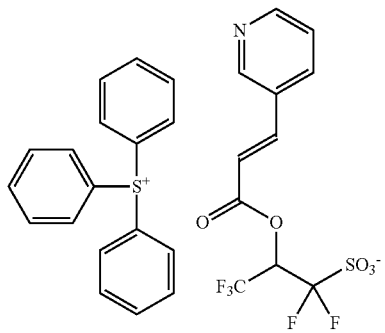

PAG-6

A mixed solution of 48.7 g (0.48 mole) of triethylamine, 1.95 g (0.016 mole) of N,N'-dimethylaminopyridine, and 100 g of methylene chloride was added dropwise to a mixed solution of 79.0 g (0.16 mole) of triphenylsulfonium=1,1,3,3,3-pentafluoro-2-hydroxypropane-1-sulfonate prepared in accordance with the method described in Japanese Patent Laid-Open Publication No. 2007-145804, 49 g (0.24 mole) of 3-(3-pyridyl)acryloyl chloride hydrochloride, and 500 g of methylene chloride under ice-cooling. The mixture was stirred at room temperature for 1.2 hours. The reaction solution was ice-cooled, 900 g of water was added to quench the reaction. An organic layer was isolated and washed with water. The organic layer was then concentrated. To the organic layer, methyl isobutyl ketone was added, and the mixture was washed with water. After then, the organic layer was concentrated, and diisopropyl ether was added to carry out decantation. The residue was concentrated under reduced pressure to obtain 82.4 g of triphenylsulfonium=1,1,3,3,3-pentafluoro-2-(3-(3-pyridyl)acryloyloxy)propane-1-sulfonate which was a target compound as oil (yield: 83%).

Figure 11:
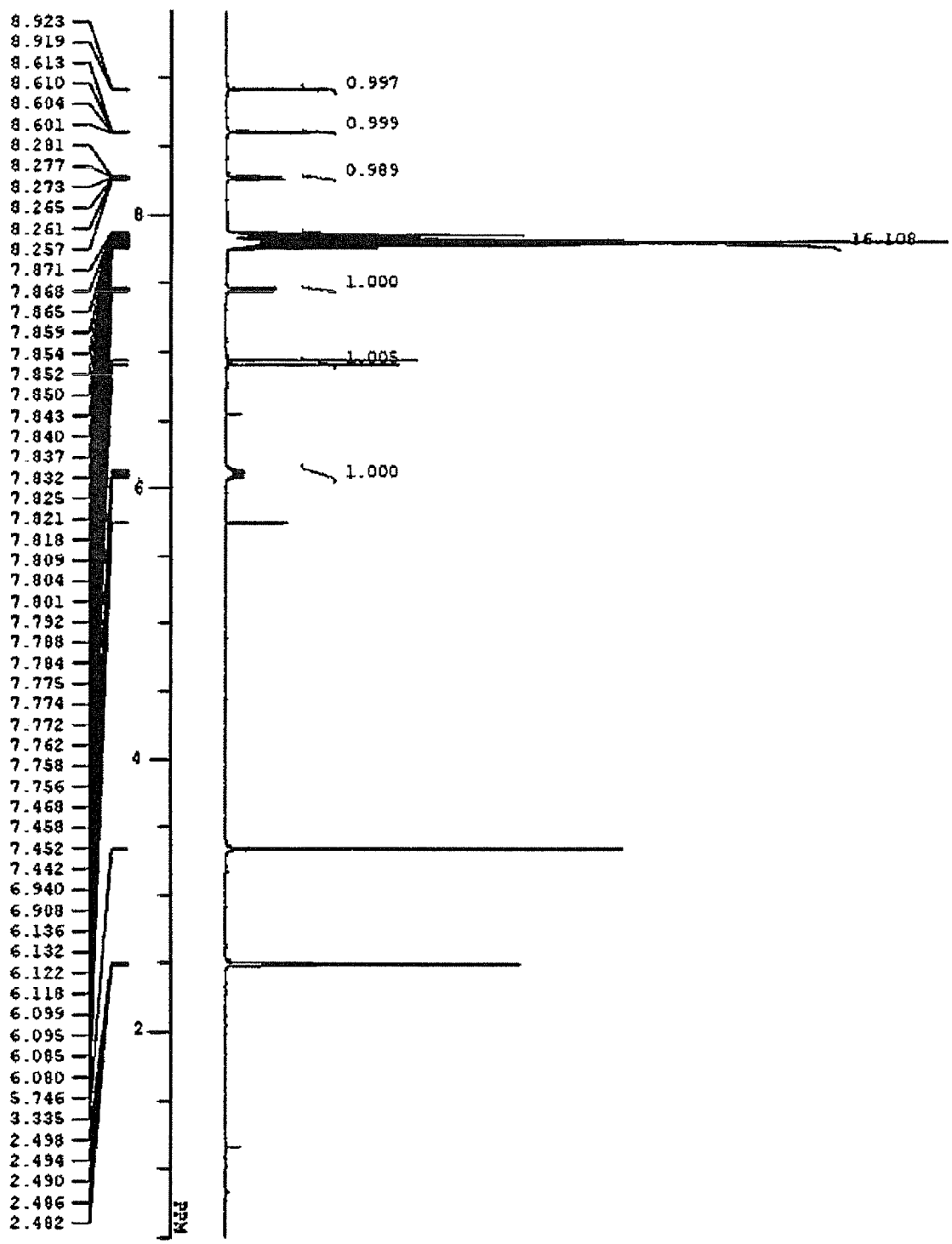
FIG. 11 is a graph showing $^1$H-NMR of [PAG-6] in Synthesis Example 1-6.
Figure 12:
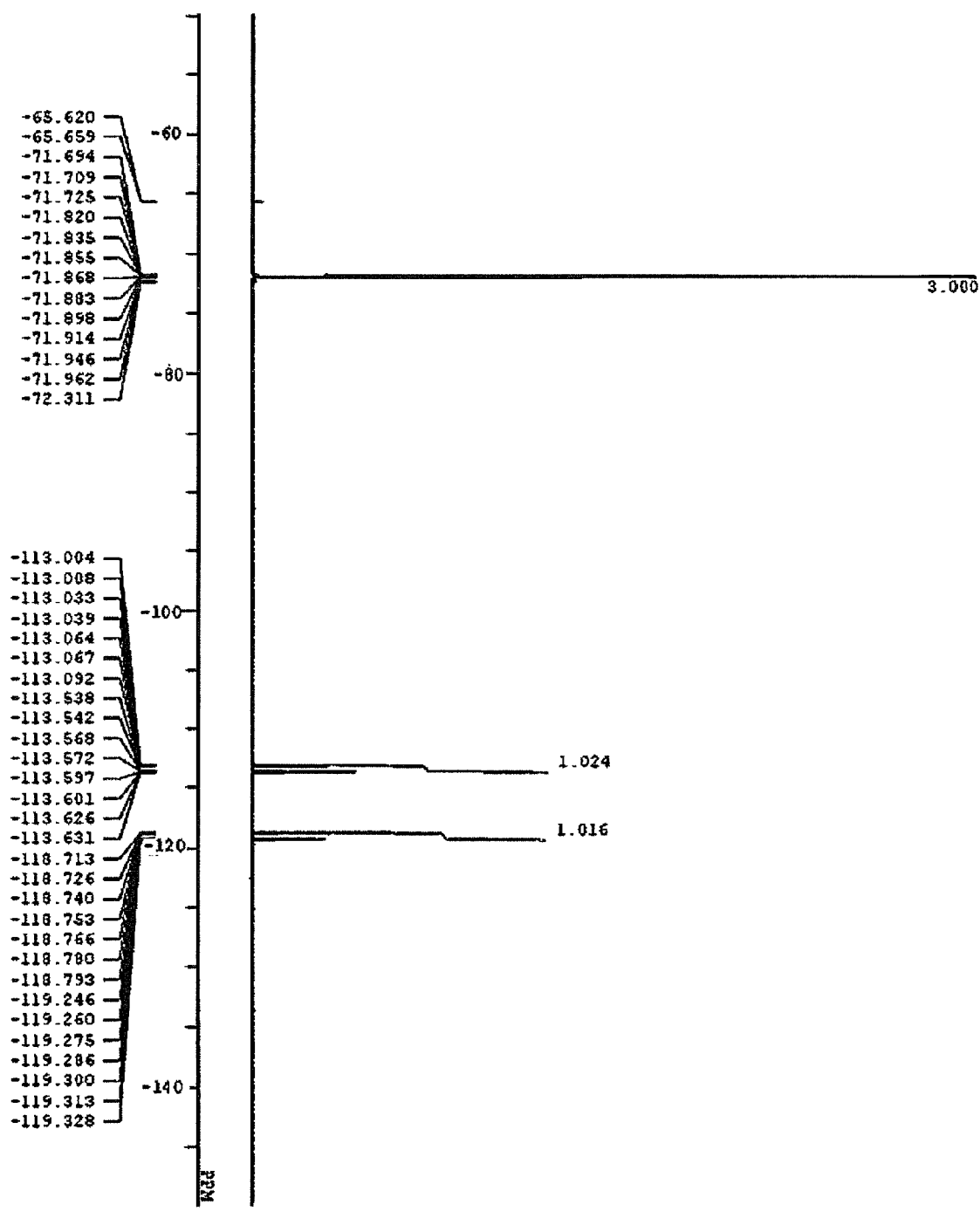
FIG. 12 is a graph showing $^{19}$F-NMR of [PAG-6] in Synthesis Example 1-6.

The spectrum data of the target compound is shown below. FIGS. 11 and 12 show the results of nuclear magnetic resonance spectra ($^1$H-NMR, $^{19}$F-NMR/DMSO-$d_6$). In $^1$H-NMR, a minute amount of residual solvent (e.g., methylene chloride and water) is observed.

Infrared absorption spectrum (IR(D-ATR); cm$^{-1}$)
3062, 1740, 1639, 1586, 1477, 1448, 1417, 1372, 1329, 1251, 1217, 1186, 1144, 1073, 1024, 995, 927, 879, 835, 809, 751, 685, 642.

Time-of-Flight mass spectrometry (TOFMS; MALDI)
POSITIVE M$^+$263 (corresponding to $(C_6H_5)_3S^+$)
NEGATIVE M$^-$360 (corresponding to $(NC_5H_4CH=CH-CO_2)CH(CF_3)CF_2SO_3^-$)

Synthesis Example 1-7

Synthesis of triphenylsulfonium=2-(4-dimethylaminobenzoyloxy)-1,1-difluoroethanesulfonate (PAG-7)

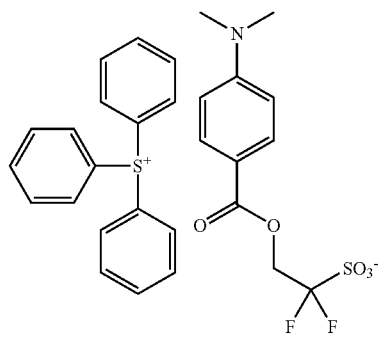

PAG-7

A mixed solution of 51 g (0.50 mole) of triethylamine, 4.9 g (0.040 mole) of N,N'-dimethylaminopyridine, and 100 g of methylene chloride was added dropwise to a mixed solution of 85 g (0.20 mole) of triphenylsulfonium 1,1-difluoro-2-hydroxyethanesulfonate prepared in accordance with the method described in Japanese Patent Laid-Open Publication No. 2010-116550, 55 g (0.30 mole) of 4-dimethylaminobenzoyl chloride, and 250 g of methylene chloride under ice-cooling. The mixture was stirred at room temperature for 12 hours. The reaction solution was ice-cooled, 180 g of water was added to quench the reaction. An organic layer was isolated and washed with water. The organic layer was then concentrated. To the organic layer, methyl isobutyl ketone was added. To the concentrated residue, methyl isobutyl ketone was further added, to deposit a crystal from the reaction solution. The crystal was filtered, washed with methyl isobutyl ketone, and dried under reduced pressure to obtain 106 g of triphenylsulfonium=2-(4-dimethylaminobenzoyloxy)-1,1-difluoroethanesulfonate which was a target compound as a light brown crystal (yield: 87%).

Figure 13:
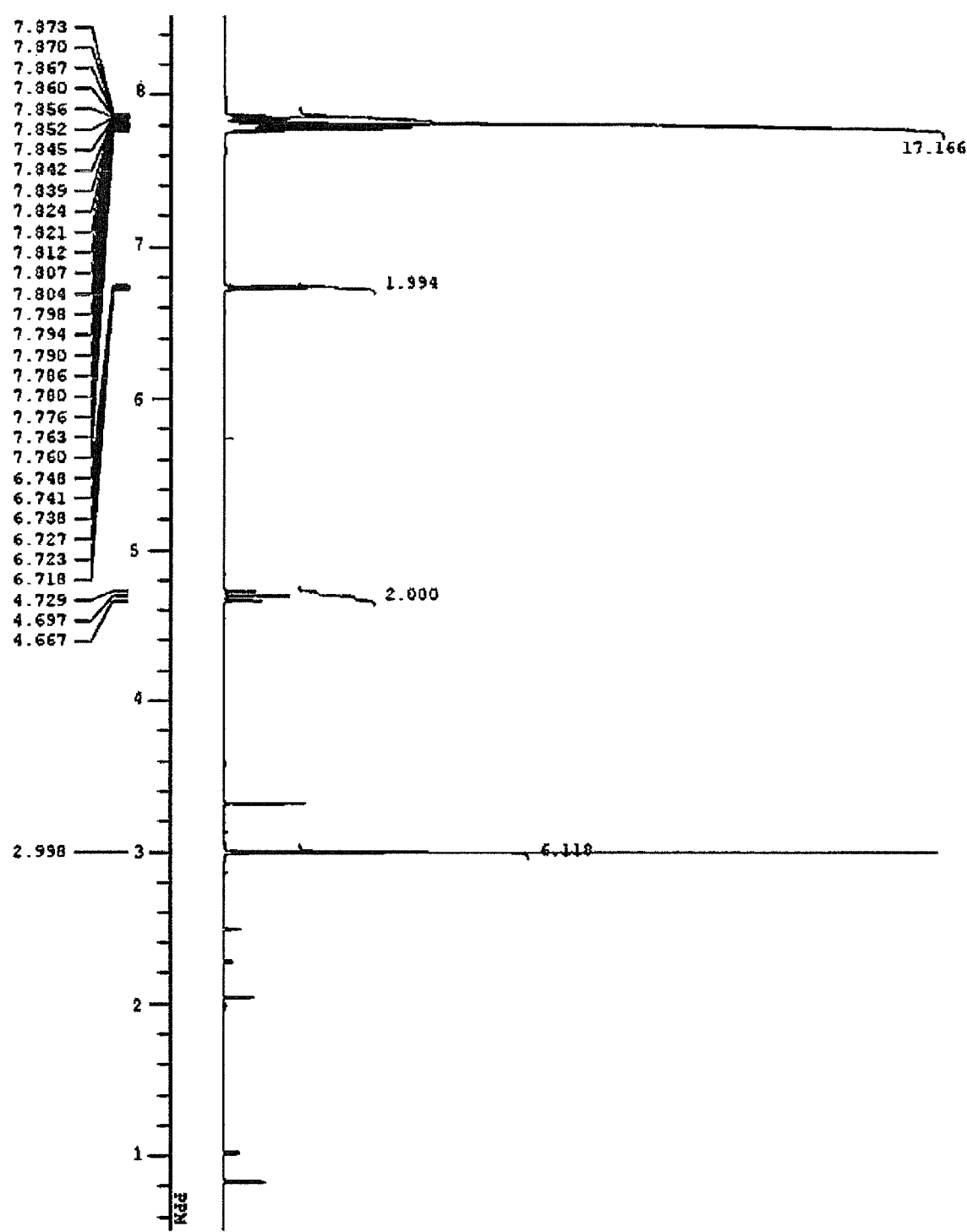
FIG. 13 is a graph showing $^1$H-NMR of [PAG-7] in Synthesis Example 1-7.
Figure 14:
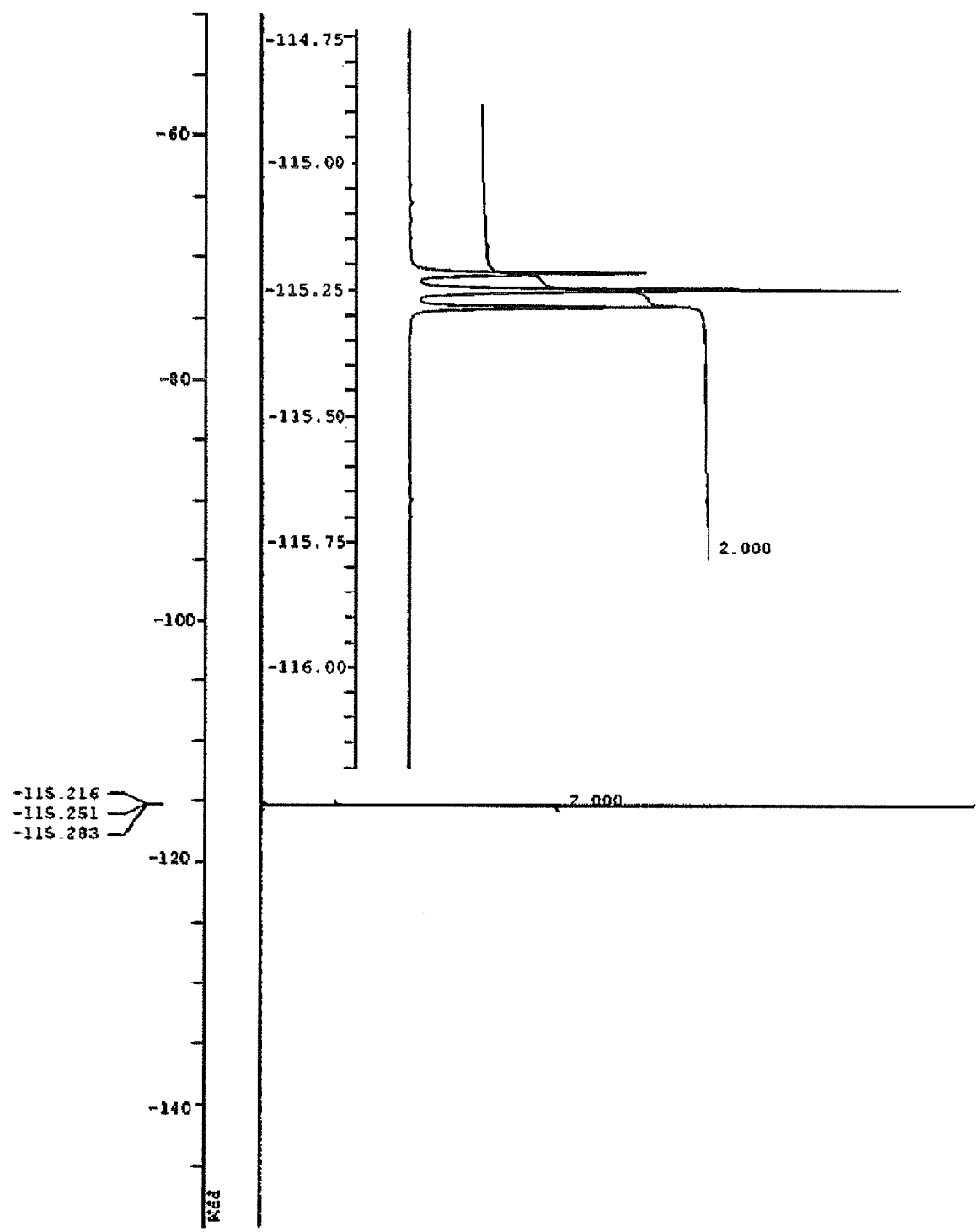
FIG. 14 is a graph showing $^{19}$F-NMR of [PAG-7] in Synthesis Example 1-7.

The spectrum data of the target compound is shown below. FIGS. 13 and 14 show the results of nuclear magnetic resonance spectra ($^1$H-NMR, $^{19}$F-NMR/DMSO-$d_6$). In $^1$H-NMR, a minute amount of residual solvent (e.g., methyl isobutyl ketone and water) is observed.

Infrared absorption spectrum (IR(D-ATR); cm$^{-1}$)
3087, 2974, 1712, 1602, 1525, 1474, 1447, 1366, 1276, 1244, 1209, 1187, 1129, 1097, 1064, 1014, 997, 972, 946, 838, 775, 764, 746, 700, 683, 645.

Time-of-Flight mass spectrometry (TOFMS; MALDI)
POSITIVE M$^+$263 (corresponding to $(C_6H_5)_3S^+$)
NEGATIVE M$^-$308 (corresponding to $(CH_3)_2NC_6H_4-CO_2)CH_2CF_2SO_3^-$)

A polymer used for the resist composition of the present invention was synthesized by the following procedure.

Synthesis Example 2-1

Synthesis of polymer 1 (P-1)

7.1 g of 3-hydroxy-1-adamantyl methacrylate, 11.0 g of 3-ethyl-3-exo-tetracyclo[4.4.0.1$^{2,5}$.1$^{7,10}$]dodecyl methacrylate, 6.7 g of 4,8-dioxatricyclo[4.2.1.0$^{3,7}$]nonan-5-on-2-yl methacrylate, and 0.9 g of dimethyl 2,2'-azobis(isobutyrate) were dissolved in 72.8 g of methyl ethyl ketone under a nitrogen atmosphere to prepare a solution. The solution was stirred at 80° C. under a nitrogen atmosphere, and was added dropwise to 20.7 g of methyl ethyl ketone over 4 hours. After completion of dropwise addition, the mixture was stirred for 2 hours while kept to 80° C., and cooled to room temperature. The polymerization solution was added dropwise to 400 g of hexane. The deposited solid matter was collected by filtration, and washed with a mixed solvent of 45 g of methyl ethyl ketone and 195 g of hexane twice. The solid matter was dried under vacuum at 50° C. for 20 hours to obtain a polymer represented by polymer 1 as a white powder. The yield was 23.6 g, and the yield rate was 95%. Mw represents a weight average molecular weight in terms of polystyrene measured by GPC.

Synthesis Examples 2-2 to 10

Synthesis of polymers 2 to 10 (P-2 to P-10)

Resins shown in Table 1 were produced in the same manner as in Synthesis Example 2-1 except that the kind of each monomer and a mixing ratio were changed. The structures of each unit shown in Table 1 are shown in Tables 2 and 3. In Table 1, the induced ratio is a molar ratio.

TABLE 1

| Resin | Unit 1 (induced ratio) | | Unit 2 (induced ratio) | | Unit 3 (induced ratio) | | Unit 4 (induced ratio) | | Unit 5 (induced ratio) | | Molecular weight |
|---|---|---|---|---|---|---|---|---|---|---|---|
| P-1 | A-1 | (0.40) | B-1 | (0.30) | B-6 | (0.30) | — | | — | | 8200 |
| P-2 | A-2 | (0.50) | B-1 | (0.10) | B-2 | (0.40) | — | | — | | 8300 |
| P-3 | A-3 | (0.50) | B-2 | (0.50) | — | | — | | — | | 8000 |
| P-4 | A-5 | (0.35) | B-1 | (0.20) | B-4 | (0.45) | — | | — | | 8200 |
| P-5 | A-2 | (0.50) | B-1 | (0.10) | B-4 | (0.40) | — | | — | | 7600 |
| P-6 | A-5 | (0.50) | B-2 | (0.50) | — | | — | | — | | 7700 |
| P-7 | A-1 | (0.25) | A-2 | (0.25) | B-1 | (0.10) | B-6 | (0.40) | — | | 7900 |
| P-8 | A-4 | (0.55) | B-2 | (0.15) | B-5 | (0.30) | — | | — | | 8100 |
| P-9 | A-1 | (0.15) | A-2 | (0.25) | B-1 | (0.15) | B-3 | (0.25) | B-7 | (0.20) | 7900 |
| P-10 | A-6 | (0.35) | B-1 | (0.20) | B-6 | (0.45) | — | | — | | 8400 |

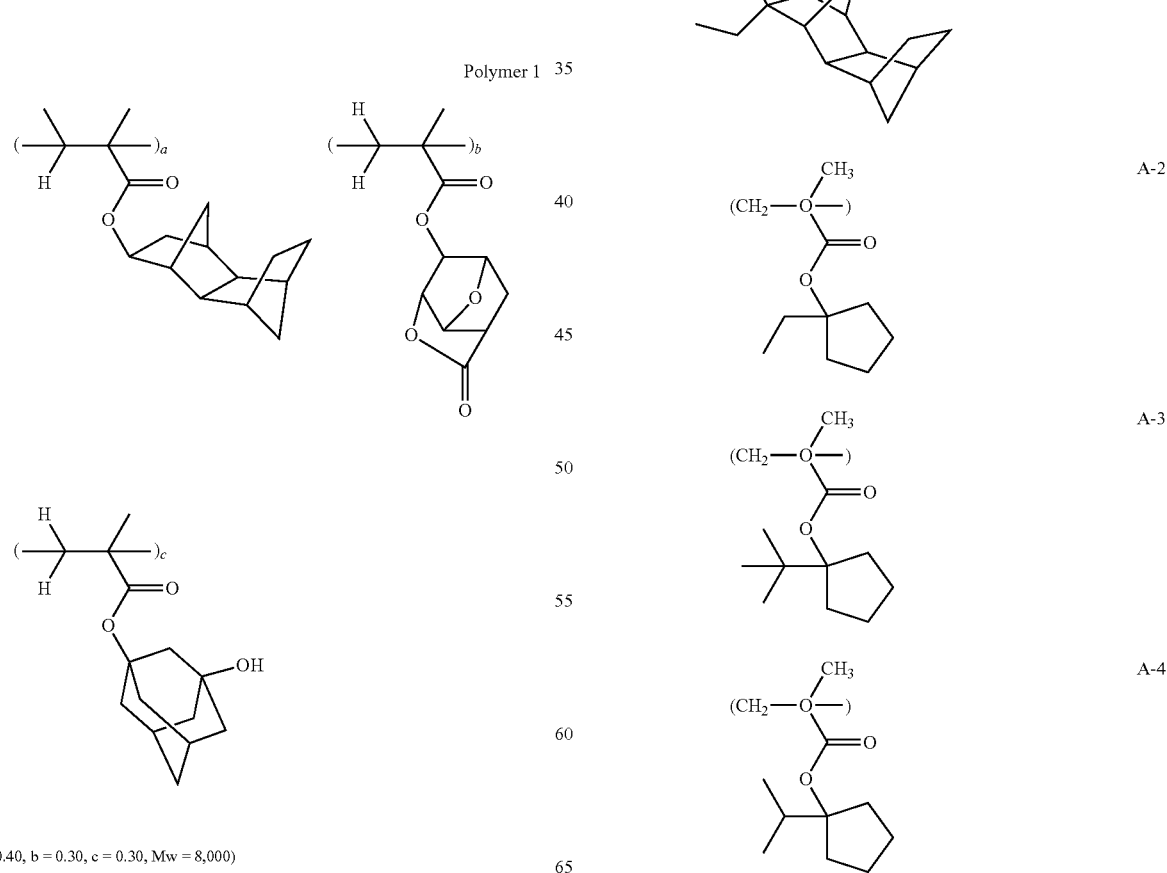

Polymer 1

(a = 0.40, b = 0.30, c = 0.30, Mw = 8,000)

TABLE 2

TABLE 2-continued

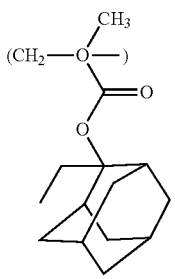
A-5

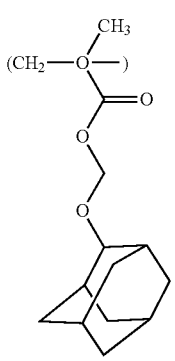
A-6

TABLE 3

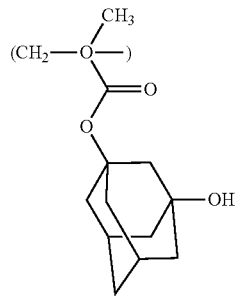
B-1

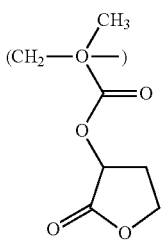
B-2

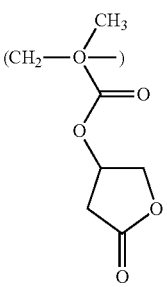
B-3

TABLE 3-continued

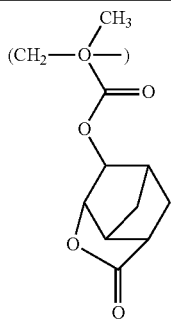
B-4

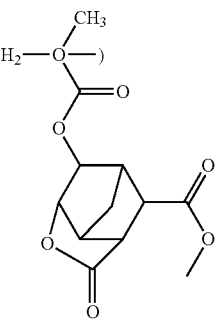
B-5

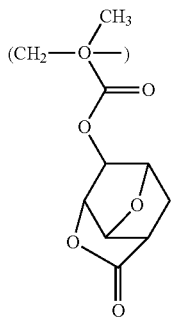
B-6

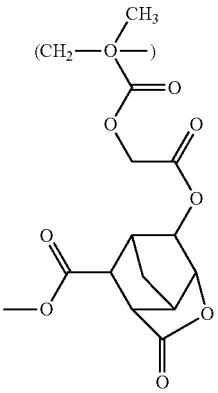
B-7

Examples 1-1 to 1-17 and Comparative Examples 1-1 to 1-6

A polymer (P-1 to P-10) shown in each of the synthesis examples, a photoacid generator (PAG-1 to PAG-7, and PAG-A to PAG-D), an amine quencher, and an alkaline solubilized surfactant (F-1) in a combination shown in Table 5 were dissolved in a solvent containing 0.01% by mass of surfactant (F-2) (available from Omnova Solutions Inc.) to prepare a resist composition. The resist composition was filtered through a 0.2 μm Teflon (registered trademark) filter to prepare a resist solution.

TABLE 4

| | Resist | Resin (parts by mass) | | Acid generator 1 (parts by mass) | | Acid generator 2 (parts by mass) | | Quencher (parts by mass) | | Surfactant (parts by mass) | | Solvent 1 (parts by mass) | | Solvent 2 (parts by mass) | |
|---|---|---|---|---|---|---|---|---|---|---|---|---|---|---|---|
| Example 1-1 | R-01 | P-1 | (80) | PAG-A | (12.0) | PAG-1 | (9.3) | — | | F-1 | (5.1) | PGMEA | (1344) | CyHO | (576) |
| Example 1-2 | R-02 | P-1 | (80) | PAG-B | (13.9) | PAG-1 | (9.3) | — | | F-1 | (5.1) | PGMEA | (1344) | CyHO | (576) |
| Example 1-3 | R-03 | P-1 | (80) | PAG-B | (13.9) | PAG-2 | (9.3) | — | | F-1 | (5.1) | PGMEA | (1344) | CyHO | (576) |
| Example 1-4 | R-04 | P-1 | (80) | PAG-B | (13.9) | PAG-3 | (11.2) | — | | F-1 | (5.1) | PGMEA | (1344) | CyHO | (576) |
| Example 1-5 | R-05 | P-1 | (80) | PAG-B | (13.9) | PAG-4 | (9.9) | — | | F-1 | (5.1) | PGMEA | (1344) | CyHO | (576) |
| Example 1-6 | R-06 | P-2 | (80) | PAG-B | (13.9) | PAG-1 | (9.3) | — | | F-1 | (5.1) | PGMEA | (1344) | CyHO | (576) |
| Example 1-7 | R-07 | P-3 | (80) | PAG-B | (13.9) | PAG-1 | (9.3) | — | | F-1 | (5.1) | PGMEA | (1728) | GBL | (192) |
| Example 1-8 | R-08 | P-4 | (80) | PAG-B | (13.9) | PAG-1 | (9.3) | — | | F-1 | (5.1) | PGMEA | (1344) | CyHO | (576) |
| Example 1-9 | R-09 | P-5 | (80) | PAG-B | (13.9) | PAG-1 | (9.3) | — | | F-1 | (5.1) | PGMEA | (1344) | CyHO | (576) |
| Example 1-10 | R-10 | P-6 | (80) | PAG-B | (13.9) | PAG-1 | (4.6) | Q-1 | (0.8) | F-1 | (5.1) | PGMEA | (1728) | GBL | (192) |
| Example 1-11 | R-11 | P-7 | (80) | PAG-B | (13.9) | PAG-1 | (9.3) | — | | F-1 | (5.1) | PGMEA | (1344) | CyHO | (576) |
| Example 1-12 | R-12 | P-8 | (80) | PAG-B PAG-C | (12.7) (1.7) | PAG-1 | (9.3) | — | | F-1 | (5.1) | PGMEA | (1728) | GBL | (192) |
| Example 1-13 | R-13 | P-9 | (80) | PAG-B | (10.1) | PAG-1 | (9.3) | — | | F-1 | (5.1) | PGMEA | (1344) | CyHO | (576) |
| Example 1-14 | R-14 | P-10 | (80) | PAG-B | (10.1) | PAG-1 | (9.3) | — | | F-1 | (5.1) | PGMEA | (1728) | GBL | (192) |
| Comparative Example 1-1 | R-15 | P-1 | (80) | PAG-B | (10.1) | — | | Q-1 | (1.6) | F-1 | (5.1) | PGMEA | (1344) | CyHO | (576) |
| Comparative Example 1-2 | R-16 | P-2 | (80) | PAG-B | (13.9) | PAG-D | (7.7) | — | | F-1 | (5.1) | PGMEA | (1344) | CyHO | (576) |
| Comparative Example 1-3 | R-17 | P-3 | (80) | PAG-B | (10.1) | — | | Q-1 | (1.6) | F-1 | (5.1) | PGMEA | (1728) | GBL | (192) |
| Comparative Example 1-4 | R-18 | P-4 | (80) | PAG-B | (7.6) | — | | Q-1 | (1.6) | F-1 | (5.1) | PGMEA | (1344) | CyHO | (576) |
| Comparative Example 1-5 | R-19 | P-5 | (80) | PAG-B | (7.6) | — | | Q-1 | (1.6) | F-1 | (5.1) | PGMEA | (1728) | GBL | (192) |
| Comparative Example 1-6 | R-20 | P-6 | (80) | PAG-B | (6.6) | — | | Q-1 | (1.6) | F-1 | (5.1) | PGMEA | (1728) | GBL | (192) |
| Example 1-15 | R-21 | P-3 | (80) | PAG-B | (10.1) | PAG-5 | (9.1) | — | | F-1 | (5.0) | PGMEA | (1728) | GBL | (192) |
| Example 1-16 | R-22 | P-3 | (80) | PAG-B | (10.1) | PAG-6 | (8.9) | Q-1 | (0.8) | F-1 | (5.0) | PGMEA | (1728) | GBL | (192) |
| Example 1-17 | R-23 | P-3 | (80) | PAG-B | (10.1) | PAG-7 | (8.1) | — | | F-1 | (5.0) | PGMEA | (1728) | GBL | (192) |

In Table 4, the photoacid generator, solvent, amine quencher, alkaline solubilized surfactant (F-1), and surfactant (F-2) are as described below.
Acid Generator
(PAG-A): triphenylsulfonium nonafluoro-1-butanesulfonate
(PAG-B): triphenylsulfonium 2-(adamantane-1-carbonyloxy)-1,1,3,3,3-pentafluoropropane-1-sulfonate (compound described in Japanese Patent Laid-Open Publication No. 2007-145797)
(PAG-C): N-(nonafluoro-n-butanesulfonyloxy)naphthylimide
(PAG-D): triphenylsulfonium camphorsulfonate
Organic Solvent
PGMEA: propylenegylcol monomethyl ether acetate
GBL: γ-butyrolactone
CyHO: cyclohexanone
Amine Quencher
(Q-1): 2,6-diisopropylaniline
Surfactant
(F-1): the following polymer I (compound described in Japanese Patent Laid-Open Publication No. 2008-122932) poly(3,3,3-trifluoro-2-hydroxy-1,1-dimethyl-2-trifluoromethylpropyl methacrylate-1,1,1-trifluoro-2-hydroxy-6-methyl-2-trifluoromethylhepta-4-yl methacrylate)
Weight average molecular weight (Mw): 7,300, dispersion degree (Mw/Mn): 1.86

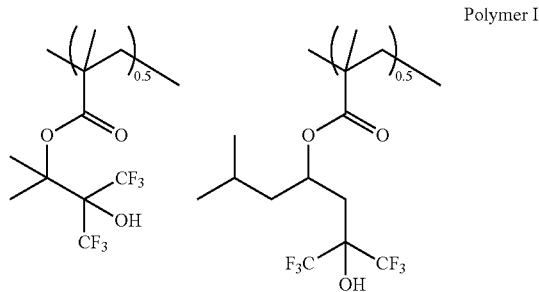

Polymer I (F-2): 3-methyl-3-(2,2,2-trifluoroethoxymethyl)oxetane-tetrahydrofuran-2,2-dimethyl-1,3-propanediol copolymer (available from Omnova Solutions Inc.) (the structural formula thereof is shown below)

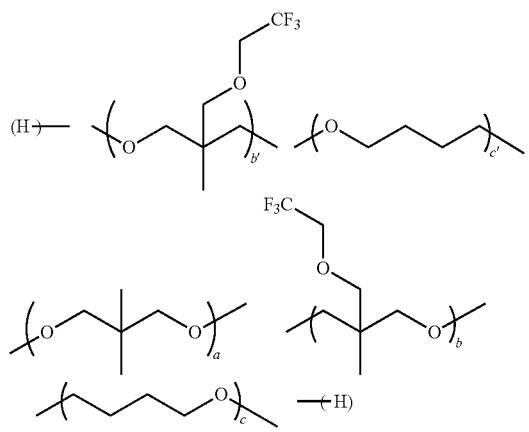

a: (b + b′):(c + c′) = 1:4 ~ 7:0.01 ~ 1 (molar ratio)
weight average molecular weight: 1,500

Evaluation of Resist Composition

Examples 2-1 to 2-17 and Comparative Examples 2-1 to 2-6

A anti-reflection coating solution (available from Nissan Chemical Industries, Ltd., ARC-29A) was applied to a silicon substrate, and baked at 200° C. for 60 seconds to prepare an anti-reflection coating substrate (film thickness: 100 nm). A resist solution (R-01 to R-20) was applied to the anti-reflection coating substrate by spin coating, and baked on a hot plate at 100° C. for 60 seconds to prepare a resist film having a thickness of 90 nm. Using an ArF excimer laser scanner (manufactured by Nikon Corporation, NSR-S610C, NA=1.30, dipole, 6% halftone phase shift mask), the resist film was subjected to immersion lithography. The resist film was then baked (FEB) at any temperature for 60 seconds, and developed for 60 seconds with a 2.38% by mass aqueous solution of tetramethylammonium hydroxide.

Evaluation Method

In the evaluation of resist, a 60 nm trench (space)/160 nm pitch pattern was observed as a subject with an electron microscope, and the optimum exposure dose (Eop, mJ/cm$^2$) was an exposure dose so that the trench width was 60 nm. Pattern profiles in the optimum exposure dose were compared, and classified as good or poor in accordance with the following criteria.

Good: the perpendicularity of pattern side wall is high. The profile is preferable.

Poor: The surface part of trench pattern tends to be blockaded or the trench width in a part near the substrate largely tends to be decreased (be taper). The profile is not preferable.

The roughness of a trench edge part in the optimum exposure dose was converted into numbers by determining variation of width (30-point measurement, 3σ value was calculated) and the numbers was compared (roughness, nm).

The focus dependency of trench size in the optimum exposure dose was examined, and a range of focus to be resolved was determined. The range was a depth of focus (DOE, m).

Evaluation Results

The evaluation results of the resist compositions of the present invention and the comparative resist compositions shown in Table 4 are shown in Table 5.

TABLE 5

| | Resist | Optimum exposure dose (mJ/cm$^2$) | DOF (nm) | Roughness (nm) | Profile |
|---|---|---|---|---|---|
| Example 2-1 | R-01 | 36 | 75 | 4.6 | Good |
| Example 2-2 | R-02 | 34 | 85 | 4.5 | Good |
| Example 2-3 | R-03 | 36 | 80 | 4.5 | Good |
| Example 2-4 | R-04 | 37 | 80 | 4.3 | Good |
| Example 2-5 | R-05 | 38 | 85 | 4.5 | Good |
| Example 2-6 | R-06 | 36 | 75 | 4.2 | Good |
| Example 2-7 | R-07 | 32 | 90 | 4.1 | Good |
| Example 2-8 | R-08 | 35 | 80 | 4.5 | Good |
| Example 2-9 | R-09 | 35 | 85 | 4.1 | Good |
| Example 2-10 | R-10 | 35 | 80 | 4.3 | Good |
| Example 2-11 | R-11 | 37 | 80 | 4.6 | Good |
| Example 2-12 | R-12 | 33 | 90 | 3.9 | Good |
| Example 2-13 | R-13 | 39 | 75 | 4.2 | Good |
| Example 2-14 | R-14 | 30 | 70 | 4.5 | Good |
| Comparative Example 2-1 | R-15 | 35 | 40 | 7.1 | Poor |
| Comparative Example 2-2 | R-16 | 36 | 35 | 7.4 | Poor |
| Comparative Example 2-3 | R-17 | 32 | 35 | 6.9 | Poor |
| Comparative Example 2-4 | R-18 | 34 | 40 | 7.0 | Poor |
| Comparative Example 2-5 | R-19 | 36 | 35 | 7.1 | Poor |
| Comparative Example 2-6 | R-20 | 35 | 40 | 6.9 | Poor |
| Example 2-15 | R-21 | 36 | 80 | 4.2 | Good |
| Example 2-16 | R-22 | 37 | 75 | 4.6 | Good |
| Example 2-17 | R-23 | 35 | 80 | 4.2 | Good |

The results shown in Table 5 confirm that the resist composition of the present invention has good performances of profile, roughness, and DOF of the trench pattern.

Evaluation of Resist Composition (2)

Examples 3-1 to 3-6 and Comparative Examples 3-1 and 3-2

A substrate for a trilayer process was prepared by forming a spin-on carbon film ODL-50 available from Shin-Etsu Chemical Co., Ltd. (carbon content: 80% by mass) having a thickness of 200 nm on a silicon wafer and forming a silicon-containing spin-on hard mask SHB-A940 (silicon content: 43% by mass) having a thickness of 35 nm on the film. The substrate was spin-coated with the resist composition shown in Table 4, and baked (PAB) on a hot plate at 100° C. for 60 seconds to prepare a resist film having a thickness of 90 nm.

The film was exposed by an ArF excimer laser immersion scanner (manufactured by Nikon Corporation, NSR-610C, NA: 1.30, σ: 0.98/0.74, dipole opening degree: 90°, s-polarized illumination) while the exposure dose was changed. After then, the film was baked (PEB) at any temperature for 60 seconds, developed for 30 minutes with butyl acetate as a developer, and then rinsed with diisoamyl ether.

Evaluation Method

In the evaluation of resist, a line pattern formed in a light transmitted part of a pattern having a design of 45 nm line/90 nm pitch (the actual dimension is four times larger due to ¼ reduction projection exposure) on a binary mask was observed with an electron microscope. The optimum exposure dose (Eop, mJ/cm$^2$) was an exposure dose so that the line width was 45 nm. The pattern cross-sectional shape in the optimum exposure dose was observed with an electron microscope, and classified as good or poor in accordance with the following criteria.

Good: the perpendicularity of pattern side wall is high. The profile is preferable.

Poor: The surface part tends to be blockaded (be in a T-top shape) or is in a reverse taper shape in which the pattern side wall is inclined (the nearer the surface part, the wider the line width). The profile is not preferable.

When the line size is decreased by decreasing the exposure dose, the minimum size to be resolved without collapse of line is determined. The size is collapse limit size (nm). A decreased value indicates high collapse resistance, and is preferable.

Evaluation Results

The evaluation results of resist compositions of the present invention and the comparative resist compositions shown in Table 4 are shown in Table 6.

TABLE 6

| Resist | | Optimum exposure dose (mJ/cm$^2$) | Collapse limit (nm) | Profile |
|---|---|---|---|---|
| Example 3-1 | R-01 | 36 | Good 31 | Good |
| Example 3-2 | R-07 | 32 | Good 29 | Good |
| Example 3-3 | R-08 | 37 | Good 32 | Good |
| Comparative Example 3-1 | R-15 | 36 | Poor 37 | Poor |
| Comparative Example 3-2 | R-17 | 32 | Poor 35 | Poor |
| Example 3-4 | R-21 | 36 | Good 29 | Good |
| Example 3-5 | R-22 | 36 | Good 33 | Good |
| Example 3-6 | R-23 | 34 | Good 31 | Good |

The results shown in Table 6 show that the resist composition of the present invention indicates good pattern profile and collapse resistance even in organic solvent-negative development.

The present invention is not restricted to the embodiments shown by above. The embodiments are merely examples so that any embodiments composed of substantially the same technical concept as disclosed in the claims of the present invention and expressing a similar effect are included in the technical scope of the present invention.

What is claimed is:

1. An acid generator generating a sulfonic acid represented by the following general formula (1) in response to high-energy beam or heat,

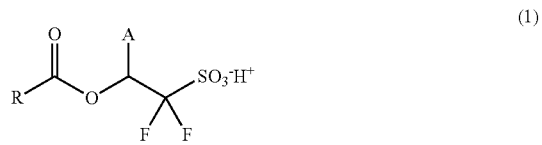

(1)

wherein R represents a group represented by the following general formula (1-1), and A represents a hydrogen atom or a trifluoromethyl group, $(R^1)(R^2)N-L-$ (1-1)

wherein each of $R^1$ and $R^2$ independently represents a hydrogen atom or a monovalent hydrocarbon group having 1 to 20 carbon atoms optionally substituted by a heteroatom, or $R^1$ and $R^2$ may be bonded to form a ring together with the nitrogen atom in the general formula (1-1), and L represents a divalent hydrocarbon group having 1 to 20 carbon atoms optionally substituted by a heteroatom, with the proviso that any one of $R^1$, $R^2$, and L contains a benzene ring.

2. The acid generator according to claim 1, wherein the acid generator generating a sulfonic acid represented by the general formula (1) is a sulfonium salt represented by the following general formula (2),

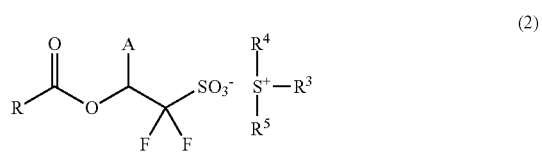

(2)

wherein R and A represent the same meanings as before; each of $R^3$, $R^4$, and $R^5$ independently represents a linear or a branched alkyl group, alkenyl group, or oxoalkyl group, substituted or unsubstituted, having 1 to 10 carbon atoms, or an aryl group, aralkyl group, or aryloxoalkyl group, substituted or unsubstituted, having 6 to 18 carbon atoms, or any two or more of $R^3$, $R^4$, and $R^5$ may be bonded to form a ring together with the sulfur atom in the formula.

3. The acid generator according to claim 2, wherein the sulfonium salt is one represented by the general formula (3),

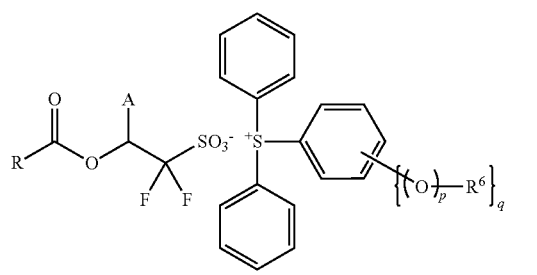

(3)

wherein R and A represent the same meanings as before; $R^6$ represents a linear, a branched, or a cyclic alkyl group or alkenyl group, substituted or unsubstituted, having 1 to 20 carbon atoms, or a substituted or an unsubstituted aryl group having 6 to 14 carbon atoms; p represents 0 or 1; and q represents an integer of 1 to 5.

4. A chemically amplified resist composition comprising the acid generator according to claim 3, a photoacid generator generating a sulfonic acid represented by any one of the following general formulae (4) to (6), a base resin, and an organic solvent,

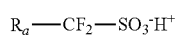
(4)

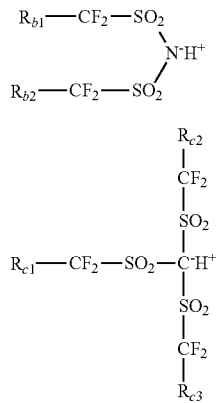
(5)

(6)

wherein each of $R_a$, $R_{b1}$, $R_{b2}$, $R_{c1}$, $R_{c2}$, and $R_{c3}$ independently represents a fluorine atom or a monovalent hydrocarbon group having 1 to 20 carbon atoms optionally containing a heteroatom, or a pair of $R_{b1}$ and $R_{b2}$, and $R_{c1}$ and $R_{c2}$ may be bonded with each other to form a ring.

5. The chemically amplified resist composition according to claim 4, wherein the base resin is a polymer containing a repeating unit having an acid labile group represented by the following general formula (7) and a repeating unit represented by the following general formula (8),

(7)

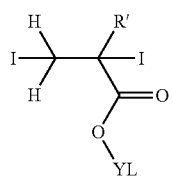
(8)

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms optionally containing any of a hydroxyl group, an ether bond, an ester bond, and a lactone ring, a phenylene group, or a naphthylene group; XA represents an acid labile group; YL represents a hydrogen atom or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

6. A chemically amplified resist composition comprising the acid generator according to claim 2, a photoacid generator generating a sulfonic acid represented by any one of the following general formulae (4) to (6), a base resin, and an organic solvent,

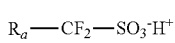
(4)

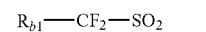
(5)

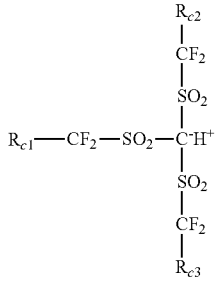
(6)

wherein each of $R_a$, $R_{b1}$, $R_{b2}$, $R_{c1}$, $R_{c2}$ and $R_{c3}$ independently represents a fluorine atom or a monovalent hydrocarbon group having 1 to 20 carbon atoms optionally containing a heteroatom, or a pair of $R_{b1}$ and $R_{b2}$, and $R_{c1}$ and $R_{c2}$ may be bonded with each other to form a ring.

7. The chemically amplified resist composition according to claim 6, wherein the base resin is a polymer containing a repeating unit having an acid labile group represented by the following general formula (7) and a repeating unit represented by the following general formula (8),

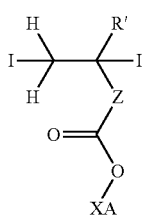
(7)

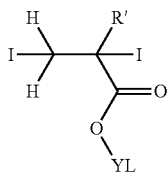
(8)

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms optionally containing any of a hydroxyl group, an ether bond, an ester bond, and a lactone ring, a phenylene group, or a naphthylene group; XA represents an acid labile group; YL represents a hydrogen atom or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

8. A chemically amplified resist composition comprising the acid generator according to claim 1, a photoacid generator generating a sulfonic acid represented by any one of the following general formulae (4) to (6), a base resin, and an organic solvent,

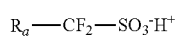
(4)

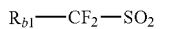
(5)

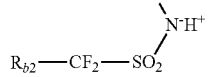

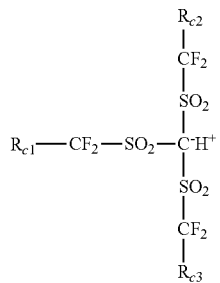
(6)

wherein each of $R_a$, $R_{b1}$, $R_{b2}$, $R_{c1}$, $R_{c2}$, and $R_{c3}$ independently represents a fluorine atom or a monovalent hydrocarbon group having 1 to 20 carbon atoms optionally containing a heteroatom, or a pair of $R_{b1}$ and $R_{b2}$, and $R_{c1}$ and $R_{c2}$ may be bonded with each other to form a ring.

9. The chemically amplified resist composition according to claim 8, wherein the base resin is a polymer containing a repeating unit having an acid labile group represented by the following general formula (7) and a repeating unit represented by the following general formula (8),

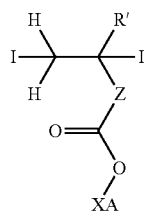
(7)

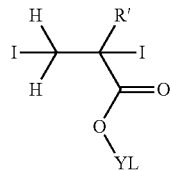
(8)

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms optionally containing any of a hydroxyl group, an ether bond, an ester bond, and a lactone ring, a phenylene group, or a naphthylene group; XA represents an acid labile group; YL represents a hydrogen atom or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

10. A patterning process comprising a step of applying the chemically amplified resist composition according to claim 9 to a substrate; a step of conducting heat-treatment; a step of exposing the substrate to any of a KrF excimer laser, an ArF excimer laser, EUV lithography, and an electron beam through a photomask; a step of conducting heat-treatment; and a step of developing it with a developer.

11. The patterning process according to claim 10, wherein in the exposure step, a liquid having a refractive index of 1.0 or more is placed between a resist film and a projection lens to carry out immersion lithography.

12. The patterning process according to claim 11, wherein a top coat is formed on the resist film, and the liquid is placed between the top coat and the projection lens to perform immersion lithography.

13. A patterning process comprising a step of applying the chemically amplified resist composition according to claim 8 to a substrate; a step of conducting heat-treatment; a step of exposing the substrate to any of a KrF excimer laser, an ArF excimer laser, EUV lithography, and an electron beam through a photomask; a step of conducting heat-treatment; and a step of developing it with a developer.

14. The patterning process according to claim 13, wherein in the exposure step, a liquid having a refractive index of 1.0 or more is placed between a resist film and a projection lens to carry out immersion lithography.

15. The patterning process according to claim 14, wherein a top coat is formed on the resist film, and the liquid is placed between the top coat and the projection lens to perform immersion lithography.

* * * * *